US 6,571,657 B1

(12) United States Patent
Olgado et al.

(10) Patent No.: US 6,571,657 B1
(45) Date of Patent: Jun. 3, 2003

(54) MULTIPLE BLADE ROBOT ADJUSTMENT APPARATUS AND ASSOCIATED METHOD

(75) Inventors: Donald J. Olgado, Palo Alto, CA (US); Avi Tepman, Cupertino, CA (US); Timothy J. Franklin, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 118 days.

(21) Appl. No.: 09/664,607

(22) Filed: Sep. 18, 2000

Related U.S. Application Data

(63) Continuation-in-part of application No. 09/350,210, filed on Jul. 9, 1999, and a continuation-in-part of application No. 09/289,074, filed on Apr. 8, 1999.

(51) Int. Cl.[7] .............................................. B25J 17/00
(52) U.S. Cl. ........................ 74/490.02; 901/15; 901/21
(58) Field of Search ....................... 74/490.01, 490.03, 74/490.04, 490.05; 414/744.5, 917, 937, 938, 935; 901/21, 15

(56) References Cited

U.S. PATENT DOCUMENTS

| | | | | |
|---|---|---|---|---|
| 2,742,413 | A | 4/1956 | Cransberg et al. ............. | 204/52 |
| 2,882,209 | A | 4/1959 | Brown et al. .................. | 204/52 |
| 3,649,509 | A | 3/1972 | Morawetz et al. ........... | 204/238 |

(List continued on next page.)

FOREIGN PATENT DOCUMENTS

| | | | | |
|---|---|---|---|---|
| DE | 932 709 | 3/1955 | | |
| DE | 3627560 A1 | 2/1988 | ............. | B25J/13/08 |
| JP | 58182823 | 10/1983 | ......... | H01L/21/288 |
| JP | 63118093 | 5/1988 | ............. | C25D/5/18 |
| JP | 04131395 | 5/1992 | ............. | C25D/5/34 |
| JP | 04280993 | 10/1992 | ............. | C25D/5/18 |
| JP | 06017291 | 1/1994 | ............. | C25D/7/12 |
| SU | 443 108 | 12/1974 | ............. | C23B/5/20 |
| WO | 97/12079 | 4/1997 | ............. | C25D/5/02 |
| WO | WO 99/16111 | 4/1999 | ............. | H01L/21/00 |
| WO | 99/25902 | 5/1999 | ............. | C25B/13/00 |
| WO | 99/25903 | 5/1999 | ............. | C25D/5/00 |
| WO | 99/25904 | 5/1999 | ............. | C25D/5/02 |
| WO | 99/25905 | 5/1999 | ............. | C25D/5/02 |
| WO | 99/26275 | 5/1999 | | |

OTHER PUBLICATIONS

PCT International Search Report dated Oct. 17, 2002.
Australian Patent Office Written Opinion from SG 9906158–2, Dated Mar. 5, 2002.
"Wafer Back Surface Film Removal", Colombo, L., Central R&D, SGS–Thomson Microelectronics, Agrate, Italy, 6 pages.
"Metallization & Interconnect", Semitool Products/Sales, Oct. 27, 1998, 4 pages.
U.S. patent application Ser. No. 09/676,362, Olgado et al., filed Sep. 29, 2000.
U.S. patent application Ser. No. 09/678,947, Dordi et al., filed Oct. 3, 2000.
U.S. patent application Ser. No. 09/687,053, Hey et al., filed Oct. 12, 2000.

(List continued on next page.)

Primary Examiner—David Fenstermacher
(74) Attorney, Agent, or Firm—Moser, Patterson & Sheridan

(57) ABSTRACT

The present invention provides an apparatus and associated method in which the apparatus comprises a multiple blade robot and a compensating device. The multiple blade robot includes at least one set of robot blades. The compensating device adjusts for differences in spacing between the set of robot blades and spacing between two or more cells. In different embodiments, the compensating device may be coupled to one or more of the process cells, one or more of the substrate holder systems, or one or more of the robot blades.

38 Claims, 30 Drawing Sheets

U.S. PATENT DOCUMENTS

| | | | | |
|---|---|---|---|---|
| 3,727,620 A | | 4/1973 | Orr | 134/95 |
| 3,770,598 A | | 11/1973 | Creutz | 204/52 R |
| 4,027,686 A | | 6/1977 | Shortes et al. | 134/95 |
| 4,092,176 A | | 5/1978 | Kozai et al. | 134/186 |
| 4,110,176 A | | 8/1978 | Creutz | 204/52 R |
| 4,113,492 A | | 9/1978 | Sato et al. | 96/67 |
| 4,315,059 A | | 2/1982 | Raistrick et al. | 429/112 |
| 4,326,940 A | | 4/1982 | Eckles et al. | 204/232 |
| 4,336,114 A | | 6/1982 | Mayer et al. | 204/52 R |
| 4,376,685 A | | 3/1983 | Watson | 204/52 R |
| 4,405,416 A | | 9/1983 | Raistrick et al. | 204/68 |
| 4,428,815 A | | 1/1984 | Powell et al. | 204/297 |
| 4,435,266 A | | 3/1984 | Johnston | 204/276 |
| 4,489,740 A | | 12/1984 | Rattan et al. | 134/140 |
| 4,510,176 A | | 4/1985 | Cuthbert et al. | 427/82 |
| 4,518,678 A | | 5/1985 | Allen | 430/311 |
| 4,519,846 A | | 5/1985 | Aigo | 134/15 |
| 4,559,717 A | * | 12/1985 | Scire et al. | 33/1 M |
| 4,653,975 A | * | 3/1987 | Akeel | 248/289.31 |
| 4,693,805 A | | 9/1987 | Quazi | 204/192.22 |
| 4,732,785 A | | 3/1988 | Brewer | 427/240 |
| 4,753,128 A | * | 6/1988 | Bartlett et al. | 16/401 |
| 4,789,445 A | | 12/1988 | Goffman et al. | 204/114 |
| 4,813,846 A | * | 3/1989 | Helms | 414/744.1 |
| 5,039,381 A | | 8/1991 | Mullarkey | 204/47.5 |
| 5,055,425 A | | 10/1991 | Leibovitz et al. | 437/195 |
| 5,092,975 A | | 3/1992 | Yamamura et al. | 204/198 |
| 5,100,502 A | | 3/1992 | Murdoch et al. | 156/643 |
| 5,155,336 A | | 10/1992 | Gronet et al. | 219/411 |
| 5,162,260 A | | 11/1992 | Leibovitz et al. | 437/195 |
| 5,220,849 A | * | 6/1993 | Lande et al. | 74/479.01 |
| 5,222,310 A | | 6/1993 | Thompson et al. | 34/202 |
| 5,224,504 A | | 7/1993 | Thompson et al. | 134/155 |
| 5,230,743 A | | 7/1993 | Thompson et al. | 134/32 |
| 5,252,807 A | | 10/1993 | Chizinsky | 219/390 |
| 5,256,274 A | | 10/1993 | Poris | 205/123 |
| 5,259,407 A | | 11/1993 | Tuchida et al. | 134/151 |
| 5,290,361 A | | 3/1994 | Hayashida et al. | 134/2 |
| 5,316,974 A | | 5/1994 | Crank | 437/190 |
| 5,328,589 A | | 7/1994 | Martin | 205/296 |
| 5,349,978 A | | 9/1994 | Sago et al. | 134/153 |
| 5,368,711 A | | 11/1994 | Poris | 204/193 |
| 5,377,708 A | | 1/1995 | Bergman et al. | 134/105 |
| 5,382,885 A | | 1/1995 | Salcudean et al. | 318/568.11 |
| 5,415,890 A | | 5/1995 | Kloiber et al. | 427/242 |
| 5,429,733 A | | 7/1995 | Ishida | 204/224 R |
| 5,447,615 A | | 9/1995 | Ishida | 204/224 R |
| 5,454,930 A | | 10/1995 | Miura et al. | 205/159 |
| 5,516,412 A | | 5/1996 | Andrlcacos et al. | 204/224 R |
| 5,528,118 A | | 6/1996 | Lee | 318/568.17 |
| 5,608,943 A | | 3/1997 | Konishi et al. | 15/302 |
| 5,625,170 A | | 4/1997 | Poris | 177/50 |
| 5,651,865 A | | 7/1997 | Sellers | 204/192.13 |
| 5,705,223 A | | 1/1998 | Bunkofske | 427/240 |
| 5,718,813 A | | 2/1998 | Drummond et al. | 204/192.12 |
| 5,723,028 A | | 3/1998 | Poris | 204/231 |
| 5,730,890 A | | 3/1998 | Bickford et al. | 216/87 |
| 5,746,565 A | * | 5/1998 | Tepolt | 414/744.5 |
| 5,811,951 A | | 9/1998 | Young | 318/568.2 |
| 5,838,121 A | | 11/1998 | Fairbairn et al. | 318/45 |
| 5,975,834 A | | 11/1999 | Ogawa et al. | 414/744.5 |
| 6,024,856 A | | 2/2000 | Haydu et al. | 205/84 |
| 6,069,420 A | * | 5/2000 | Mizzi et al. | 310/15 |
| 6,071,388 A | | 6/2000 | Uzoh | 204/297 R |
| 6,093,291 A | | 7/2000 | Izumi et al. | 204/224 R |
| 6,113,771 A | | 9/2000 | Landau et al. | 205/123 |
| 2002/0020069 A1 | * | 2/2002 | Bottinelli et al. | 33/1 M |

OTHER PUBLICATIONS

U.S. patent application Ser. No. 09/684,500, Olgado filed Oct. 6, 2000.

U.S. patent application Ser. No. 09/731,326, Dordi et al., filed Dec. 5, 2000.

U.S. patent application Ser. No. 09/766,060, Hey et al., filed Jan. 18, 2001.

U.S. patent application Ser. No. 09/295,678, Landau, filed Apr. 21, 1999.

U.S. patent application Ser. No. 09/263,649, Shen et al., filed Mar. 5, 1999.

U.S. patent application Ser. No. 09/289,074, Dordi et al., filed Apr. 8, 1999.

U.S. patent application Ser. No. 09/350,210, Dordi et al., filed Jul. 9, 1999.

U.S. patent application Ser. No. 09/484,616, Landau et al., filed Jan. 18, 2000.

U.S. patent application Ser. No. 09/658,336, Hey et al., filed Sep. 8, 2000.

U.S. patent application Ser. No. 09/663,814, Olgado, filed Sep. 15, 2000.

U.S. patent application Ser. No. 09/664,607, Olgado, filed Sep. 18, 2000.

"NEY Contact Manual", Pitney, K., Electrical Contacts for Low Energy Uses, Oct. 8, 1974, 19 pages.

"Electric Contacts Theory and Application", Holm, R., Springer–Verlag New York Inc., 1967, 27 pages.

"Tantalum, Copper and Damascene; The Future of Interconnects", Singer, P., Semiconductor International, Jun. 1998, 6 pages.

"Wafer Processing", Singer, P., Semiconductor International, Jun. 1998, p. 70.

Laurell Technologies Corporation, Oct. 27, 1998, 6 pages.

"Verteq" Verteq Online, 5 pages.

* cited by examiner

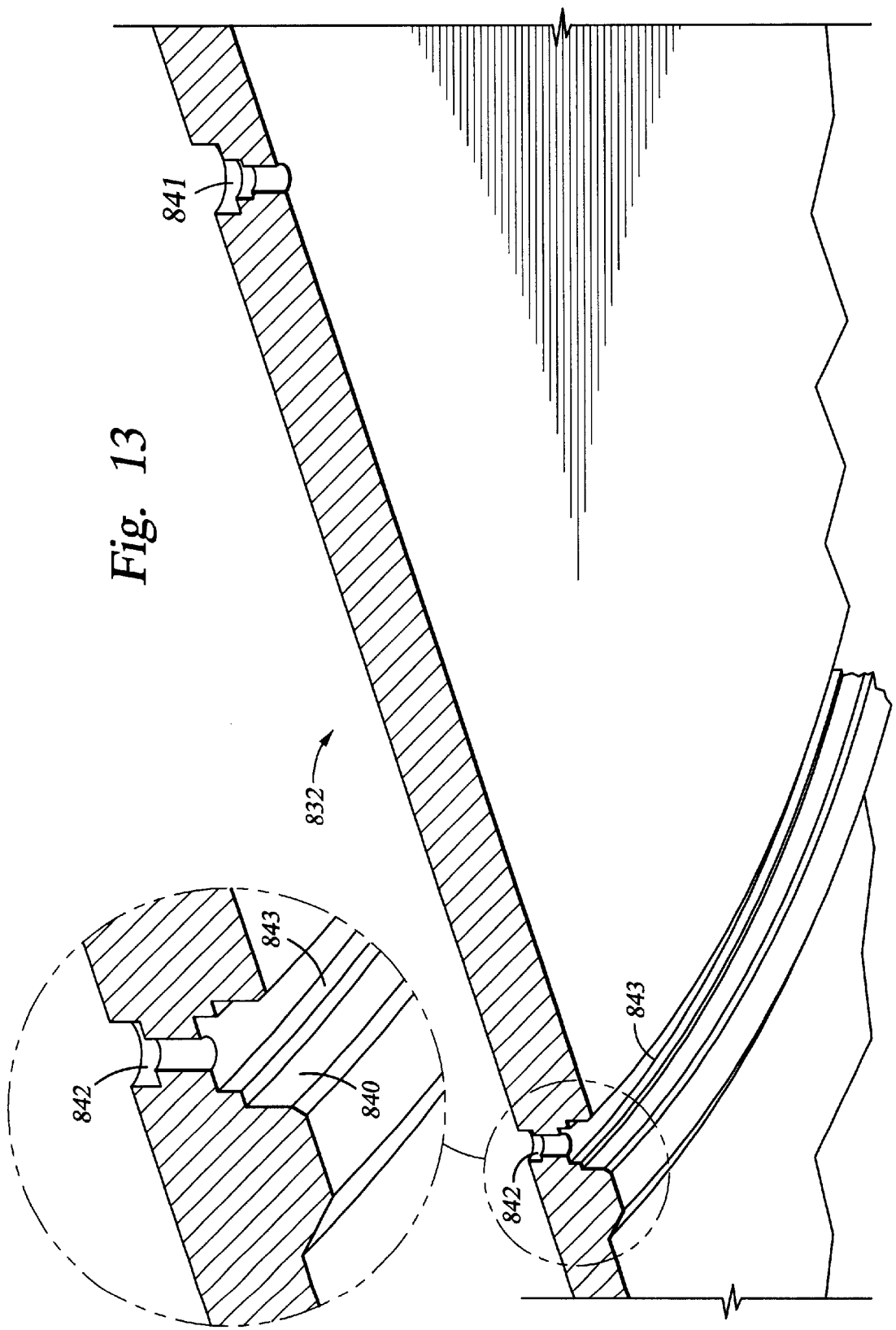

US 6,571,657 B1

MULTIPLE BLADE ROBOT ADJUSTMENT APPARATUS AND ASSOCIATED METHOD

CONTINUATION INFORMATION

This is a continuation-in-part of prior filed U.S. patent application Ser. No. 09/289,074, filed Apr. 8, 1999, and entitled "ELECTRO-CHEMICAL DEPOSITION SYSTEM", (Incorporated herein by reference).

This is a continuation-in-part of prior filed U.S. patent application Ser. No. 09/350,210, filed Jul. 9, 1999, and entitled "ELECTRO-CHEMICAL DEPOSITION SYSTEM", (Incorporated herein by reference).

BACKGROUND OF THE INVENTION

1. Field of the Invention

The present invention generally relates to robots. More particularly, the present invention relates to compensating for differences in the spacing between a plurality of robot blades and the spacing between the different objects with which the different robot blades interact.

2. Background of the Related Art

Robots are used to transfer substrates, e.g. wafers, LED displays, etc. between different process cells, transfer cells, spin-rinse-dry (SRD) cells, integrated bevel clean (IBC) cells, metrology cells that measure and/or inspect substrates, and other known cells adapted to perform semiconductor processes. In semiconductor processes, multiple process cells frequently are combined to form a single cluster tool. Robots are typically used to transfer substrates between the different process cells in a cluster tool. Examples of processes that are performed in certain cells in cluster tools include chemical vapor deposition (CVD), physical vapor deposition (PVD), and electro-chemical plating (ECP).

Robots typically load substrates into, and unload substrates from, process cells using substrate holder systems. The substrate holder systems transfer the substrates between the loading or unloading position and the processing position. Multiple substrates are often transferred simultaneously between different process cells, in which each cell contains one of the multiple substrates, to increase processing throughput. Multiple substrates may even undergo identical processing in different process cells simultaneously. Multiple blade robots are therefore configured to provide for simultaneous transfer of pairs of substrates between pairs of process cells. A first robot blade positions a substrate in, or removes a substrate from, a first process cell, concurrently as a second robot blade or multiple blades, positions a second substrate in, or removes a substrate from, a second process cell. An example of such multiple blade robots is provided in U.S. Pat. No. 5,838,121 that issued Nov. 17, 1998 to Fairbaim et al., and entitled "DUAL BLADE ROBOT" (Incorporated herein by reference).

Not all pairs of process cells in a cluster tool are spaced the same distance apart. During mounting of different groups of process cells in one cluster tool, the spacing between adjacent cells may vary by a fraction of an inch. A robot with multiple robot blades that is spaced to insert/remove substrates from an ECP cell therefore may not have the correct spacing to insert/remove substrates from a CVD cell, for example.

It is difficult to match the distance between the pairs of robot blades, that carry the substrates, to the distance between the pairs of cells or substrate holder assemblies. This lack of matching causes difficulty in loading the substrates into, or unloading the substrates out of, the cells. An inconsistency in spacing of a quarter of an inch between pairs of process cells is common. Such inconsistencies can be caused by unequal spacing between different pairs of cells in a cluster tool, the normal dimensional tolerances on the robots and processing equipment, and/or thermal expansion differences of the mounting between pairs of cells considering that some of the cells operate at different temperatures.

Therefore, there remains a need for a cluster tool configuration involving multiple blade robots that can transfer pairs of substrates between multiple process cell pairs, and that can also provide a fine alignment to compensate for inconsistent spacing between these process cells.

SUMMARY OF THE INVENTION

The present invention generally provides a robot system apparatus and an associated method. The robot system comprises a multiple blade robot and a compensating device. The multiple blade robot includes at least one set of robot blades. The compensating device adjusts for differences in spacing between the set of robot blades and spacing between two or more cells. In different embodiments, the compensating device may be coupled to one or more of the process cells, one or more of the substrate holder assemblies, or one or more of the robot blades.

BRIEF DESCRIPTION OF THE DRAWINGS

So that the manner in which the above recited features, advantages and objects of the present invention can be understood in detail, a more particular description of the invention, briefly summarized above, may be had by reference to the embodiments thereof which are illustrated in the appended drawings.

FIG. 13 is a partial cross sectional view of a substrate holder plate;

The terms "below", "above", "bottom", "top", "up", "down", "upper", and "lower" and other positional terms used herein are taken relative to as shown in the figures.

DETAILED DESCRIPTION OF THE PREFERRED EMBODIMENT

An embodiment of multiple blade robot is described that interacts with multiple pairs of process cells in a cluster tool. The cluster tool performs multiple functions, including electrochemical metal deposition process such as electroplating. The embodiment may be applied to any combination of processes involving cluster tools having multiple pairs of cells serviced by a multiple blade robot. Robot blade spacing is the distance between pairs of robot blades of a multiple blade robot. Cell spacing is the distance between a corresponding location on pairs of cells such as process cells, metrology cells, loading cells, etc. In different embodiments either the cell spacing or the robot blade spacing is adjusted to compensate for inconsistencies between the cell spacing and the robot blade spacing. In this disclosure, the structure of a cluster tool including a variety of cells, as well as the operation of such a cluster tool, is described. The embodiment of cluster tool described herein generally performs electroplating, though the robot can be applied to any embodiment of cluster tool. The structure and operation of the multiple blade robot and the interaction between the multiple blade robot and the cells of the cluster tool, is also described.

1. Cluster Tool Configuration and Operation

Figure 1:
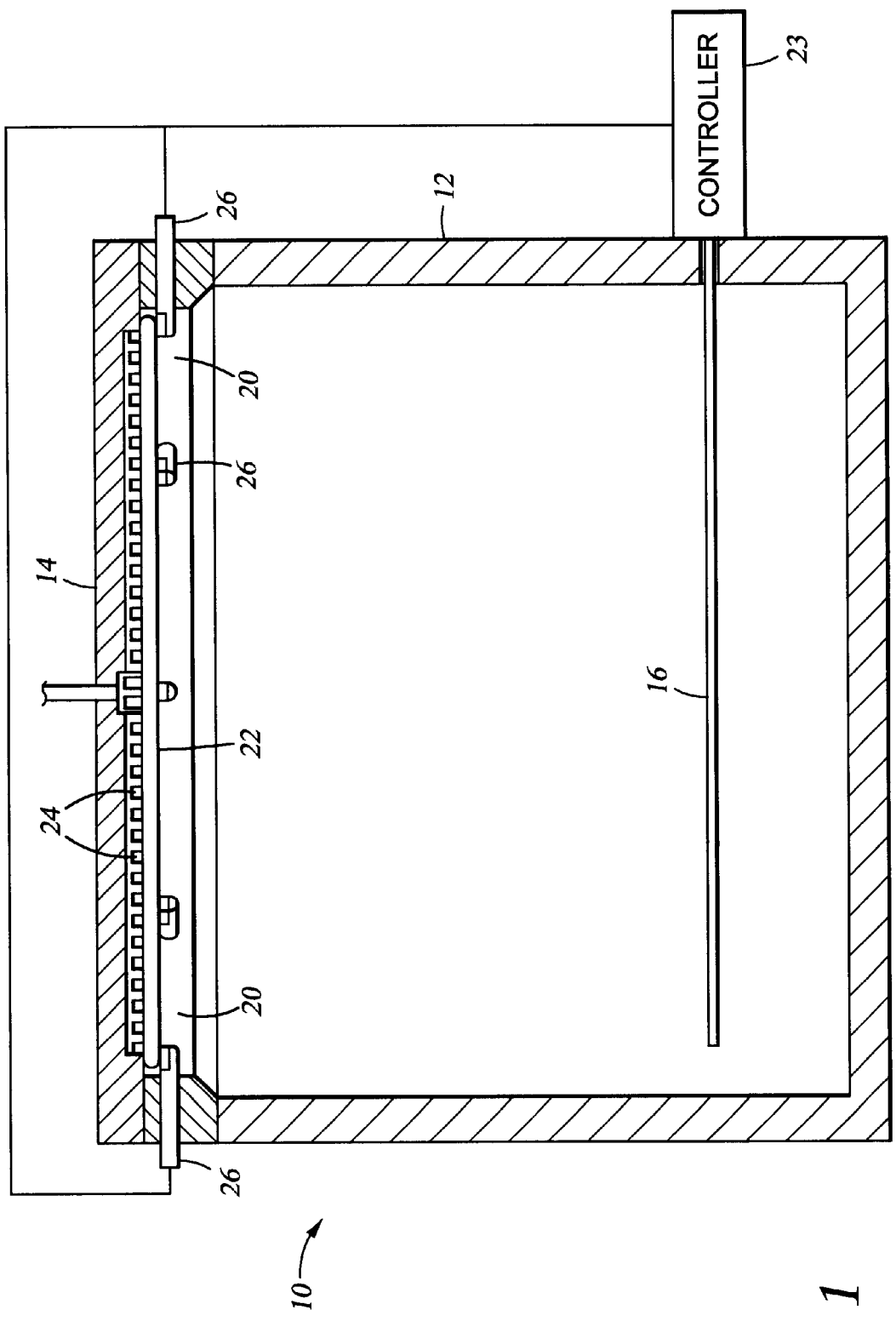
FIG. 1 is a cross sectional view of a simplified typical fountain plater.

FIG. 1 is a simplified cross sectional view of a typical fountain plater 10 that is often used in cluster tools. The fountain plater 10 includes an electrolyte container 12, a substrate holder system 14, an anode 16, and a contact ring 20. The electrolyte container has a top opening. The substrate holder system 14 is disposed above the electrolyte container 12. The anode 16 is disposed in the electrolyte container 12. The contact ring 20 contacts and supports a substrate 22. The contact ring 20 comprises a plurality of metallic or semi-metallic contact pins 26 distributed about the peripheral portion of the substrate 22 to define a central substrate plating surface. Each one of the plurality of contact pins 26 is partially mounted in the contact ring 20. Each one of the plurality of contact pins extends radially inwardly over a narrow perimeter portion of the substrate 22 and contact a conductive seed layer of the substrate 22 at the tip of the contact pin 26. A controller controls the electrical bias supplied to the contact pins 26.

Figure 2:
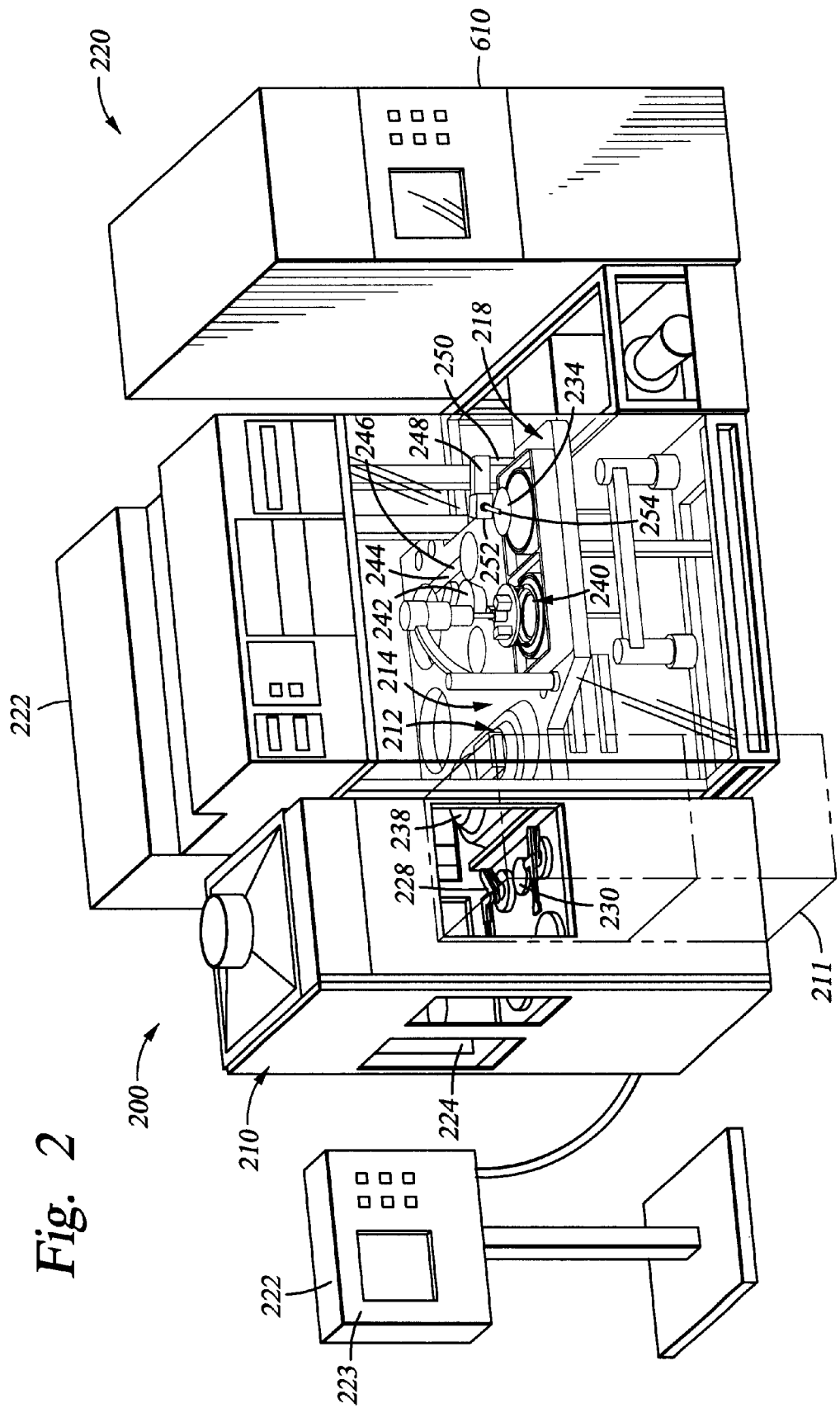
FIG. 2 is a perspective view of one embodiment of electroplating system platform.
Figure 3:
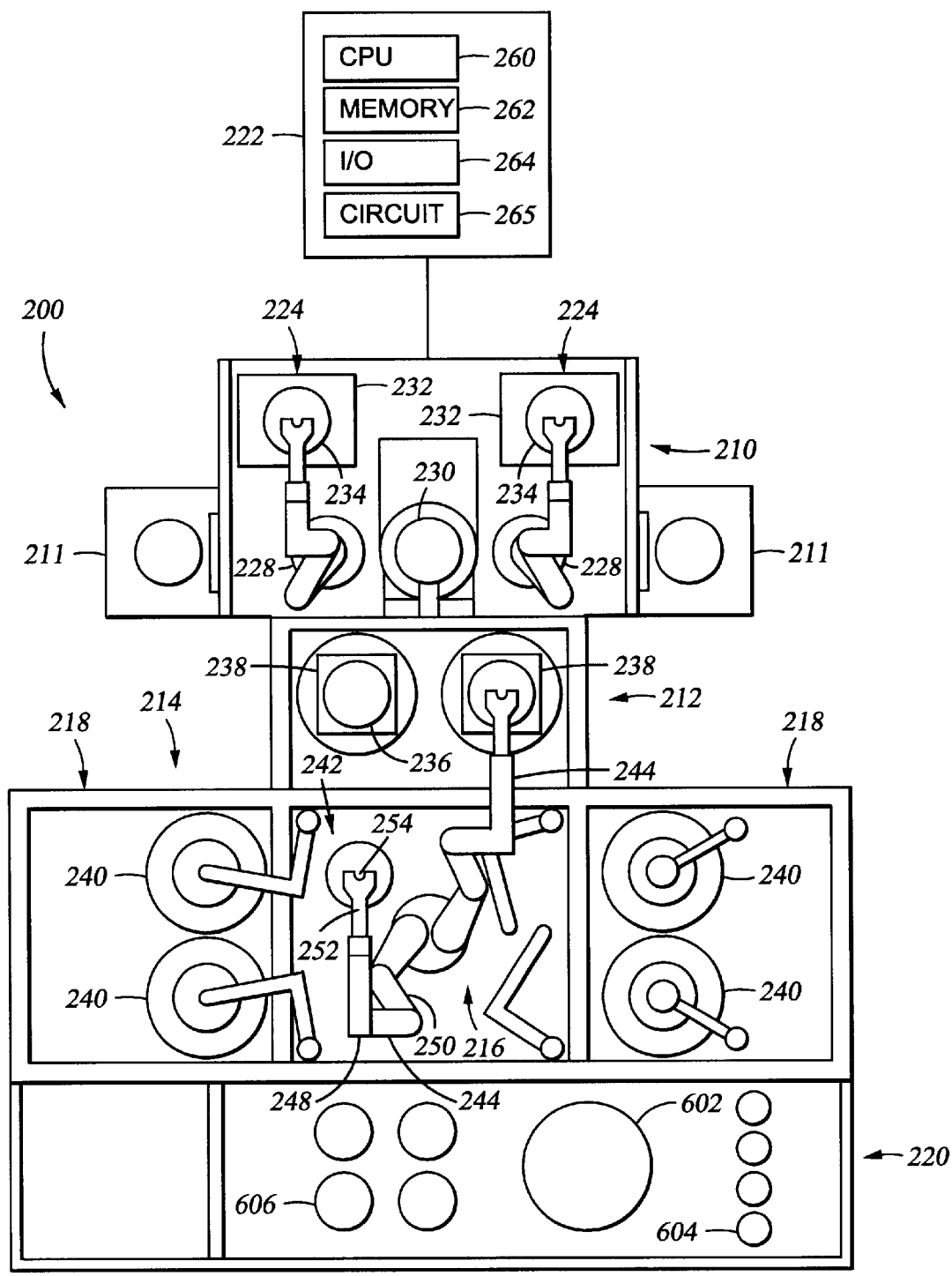
FIG. 3 is a schematic view of the electroplating system platform of FIG. 2.

FIG. 2 is a perspective view of one embodiment of an electroplating system platform 200. FIG. 3 is a schematic view of the electroplating system platform 200 shown in FIG. 2. Referring to both FIGS. 2 and 3, the electroplating system platform 200 generally comprises a loading station 210, a rapid thermal anneal (RTA) cell 211, a spin-rinse-dry (SRD) station 212, a mainframe 214, and an electrolyte replenishing system 220. Preferably, the electroplating system platform 200 is enclosed in a clean environment using panels such as PLEXIGLAS® (a registered trademark of the Rohm and Haas Company of West Philadelphia, Pa.). The mainframe 214 generally comprises a mainframe transfer station 216 and a plurality of processing stations 218. Each processing station 218 includes one or more processing cells 240. An electrolyte replenishing system 220 is positioned adjacent the electroplating system platform 200 and connects to the electroplating process cells 240 individually to circulate electrolyte solution used for the electroplating process. The electroplating system platform 200 also includes a controller 222, typically comprising a programmable microprocessor.

The loading station 210 preferably includes one or more substrate cassette receiving areas 224, one or more loading station transfer robots 228 and at least one substrate orientors 230. The number of substrate cassette receiving areas 224, loading station transfer robots 228, and substrate orientors 230 included in the loading station 210 can be configured according to the desired throughput of the system. As shown in the embodiment in FIGS. 2 and 3, the loading station 210 includes two substrate cassette receiving areas 224, two loading station transfer robots 228 and one substrate orientor 230. A substrate cassette 232 containing substrates 234 is loaded into the substrate cassette receiving area 224 to introduce substrates 234 into the electroplating system platform 200. The loading station transfer robot 228 transfers substrates 234 between the substrate cassette 232 and the substrate orientor 230. The loading station transfer robot 228 typically comprises a transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the thermal anneal cell 211.

Figure 4:
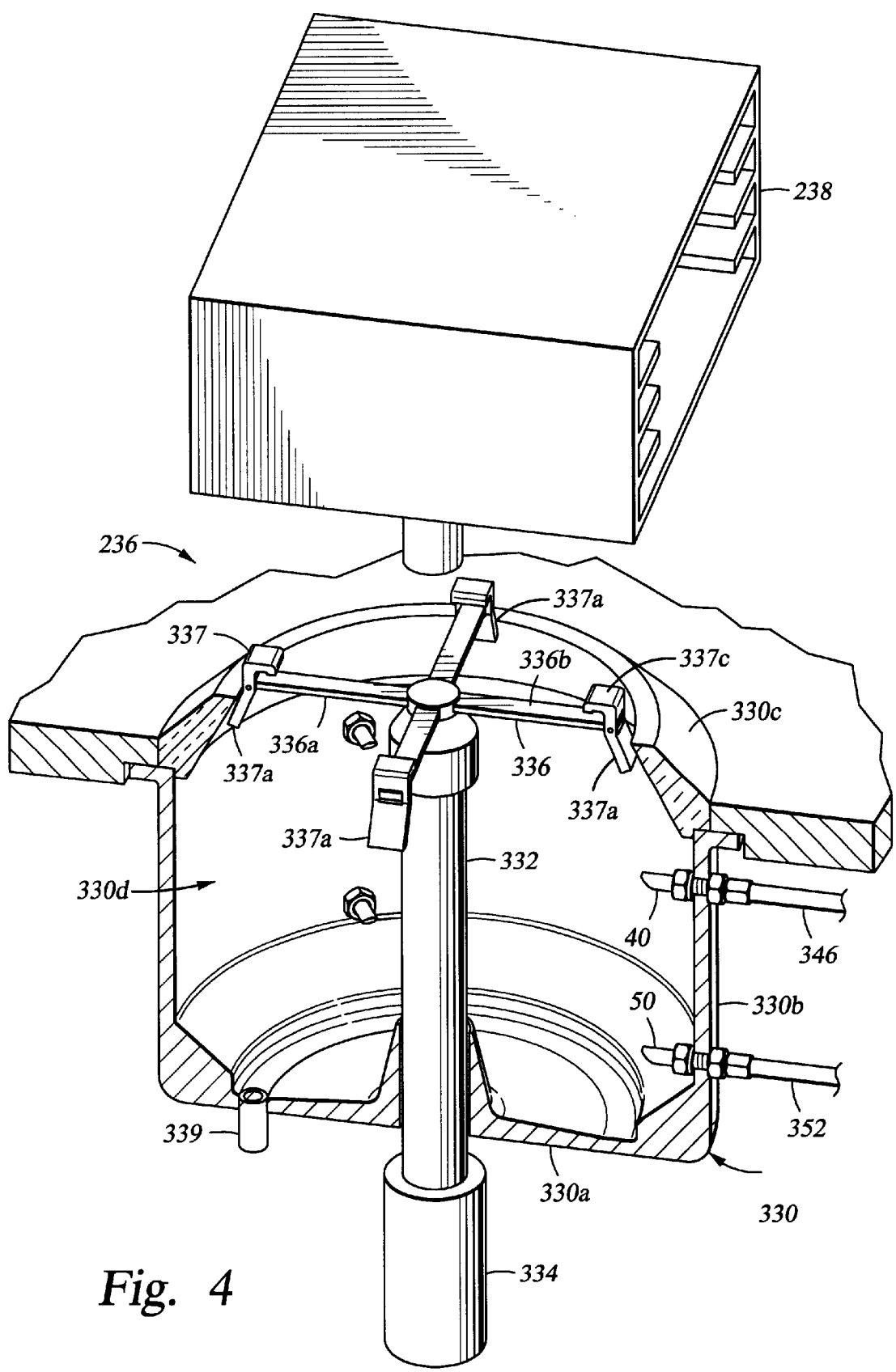
FIG. 4 is a schematic perspective view of one embodiment of spin-rinse-dry (SRD) module shown in FIG. 2.
Figure 5:
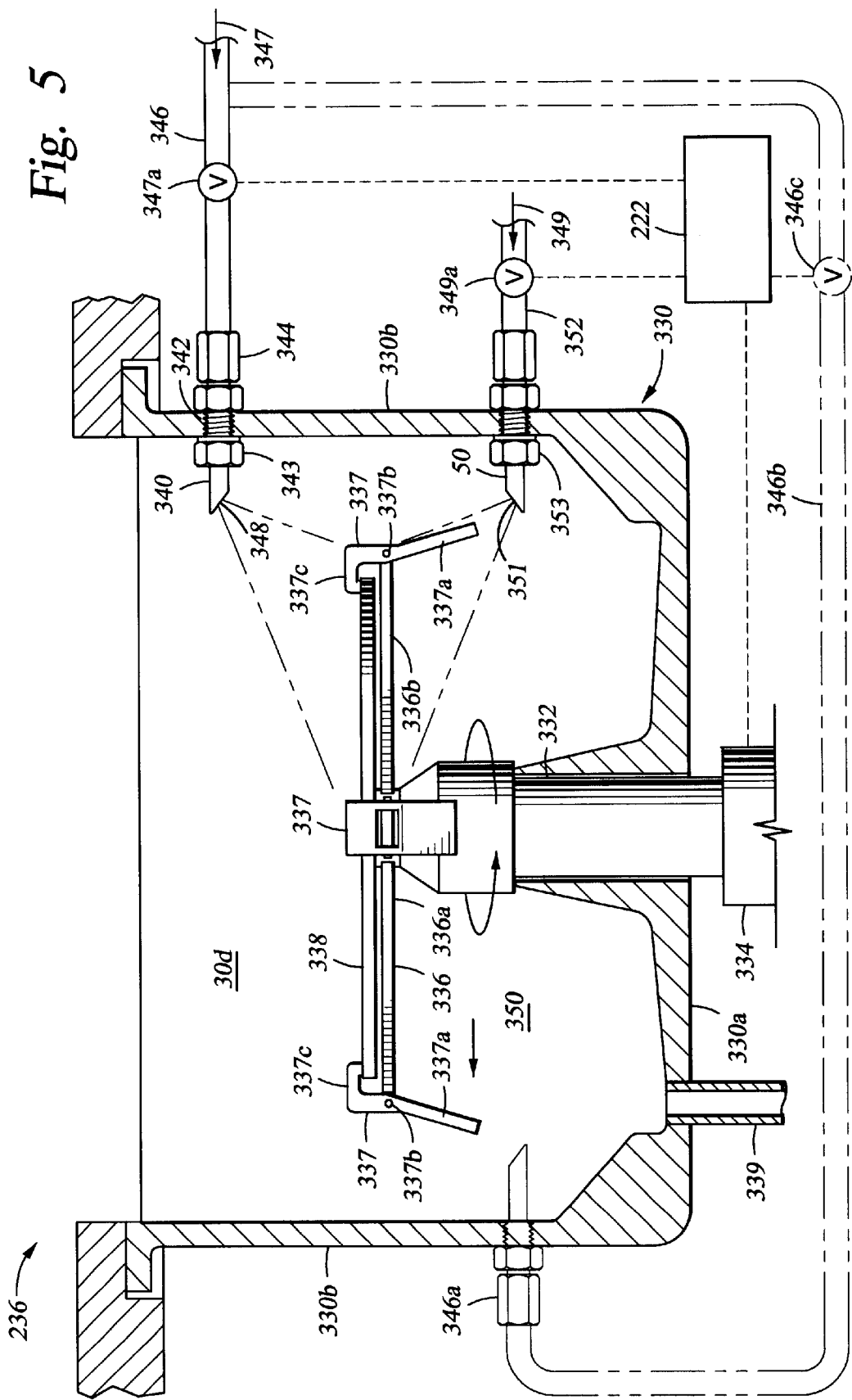
FIG. 5 is a side cross sectional view of the spin-rinse-dry (SRD) module of FIG. 4.

FIG. 4 is a schematic perspective view of one embodiment of a spin-rinse-dry (SRD) module, incorporating rinsing and dissolving fluid inlets. FIG. 5 is a side cross sectional view of the spin-rinse-dry (SRD) module of FIG. 4 and shows a substrate in a processing position vertically disposed between fluid inlets. Preferably, the SRD station 212 includes one or more SRD modules 236 and one or more substrate pass-through cassettes 238. Preferably, the SRD station 212 includes two SRD modules 236 that equals the number of loading station transfer robots 228, and a substrate pass-through cassette 238 is positioned above each SRD module 236. The substrate pass-through cassette 238 facilitates substrate transfer between the loading station 210 and the mainframe 214. The substrate pass-through cassette 238 provides access to and from both the loading station transfer robot 228 and a robot in the mainframe transfer station 216.

Referring to FIGS. 4 and 5, the SRD module 236 comprises a bottom 330a and a sidewall 330b, and an upper shield 330c that collectively define a SRD module bowl 330d. The shield 330c attaches to the sidewall and assists in retaining the fluids within the SRD module 236. Alternatively, a removable cover could also extend across an opening in the SRD module bowl 330d during processing. A pedestal 336, located in the SRD module 236, includes a pedestal support 332 and a pedestal actuator 334. The pedestal 336 supports the substrate 338 shown in FIG. 5 on the pedestal upper surface during processing. The pedestal actuator 334 rotates the pedestal to spin the substrate and raises and lowers the pedestal as described below. The substrate may be held in place on the pedestal by a plurality of clamps 337. The clamps 337 pivot with centrifugal force and engage the substrate preferably in the edge exclusion zone of the substrate. In a preferred embodiment, the clamps engage the substrate only when the substrate lifts off the pedestal during the processing. Vacuum passages, not shown, may also be used to hold the substrate to the pedestal. Any known type of holding elements may also be used. The pedestal has a plurality of pedestal arms 336a and 336b, so that the fluid through the second nozzle may impact as much surface area on the lower surface of the substrate as is practical. An outlet 339 allows fluid to be removed from the SRD module 236.

A first conduit 346, through which a first fluid 347 flows, is connected to a valve 347a. The conduit may be hose, pipe, tube, or other fluid containing conduits. The valve 347a may be selected from a variety of valves including a needle, globe, butterfly, or other valve types and controls the flow of the first fluid 347. The valve 347a may include a valve actuator, such as a solenoid, that can be controlled with a controller 222. The conduit 346 connects to a first fluid inlet 340 that is located above the substrate and includes a mounting portion 342 to attach to the SRD module 236 and a connecting portion 344 to attach to the conduit 346. The first fluid inlet is shown with a single first nozzle 348 to deliver the first fluid 347 under pressure onto the substrate upper surface. However, multiple nozzles could be used and multiple fluid inlets could be positioned about the inner perimeter of the SRD module 236. Preferably, nozzles placed above the substrate should be located at a location represented by an imaginary vertical cylinder extending through the outer circumference of the substrate to lessen the risk of liquids from the nozzles dripping on the substrate. The first fluid inlet 340 could be mounted in a variety of locations, including through a cover positioned above the substrate. Additionally, the nozzle 348 may articulate to a variety of positions using an articulating member 343, such as a ball and socket joint.

Similar to the first conduit and related elements described above, a second conduit 352 is connected to a control valve 349a and a second fluid inlet 350 with a second nozzle 351. The second fluid inlet 350 is shown below the substrate and angled upward to direct a second fluid under the substrate through the second nozzle 351. Similar to the first fluid inlet, the second fluid inlet may include a plurality of nozzles, a plurality of fluid inlets and mounting locations, and a plurality of orientations including using the articulating member 353. Each fluid inlet could be extended into the SRD module 236 at a variety of positions. The nozzles could be extended radially inward and the discharge from the nozzles be directed back toward the SRD module periphery if the flow is desired to be at a certain angle that is directed back toward the SRD module periphery along the edge of the substrate.

The controller 222 could individually control the two fluids and their respective flow rates, pressure, and timing, and any associated valving, as well as the spin cycle(s). The controller could be remotely located, for instance, in a control panel or control room and the plumbing controlled with remote actuators. An alternative embodiment, shown in dashed lines, provides an auxiliary fluid inlet 346a connected to the first conduit 346 with a conduit 346b and having a control valve 346c. The auxiliary fluid inlet 346a may be used to flow a rinsing fluid on the backside of the substrate after the dissolving fluid is flowed without having to reorient the substrate or switch the flow through the second fluid inlet to a rinsing fluid.

In one embodiment, the substrate is mounted with the deposition surface of the disposed face up in the SRD module bowl. As will be explained below, for such an arrangement, the first fluid inlet would generally flow a rinsing fluid, typically deionized water or alcohol. Consequently, the backside of the substrate would be mounted facing down and a fluid flowing through the second fluid inlet would be a dissolving fluid, such as an acid, including hydrochloric acid, sulfuric acid, phosphoric acid, hydrofluoric acid, or other dissolving liquids or fluids, depending on the material to be dissolved. Alternatively, the first fluid and the second fluid are both rinsing fluids, such as deionized water or alcohol, when the desired process is to rinse the processed substrate.

In operation, the pedestal is in a raised position, shown in FIG. 4, and a robot, not shown, places the substrate, front side up, onto the pedestal. The pedestal lowers the substrate to a processing position where the substrate is vertically disposed between the first and the second fluid inlets. Generally, the pedestal actuator rotates the pedestal between about 5 to about 5000 rpm, with a typical range between about 20 to about 2000 rpm for a 200 mm substrate. The rotation causes the lower end 337a of the clamps to rotate outward about pivot 337b, toward the periphery of the SRD module sidewall, due to centrifugal force. The clamp rotation forces the upper end 337c of the clamp inward and downward to center and hold the substrate 338 in position on the pedestal 336, preferably along the substrate edge. The clamps may rotate into position without touching the substrate and hold the substrate in position on the pedestal only if the substrate significantly lifts off the pedestal during processing. With the pedestal rotating the substrate, a rinsing fluid is delivered onto the substrate front side through the first fluid inlet 340. The second fluid, such as an acid, is delivered to the backside surface through the second fluid inlet to remove any unwanted deposits. The dissolving fluid chemically reacts with the deposited material and dissolves and then flushes the material away from the substrate backside and other areas where any unwanted deposits are located.

In a preferred embodiment, the rinsing fluid is adjusted to flow at a greater rate than the dissolving fluid to help protect the front side of the substrate from the dissolving fluid. The first and second fluid inlets are located for optimal performance depending on the size of the substrate, the respective flow rates, spray patterns, and amount and type of deposits to be removed, among other factors. In some instances, the rinsing fluid could be routed to the second fluid inlet after a dissolving fluid has dissolved the unwanted deposits to rinse the backside of the substrate. In other instances, an auxiliary fluid inlet connected to flow rinsing fluid on the backside of the substrate could be used to rinse any dissolving fluid residue from the backside. After rinsing the front side and/or backside of the substrate, the fluid(s) flow is stopped and the pedestal continues to rotate, spinning the substrate, and thereby effectively drying the substrate surface.

The fluid(s) is generally delivered in a spray pattern, which may be varied depending on the particular nozzle spray pattern desired and may include a fan, jet, conical, and other patterns. One spray pattern for the first and second fluids through the respective fluid inlets, when the first fluid is a rinsing fluid, is fan pattern with a pressure of about 10 to about 15 pounds per square inch (psi) and a flow rate of about 1 to about 3 gallons per minute (gpm) for a 200 mm substrate.

The SRD module 236 could also be used to remove the unwanted deposits along the edge of the substrate to create an edge exclusion zone. By adjustment of the orientation and placement of the nozzles, the flow rates of the fluids, the rotational speed of the substrate, and the chemical composition of the fluids, the unwanted deposits could be removed from the edge and/or edge exclusion zone of the substrate as well. Thus, substantially preventing dissolution of the deposited material on the front side surface may not necessarily include the edge or edge exclusion zone of the substrate. Also, preventing dissolution of the deposited material on the front side surface is intended to include at least preventing the dissolution so that the front side with the deposited material is not impaired beyond a commercial value.

One method of accomplishing the edge exclusion zone dissolution process is to rotate the disk at a slower speed, such as about 100 to about 1000 rpm, while dispensing the dissolving fluid on the backside of the substrate. Inertia supplied by the centrifugal spinning of the substrate moves the dissolving fluid to the edge of the substrate. A fluid layer is formed in the electrolyte solution that flows around the edge of the substrate due to surface tension of the fluid. The dissolving fluid therefor overlaps from the backside to the front side in the edge area of the substrate. The rotational speed of the substrate and the flow rate of the dissolving fluid may be used to control the extent of the overlap onto the front side. For instance, a decrease in rotational speed and/or an increase in flow results in a less overlap of fluid to the opposing side, e.g., the front side. Additionally, the flow rate and flow angle of the rinsing fluid delivered to the front side can be adjusted to offset the layer of dissolving fluid onto the edge and/or frontside of the substrate. In some instances, the dissolving fluid may be used initially without the rinsing fluid to obtain the edge and/or edge exclusion zone removal, followed by the rinsing/dissolving process.

The SRD module 236 is connected between the loading station 210 and the mainframe 214. The mainframe transfer station 216 includes a mainframe transfer robot 242. Preferably, the mainframe transfer robot 242 comprises a plurality of individual robot blades 244 that provides independent access of substrates in the processing stations 218 and the SRD stations 212. As shown in FIG. 3, the mainframe transfer robot 242 comprises two robot blades 244, corresponding to the number of processing cells 240 per processing station 218. Each robot blade 244 is configured to hold a substrate during a substrate transfer. Preferably, each robot blade 244 is operable independently of the other blade to facilitate independent transfers of substrates in the system. Alternatively, the robot blades 244 operate in a coordinated fashion such that one robot extends as the other robot blade retracts.

Preferably, the mainframe transfer station 216 includes a flipper robot 248 that facilitates transfer of a substrate from a face-up position on the robot blade 246 of the mainframe transfer robot 242 to a face down position for a process cell 240 that requires face-down processing of substrates. The flipper robot 248 includes a main body 250 that provides both vertical and rotational movements with respect to a vertical axis of the main body 250 and a flipper robot blade 252 that provides rotational movement along a horizontal plane along the flipper robot blade 252. Preferably, a vacuum suction gripper 254, disposed at the distal end of the flipper robot blade 252, holds the substrate as the substrate is flipped and transferred by the flipper robot 248. The flipper robot 248 positions a substrate 234 into the processing cell 240 for face-down processing.

Figure 24:
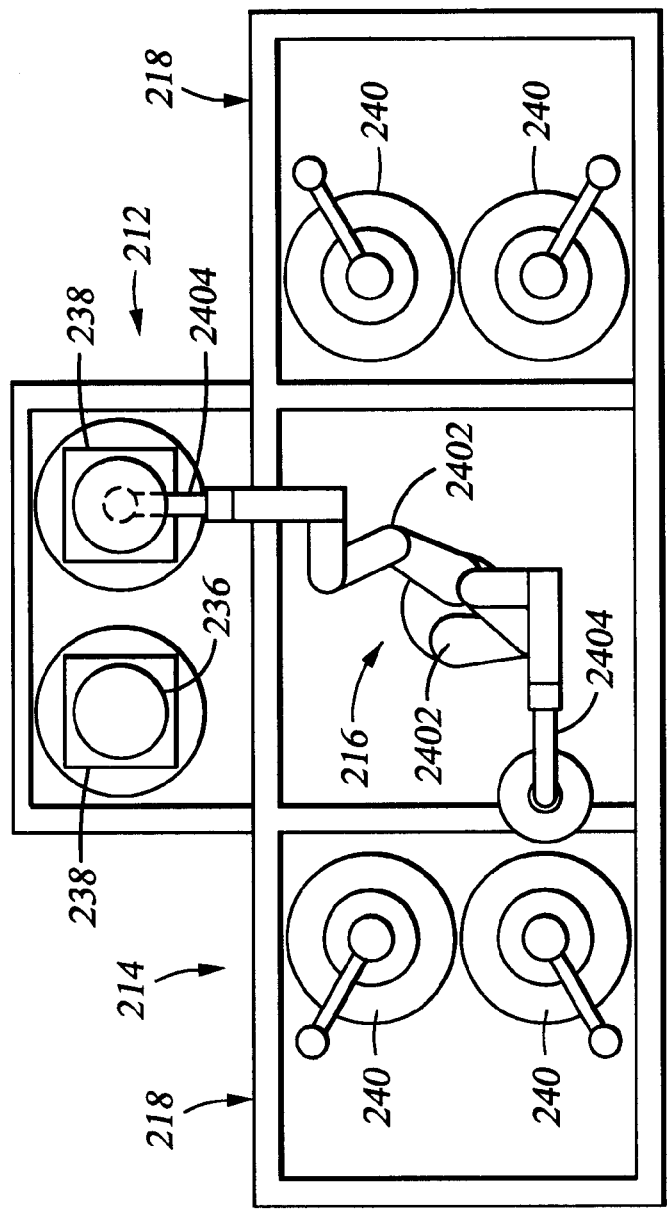
FIG. 24 is a top schematic view of a mainframe transfer robot having a flipper robot incorporated therein.

FIG. 24 is a top schematic view of a mainframe transfer robot having a flipper robot incorporated therein. The mainframe transfer robot 242 as shown in FIG. 24 serves to transfer substrates between different stations attached the mainframe station, including the processing stations and the SRD stations. The mainframe transfer robot 242 includes a plurality of flipper robot blades 2402 (two are shown). Flipper robots are generally known in the art and can be attached as end effectors for substrate handling robots. One such flipper robot is the model RR701, available from Rorze Automation, Inc., located in Milpitas, Calif. The main transfer robot 242 having a flipper robot and an end effector is capable of transferring substrates between different stations attached to the mainframe. The end effector of the main transfer robot is also capable of flipping the substrate being transferred to the desired surface orientation, e.g. face-down for the electroplating process. Preferably, the mainframe transfer robot 242 provides independent robot motion along the X-Y-Z axes by the robot blade 2402 and independent substrate flipping rotation by the flipper robot end effector 2404. By incorporating the flipper robot end effector 2404 as the end effector of the mainframe transfer robot, the substrate transfer process is simplified because the step of passing a substrate from a mainframe transfer robot to a flipper robot is eliminated.

Figure 6:
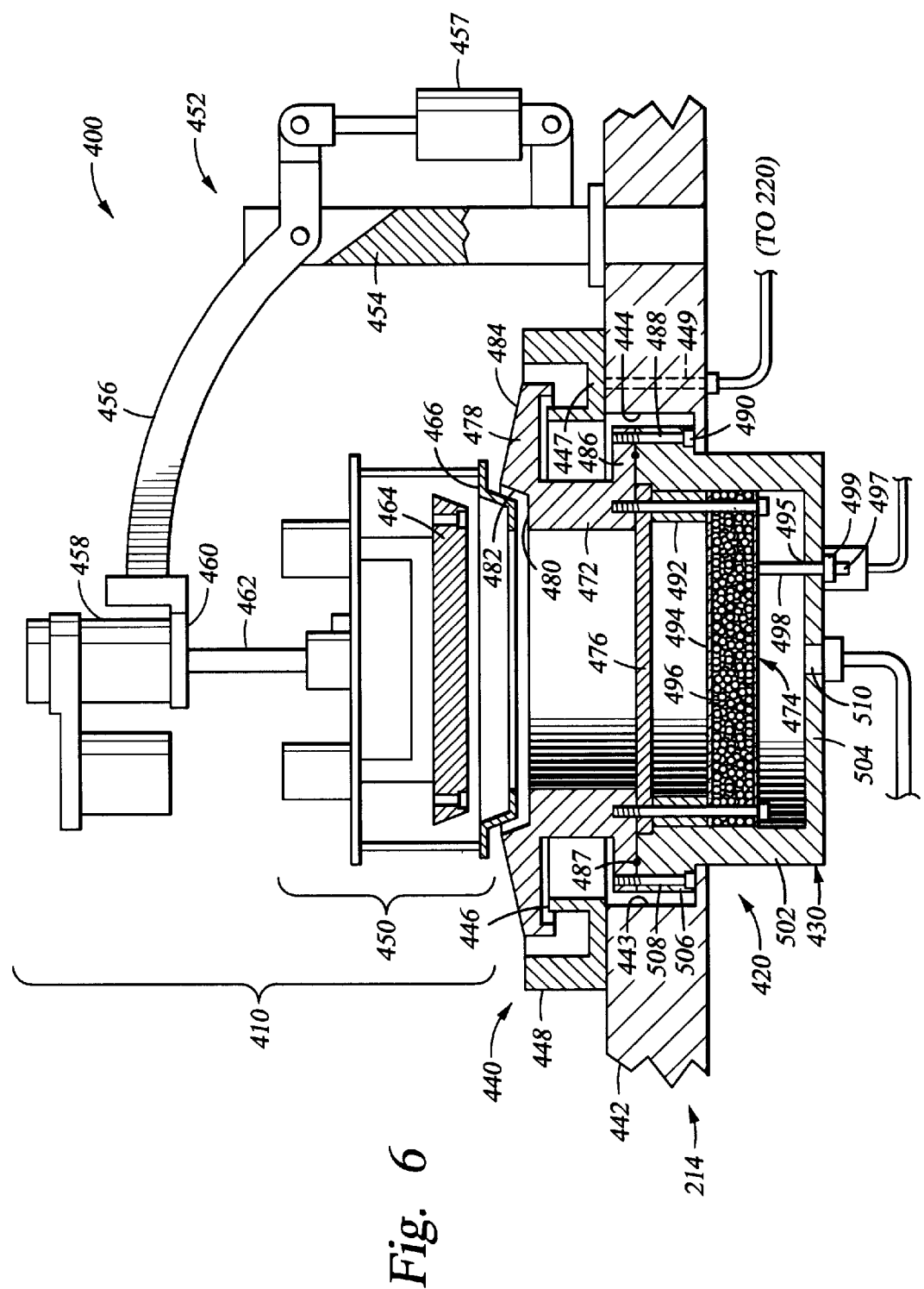
FIG. 6 is a cross sectional view of one embodiment of an electroplating process cell.

FIG. 6 is a cross sectional view of one embodiment of an electroplating process cell 400. The electroplating process cell 400 as shown in FIG. 6 is one embodiment of the electroplating process cell 240 as shown in FIGS. 2 and 3. The processing cell 400 generally comprises a head assembly 410, a process cell 420 and an electrolyte collector 440. Preferably, the electrolyte collector 440 is secured onto the body 442 of the mainframe 214 over an opening 443 that defines the location for placement of the process cell 420. The electrolyte collector 440 includes an inner wall 446, an outer wall 448 and a bottom 447 connecting the walls. An electrolyte outlet 449 is disposed through the bottom 447 of the electrolyte collector 440 and connected to the electrolyte replenishing system 220, shown in FIG. 2, through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process cell 420. The movement of the head assembly provides the spacing required to remove and/or replace the process cell 420 from the electroplating process cell 400. When the cantilever arm actuator 457 is extended, the cantilever arm 456 moves the head assembly 410 toward the process cell 420 to position the substrate in the head assembly 410 in a processing position.

The head assembly 410 generally comprises a substrate holder assembly 450 and a substrate assembly actuator 458. The substrate assembly actuator 458 is mounted onto the mounting plate 460, and includes a head assembly shaft 462 extending downwardly through the mounting plate 460. The lower end of the head assembly shaft 462 is connected to the substrate holder assembly 450 to position the substrate holder assembly 450 in a processing position and in a substrate loading position.

Figure 7:
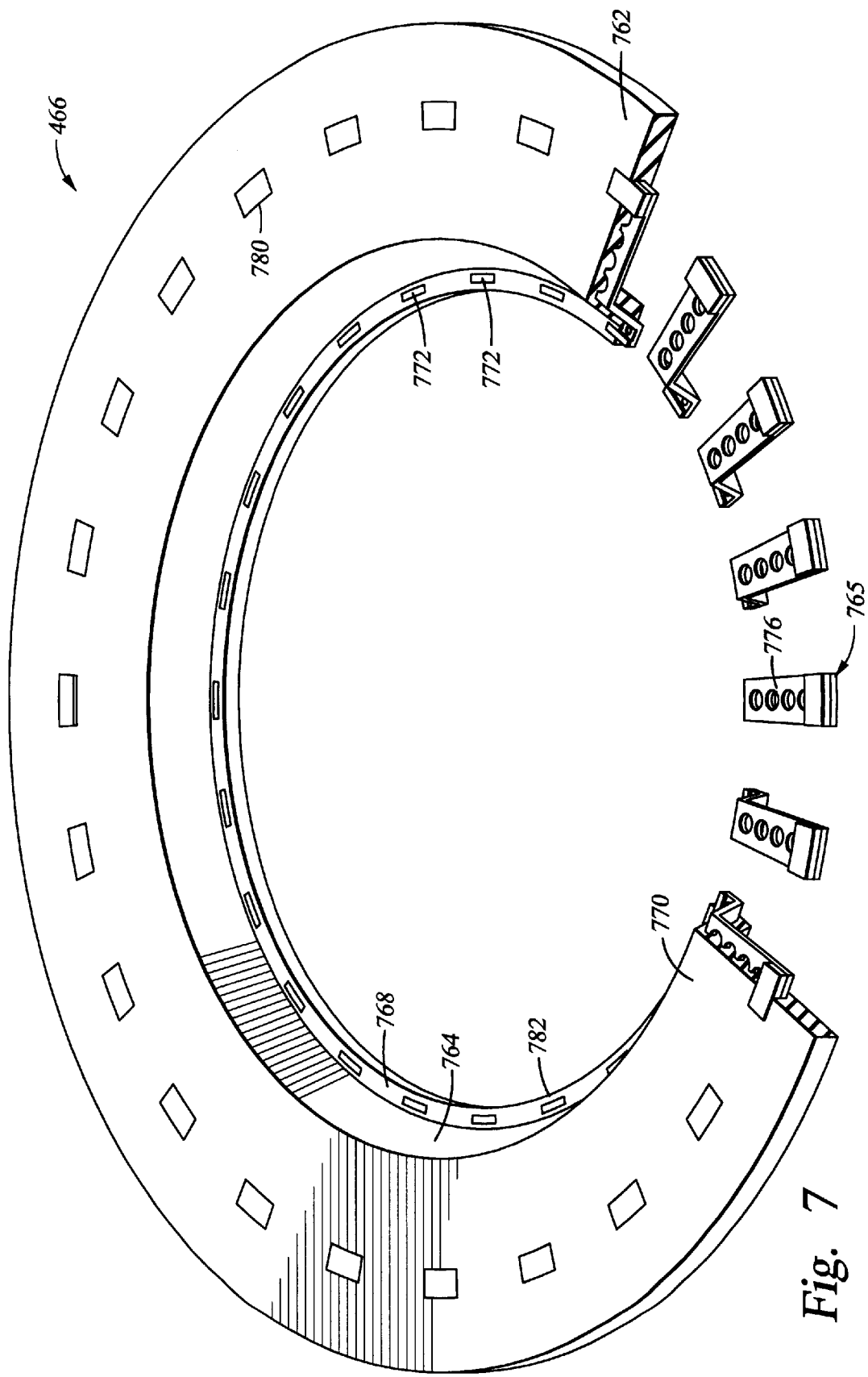
FIG. 7 is a cross sectional view of a cathode contact ring of FIG. 6.

The substrate holder assembly 450 generally comprises a substrate holder element 464 and a cathode contact ring 466. FIG. 7 is a cross sectional view of one embodiment of one embodiment of a cathode contact ring 466. In general, the contact ring 466 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

Referring now to FIG. 7 in detail, the contact ring 466 generally comprises a plurality of conducting members 765 at least partially disposed within an annular insulative body 770. The insulative body 770 is shown as having a flange 762 and a downward sloping shoulder portion 764. The sloping shoulder portion 764 leads to a substrate seating surface 768 located below the flange 762 such that the flange 762 and the substrate seating surface 768 lie in offset and substantially parallel planes. Thus, the flange 762 may be understood to define a first plane while the substrate seating surface 768 defines a second plane parallel to the first plane wherein the shoulder 764 is disposed between the two planes. However, contact ring design shown in FIG. 7 is intended to be merely illustrative. In another embodiment, the shoulder portion 764 may be of a steeper angle including a substantially vertical angle so as to be substantially normal to both the flange 762 and the substrate seating surface 768. Alternatively, the contact ring 466 may be substantially planar thereby eliminating the shoulder portion 764. However, for reasons described below, a preferred embodiment comprises the shoulder portion 764 shown in FIG. 6 or some variation thereof.

The conducting members 765 are defined by a plurality of outer electrical contact pads 780 annularly disposed on the flange 762, a plurality of inner electrical contact pads 772 disposed on a portion of the substrate seating surface 768, and a plurality of embedded conducting connectors 776 (that link the pads 772, 780 to one another. The conducting members 765 are isolated from one another by the insulative body 770 which may be made of a plastic such as polyvinylid enefluoride (PVDF), perfluoroalkoxy resin (PFA), TEFLON® (a registered trademark of E.I. duPont de Nemoirs and Company of Wilmington, Del.), and TEFZEL® (a registered trademark of E.I. duPont de Nemoirs and Company of Wilmington, Del.), or any other insulating material such as Alumina ($Al_2O_3$) or other ceramics. The outer contact pads 780 are coupled to a controller to deliver current and voltage to the inner contact pads 772 via the connectors 776 during processing. In turn, the inner contact pads 772 supply the current and voltage to a substrate by maintaining contact around a peripheral portion of the substrate. Thus, in operation the conducting members 765 act as discrete current paths electrically connected to a substrate.

Low resistivity, and conversely high conductivity, are directly related to good plating. To ensure low resistivity, the conducting members 765 are preferably made of copper (Cu), platinum (Pt), tantalum (Ta), titanium (Ti), gold (Au), silver (Ag), stainless steel or other conducting materials. Low resistivity and low contact resistance may also be achieved by coating the conducting members 765 with a conducting material. Thus, the conducting members 765 may, for example, be made of copper having a resistivity of approximately $2 \times 10^{-8}$ $\Omega \cdot m$, and be coated with platinum having a resistivity of approximately $10.6 \times 10^{-8}$ $\Omega \cdot m$. Coatings such as tantalum nitride (TaN), titanium nitride (TiN), rhodium (Rh), Au, Cu, or Ag on a conductive base materials such as stainless steel, molybdenum (Mo), Cu, and Ti are also possible. Further, since the contact pads 772, 780 are typically separate units bonded to the conducting connectors 776, the contact pads 772, 780 may comprise one material, such as Cu, and the conducting members 765 another, such as stainless steel. Either or both of the pads 772, 180 and conducting connectors 776 may be coated with a conducting material. Additionally, because plating repeatability may be adversely affected by oxidation which acts as an insulator, the inner contact pads 772 preferably comprise a material resistant to oxidation such as Pt, Ag, or Au.

In addition to being a function of the contact material, the total resistance of each circuit is dependent on the geometry, or shape, of the inner contact inner contact pads 772 and the force supplied by the contact ring 466. These factors define a constriction resistance, RCR, at the interface of the inner contact pads 772 and the substrate seating surface 768 due to asperities between the two surfaces. Generally, as the applied force is increased the apparent area is also increased. The apparent area is, in turn, inversely related to RCR so that an increase in the apparent area results in a decreased RCR. Thus, to minimize overall resistance it is preferable to maximize force. The maximum force applied in operation is limited by the yield strength of a substrate which may be damaged under excessive force and resulting pressure.

Figures 8, 9:
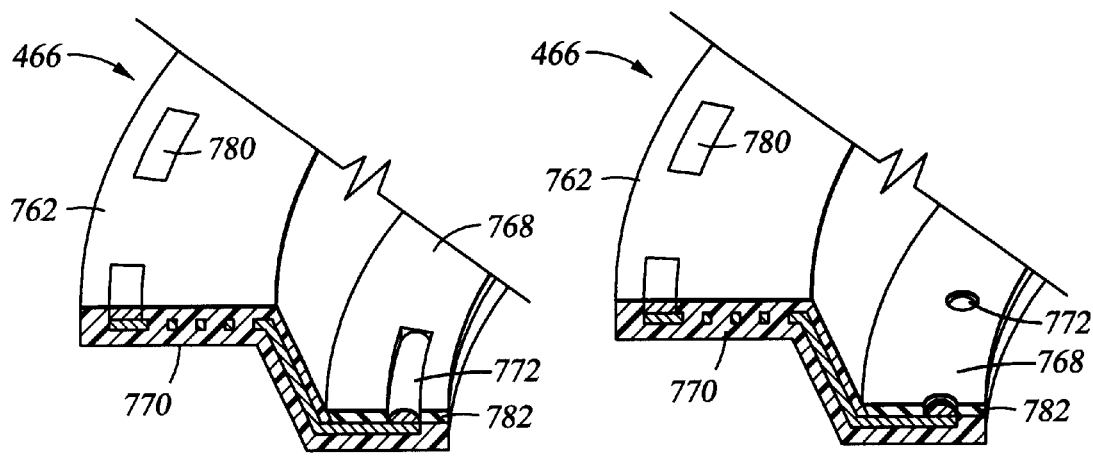
FIG. 8 is a cross sectional perspective view of the cathode contact ring of FIG. 6 showing an alternative embodiment of contact pads.
FIG. 9 is a cross sectional view perspective of the cathode contact ring showing an alternative embodiment of the contact pads and an isolation gasket.

However, because pressure is related to both force and area, the maximum sustainable force is also dependent on the geometry of the inner contact pads 772. Thus, while the contact pads 772 may have a flat upper surface as in FIG. 7, other shapes may be used to advantage. For example, two preferred shapes are shown in FIGS. 8 and 9. FIG. 8 shows a knife-edge contact pad and FIG. 9 shows a hemispherical contact pad. A person skilled in the art will readily recognize other shapes that may be used to advantage. A more complete discussion of the relation between contact geometry, force, and resistance is given in *Ney Contact Manual*, by Kenneth E. Pitney, The J. M. Ney Company, 1973, which is hereby incorporated by reference in its entirety.

The number of connectors 776 may be varied depending on the particular desired number of contact pads 772 shown in FIG. 7. For a 200 mm substrate, preferably at least twenty-four connectors 776 are spaced equally over 360°. However, as the number of connectors reaches a critical level, the compliance of the substrate relative to the contact ring 466 is adversely affected. Therefore, while more than twenty-four connectors 776 may be used, contact uniformity may eventually diminish depending on the topography of the contact pads 772 and the substrate stiffness. Similarly, while less than twenty-four connectors 776 may be used, current flow is increasingly restricted and localized, leading to poor plating results. Since the dimensions are readily altered to suit a particular application, for example, a 200 mm substrate or a 300 mm substrate. The optimal number may easily be determined for varying scales and embodiments.

Figure 10:
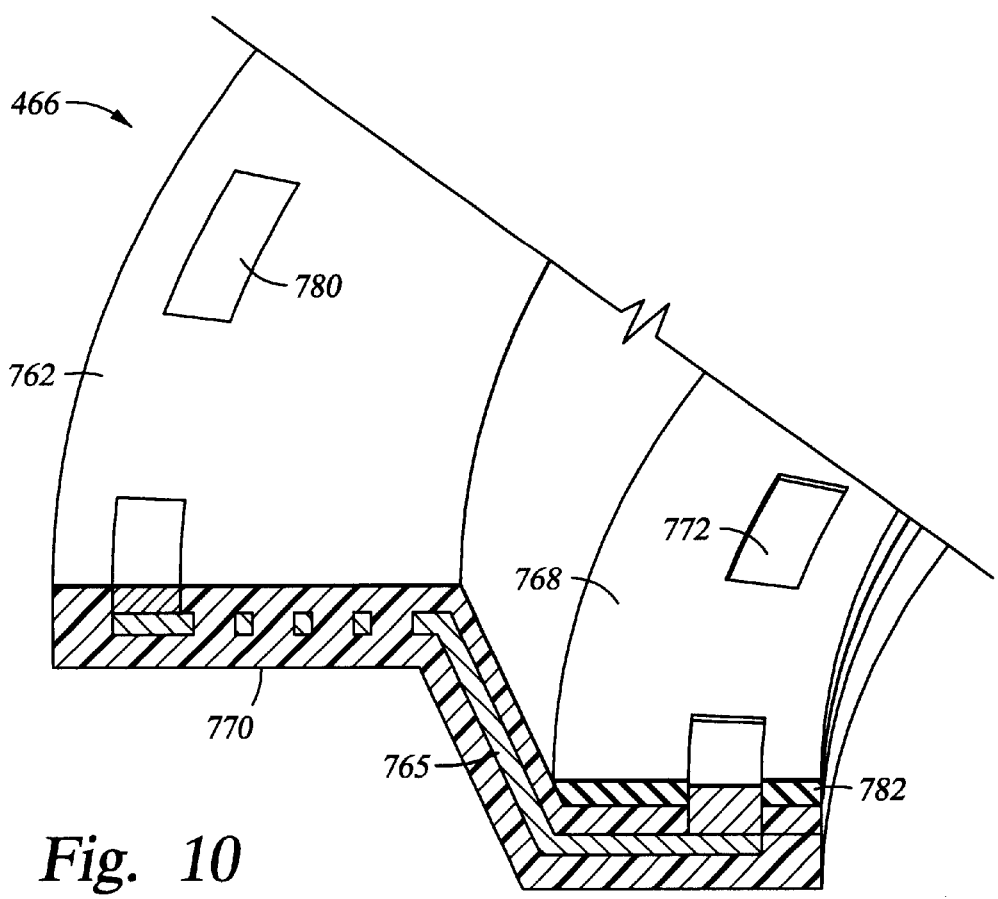
FIG. 10 is a cross sectional perspective view of the cathode contact ring showing the isolation gasket.

As shown in FIG. 10, the substrate seating surface 768 comprises an isolation gasket 782 disposed on the insulative body 770 and extending diametrically interior to the inner contact pads 772 that defines the inner diameter of the contact ring 466. The isolation gasket 782 preferably extends slightly above the inner contact pads 772 (e.g. a few mils) and preferably comprises an elastomer such as VITON® (a registered trademark of E.I. duPont de Nemoirs and Company of Wilmington, Del.), TEFLON®, buna rubber and the like. Where the insulative body 770 also comprises an elastomer the isolation gasket 782 may be of the same material. In the latter embodiment, the isolation gasket 782 and the insulative body 770 may be monolithic, i.e., formed as a single piece. However, the isolation gasket 782 is preferably separate from the insulative body 770 so that it may be easily removed for replacement or cleaning.

While FIG. 10 shows a preferred embodiment of the isolation gasket 782 wherein the isolation gasket is seated entirely on the insulative body 770, FIGS. 8 and 9 show an alternative embodiment. In the latter embodiment, the insulative body 770 is partially machined away to expose the upper surface of the connecting member 776 and the isolation gasket 782 is disposed thereon. Thus, the isolation gasket 782 contacts a portion of the connecting member 776. This design requires less material to be used for the inner contact pads 772 which may be advantageous where material costs are significant such as when the inner contact pads 772 comprise gold. Persons skilled in the art will recognize other embodiments.

During processing, the isolation gasket 782 maintains contact with a peripheral portion of the substrate plating surface and is compressed to provide a seal between the remaining cathode contact ring 466 and the substrate. The seal prevents the electrolyte solution from contacting the edge and backside of the substrate. As noted above, maintaining a clean contact surface is necessary to achieving high plating repeatability. Previous contact ring designs did not provide consistent plating results because contact surface topography varied over time. The contact ring eliminates, or substantially minimizes, deposits that would otherwise accumulate on the inner contact pads 772 and change their characteristics thereby producing highly repeatable, consistent, and uniform plating across the substrate plating surface.

Figure 11:
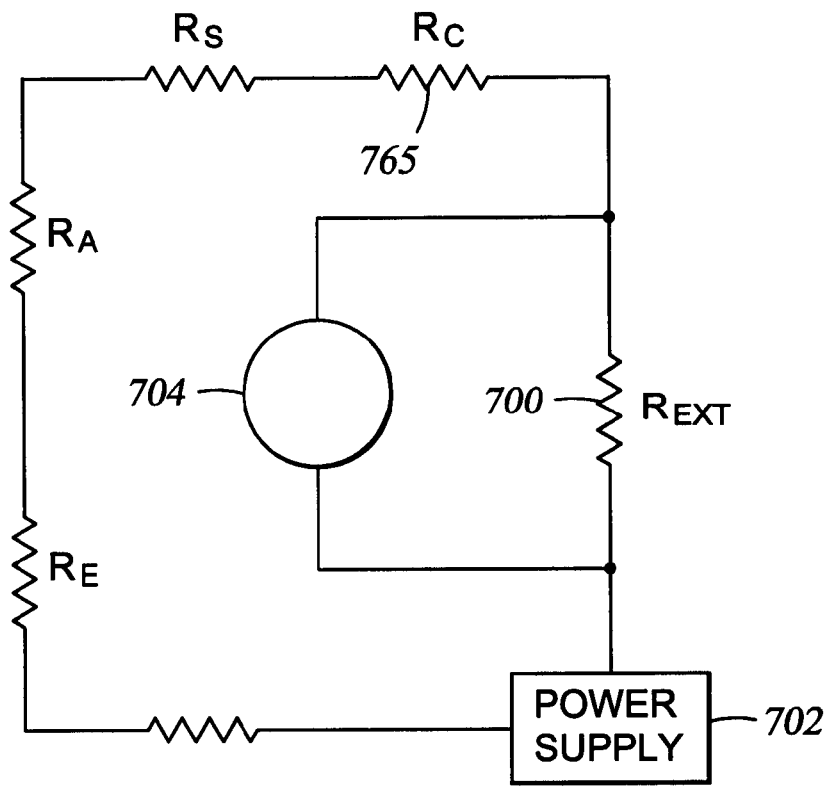
FIG. 11 is a schematic diagram of the electrical circuit representing the electroplating system through each contact pin.

FIG. 11 is a simplified schematic diagram representing a possible configuration of the electrical circuit for the contact ring 466. To provide a uniform current distribution between the conducting members 765, an external resistor 700 is connected in series with each of the conducting members 765. Preferably, the resistance value of the external resistor 700 (represented as $R_{EXT}$) is much greater than the resistance of any other component of the circuit. Each conducting member 765 shown in FIG. 11 is represented by the resistance of each of the components connected in series with the controller 222. $R_E$ represents the resistance of the electrolyte solution, which is typically dependent on the spacing between the anode and the cathode contact ring and the composition of the electrolyte solution chemistry. Thus, RA represents the resistance of the electrolyte solution adjacent the substrate plating surface 754. $R_S$ represents the resistance of the substrate plating surface 754, and $R_C$ represents the resistance of the cathode conducting members 765 plus the constriction resistance resulting at the interface between the inner contact pads 772 and the substrate plating layer 754. Generally, the resistance value of the external resistor ($R_{EXT}$) is at least as much as $\Sigma R$, where $\Sigma R$ equals the sum of $R_E$, $R_A$, $R_S$ and $R_C$. Preferably, the resistance value of the external resistor ($R_{EXT}$) is much greater than $\Sigma R$ such that $\Sigma R$ is negligible and the resistance of each series circuit approximates $R_{EXT}$.

Typically, one controller is connected to all of the outer contact pads 780 of the cathode contact ring 466, resulting in parallel circuits through the inner contact pads 772. However, as the inner contact pad-to-substrate interface resistance varies with each inner contact pad 772, more current will flow, and thus more plating will occur, at the site of lowest resistance. However, by placing an external resistor in series with each conducting member 765, the value or quantity of electrical current passed through each conducting member 765 becomes controlled mainly by the value of the external resistor. As a result, the inconsistencies in the electrical properties between each of the inner contact pads 772 do not affect the current distribution on the substrate. A uniform current density results across the plating surface that contributes to a uniform plating thickness. The external resistors also provide a uniform current distribution between different substrates of a process-sequence.

Although the contact ring 466 is designed to resist deposit buildup on the inner contact pads 772, over multiple substrate plating cycles the substrate-pad interface resistance may increase, eventually reaching an unacceptable value. An electronic sensor/alarm 704 can be connected across the external resistor 700 to monitor the voltage/current across the external resistor to address this problem. If the voltage/current across the external resistor 700 falls outside of a preset operating range that is indicative of a high substrate-pad resistance, the sensor/alarm 704 triggers corrective measures. The corrective measures include shutting down the plating process until the problems are corrected by an operator. Alternatively, a separate controller can be connected to each conducting member 765 and can be separately controlled and monitored to provide a uniform current distribution across the substrate. A very smart system (VSS) may also be used to modulate the current flow. The VSS typically comprises a processing unit and any combination of devices known in the industry used to supply and/or control current such as variable resistors, separate power supplies, etc. As the physiochemical, and hence electrical, properties of the inner contact pads 772 change over time, the VSS processes and analyzes data feedback. The data is compared to pre-established setpoints and the VSS then makes appropriate current and voltage alterations to ensure uniform deposition.

Figure 18:
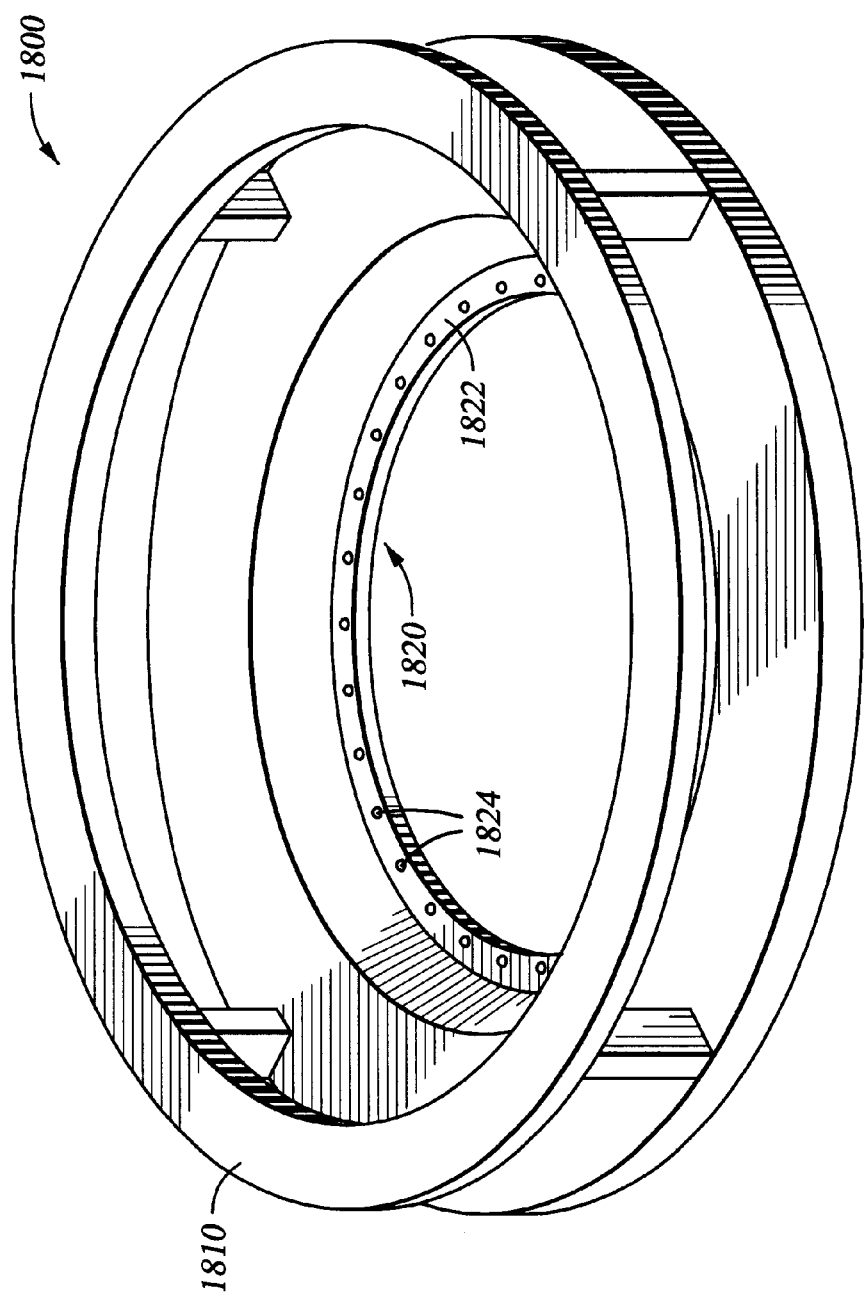
FIG. 18 is a perspective view of an alternative embodiment of a cathode contact ring.

FIG. 18 is a perspective view of an alternative embodiment of a cathode contact ring. The cathode contact ring 1800 as shown in FIG. 18 includes contacts formed from a a conductive metal or a metal alloy, such as stainless steel, copper, silver, gold, platinum, titanium, tantalum, and other conductive materials, or a combination of conductive materials, such as stainless steel coated with platinum. The cathode contact ring 1800 includes an upper mounting portion 1810 adapted for mounting the cathode contact ring onto the substrate holder assembly and a lower substrate receiving portion 1820 adapted for receiving a substrate therein. The substrate receiving portion 1820 includes an annular substrate seating surface 1822 having a plurality of contact pads or bumps 1824 disposed thereon and preferably evenly spaced apart. When a substrate is positioned on the substrate seating surface 1822, the contact pads 1824 physically contact a peripheral region of the substrate to provide electrical contact to the electroplating seed layer on the substrate deposition surface. Preferably, the contact pads 1824 are coated with a noble metal, such as platinum or gold, that is resistant to oxidation.

The exposed surfaces of the cathode contact ring, except the surfaces of the contact pads that come in contact with the substrate, are preferably treated to provide hydrophilic surfaces or coated with a material that exhibits hydrophilic properties. Hydrophilic materials and hydrophilic surface treatments are known in the art. One company providing a hydrophilic surface treatment is Millipore Corporation, located in Bedford, Mass. The hydrophilic surface significantly reduces beading of the electrolyte solution on the surfaces of the cathode contact ring. The hydrophilic surface promotes smooth dripping of the electrolyte solution from the cathode contact ring after the cathode contact ring is removed from the electroplating bath or electrolyte solution. By providing hydrophilic surfaces on the cathode contact ring that facilitate run-off of the electrolyte solution, plating defects caused by residual electrolyte solution on the cathode contact ring are significantly reduced. The application of this hydrophilic treatment or coating in other embodiments of cathode contact rings reduce residual electrolyte solution beading on the cathode contact ring and the plating defects on a subsequently processed substrate that may result therefrom.

Figure 12:
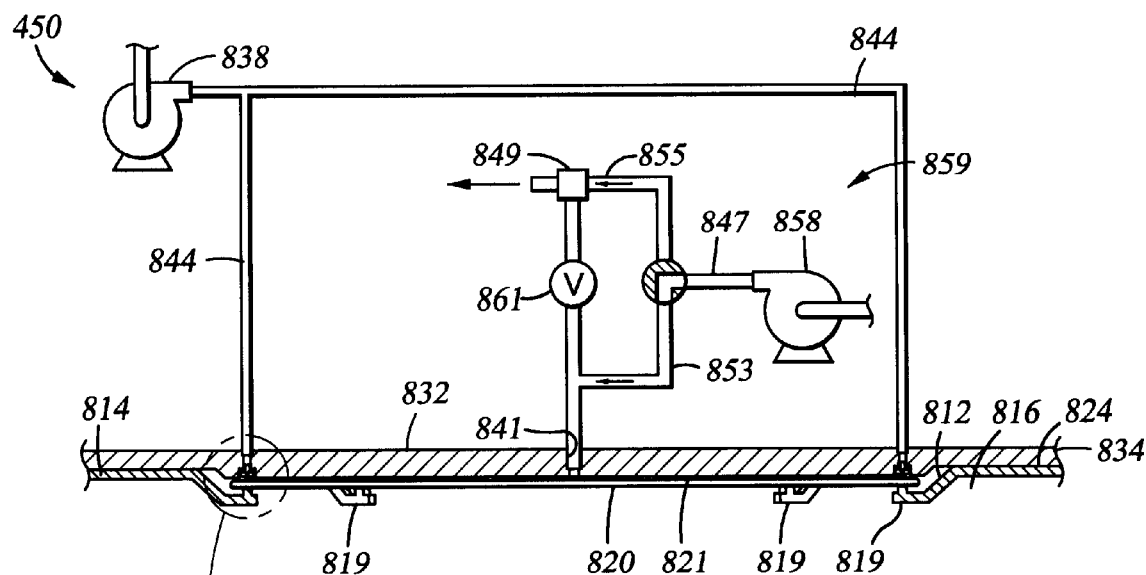
FIG. 12 is a cross sectional view of one embodiment of a substrate assembly.
Figure 12A:
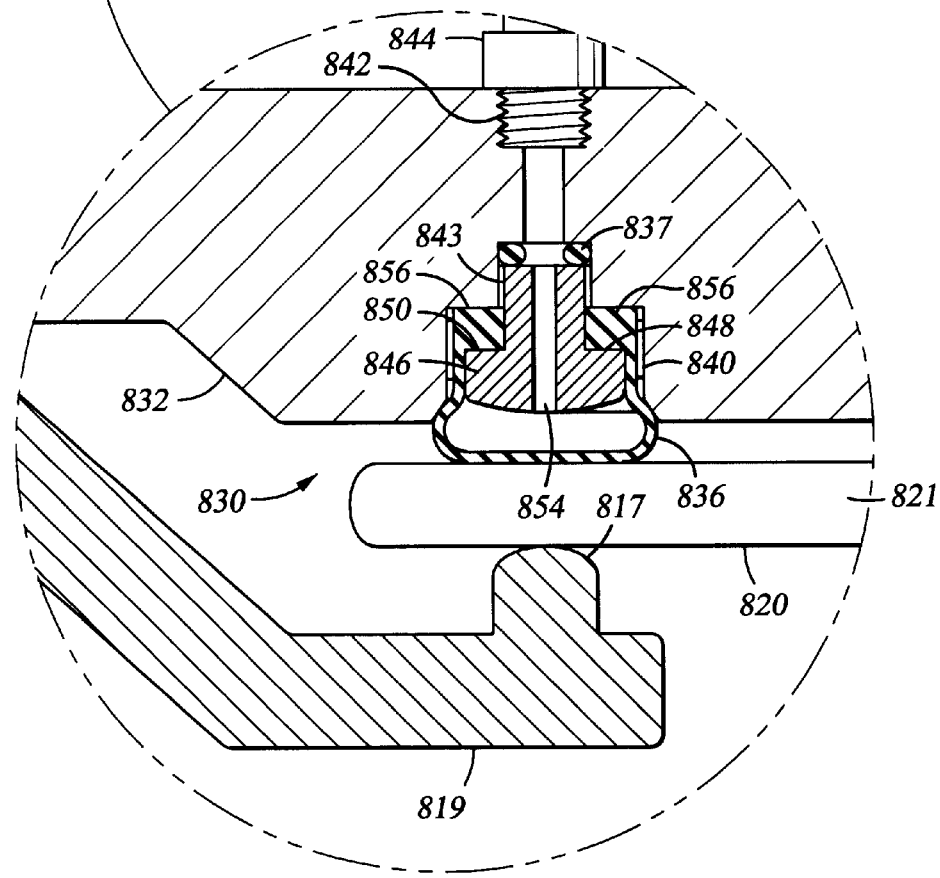
FIG. 12A is an enlarged cross sectional view of the bladder area of FIG. 12.

Referring to FIGS. 12 and 12A, the substrate holder element 464 is preferably positioned above the cathode contact ring 466. The substrate holder comprises a bladder assembly 470 that provides pressure to the backside of a substrate and ensures electrical contact between the substrate plating surface and the cathode contact ring 466. The inflatable bladder assembly 470 is disposed on a substrate holder plate 832. A bladder 836 disposed on a lower surface of the substrate holder plate 832 is thus located opposite and adjacent to the contacts on the cathode contact ring 466 with the substrate 821 interposed therebetween. A fluid source 838 supplies a fluid, i.e., a gas or liquid, to the bladder 836 allowing the bladder 836 to be inflated to varying degrees.

Referring now to FIGS. 12, 12A, and 13, the details of the bladder assembly 470 will be discussed. The substrate holder plate 832 is shown as substantially disc-shaped having an annular recess 840 formed on a lower surface and a centrally disposed vacuum port 841. One or more inlets 842 are formed in the substrate holder plate 832 and lead into the relatively enlarged annular mounting channel 843 and the annular recess 840. Quick-disconnect hoses 844 couple the fluid source 838 to the inlets 842 to provide a fluid thereto. The vacuum port 841 is preferably attached to a vacuum/pressure pumping system 859 adapted to selectively supply a pressure or create a vacuum at a backside of the substrate 821. The pumping system 859, shown in FIG. 12, comprises a pump 845, a cross-over valve 847, and a vacuum ejector 849 commonly known as a venturi. One vacuum ejector that may be used to advantage is available from SMC Pneumatics, Inc., of Indianapolis, Ind. The pump 845 may be a commercially available compressed gas source and is coupled to one end of a hose 851, the other end of the hose 851 being coupled to the vacuum port 841. The hose 851 is split into a pressure line 853 and a vacuum line 855 having the vacuum ejector 849 disposed therein. Fluid flow is controlled by the cross-over valve 847 which selectively switches communication with the pump 845 between the pressure line 853 and the vacuum line 855. Preferably, the cross-over valve has an OFF setting whereby fluid is restricted from flowing in either direction through hose 851. A shut-off valve 861 disposed in hose 851 prevents fluid from flowing from pressure line 855 upstream through the vacuum ejector 849. The desired direction of fluid flow is indicated by arrows.

Persons skilled in the art will readily appreciate other embodiments of the present invention. For example, where the fluid source 838 is a gas supply it may be coupled to hose 851 thereby eliminating the need for a separate compressed gas supply, i.e., pump 845. Further, a separate gas supply and vacuum pump may supply the backside pressure and vacuum conditions. While it is preferable to allow for both a backside pressure as well as a backside vacuum, a simplified embodiment may comprise a pump capable of supplying only a backside vacuum. However, as will be explained below, deposition uniformity may be improved where a backside pressure is provided during processing. Therefore, an arrangement such as the one described above including a vacuum ejector and a cross-over valve is preferred.

Figure 14:
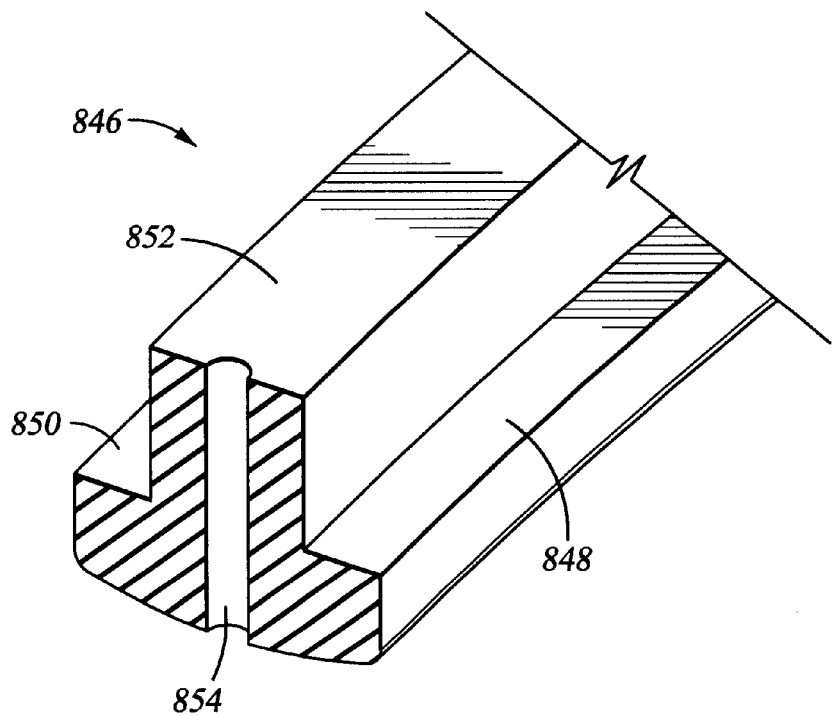
FIG. 14 is a partial cross sectional view of a manifold.

Referring now to FIGS. 12A and 14, a substantially circular ring-shaped manifold 846 is disposed in the annular recess 840. The manifold 846 comprises a mounting rail 852 disposed between an inner shoulder 848 and an outer shoulder 850. The mounting rail 852 is adapted to be at least partially inserted into the annular mounting channel 843. A plurality of fluid outlets 854 formed in the manifold 846 provide communication between the inlets 842 and the bladder 836. Seals 837, such as O-rings, are disposed in the annular manifold channel 843 in alignment with the inlet 842 and outlet 854 and secured by the substrate holder plate 832 to ensure an airtight seal. Conventional fasteners (not shown) such as screws may be used to secure the manifold 846 to the substrate holder plate 832 via cooperating threaded bores (not shown) formed in the manifold 846 and the substrate holder plate 832.

Figure 15:
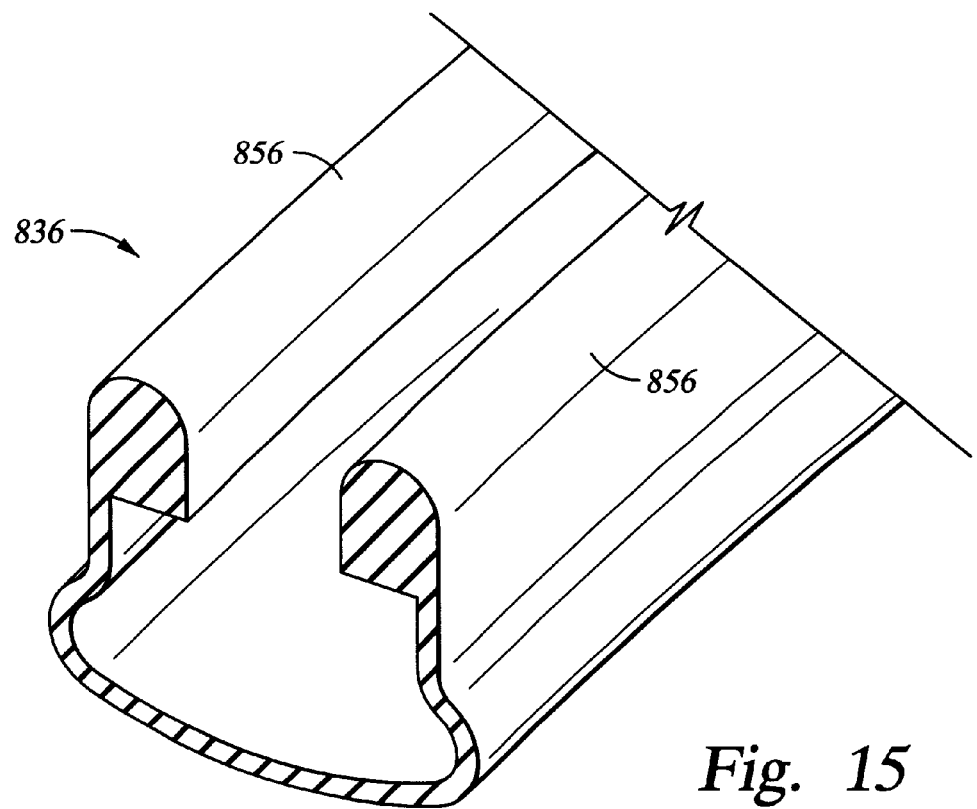
FIG. 15 is a partial cross sectional view of a bladder.

Referring now to FIG. 15, the bladder 836 is shown, in section, as an elongated substantially semi-tubular piece of material having annular lip seals 856, or nodules, at each edge. In FIG. 12A, the lip seals 856 are shown disposed on the inner shoulder 848 and the outer shoulder 850. A portion of the bladder 836 is compressed against the walls of the annular recess 840 by the manifold 846 which has a width slightly less (e.g a few millimeters less) than the annular recess 840. Thus, the manifold 846, the bladder 836, and the annular recess 840 cooperate to form a fluid-tight seal. To prevent fluid loss, the bladder 836 is preferably comprised of some fluid impervious material such as silicon rubber or any comparable elastomer which is chemically inert with respect to the electrolyte solution and exhibits reliable elasticity. Where needed a compliant covering 857 may be disposed over the bladder 836, as shown in FIG. 15, and secured by means of an adhesive or thermal bonding. The covering 857 preferably comprises an elastomer such as Viton™, buna rubber or the like, which may be reinforced by Kevlar™, for example. In one embodiment, the covering 857 and the bladder 836 comprise the same material. The covering 857 has particular application where the bladder 836 is liable to rupturing. Alternatively, the bladder 836 thickness may simply be increased during its manufacturing to reduce the likelihood of puncture. Preferably, the exposed surface of the bladder 836, if uncovered, and the exposed surface of the covering 857 are coated or treated to provide a hydrophilic surface. The hydrophilic surface promotes dripping and removal of the residual electrolyte solution after the head assembly is lifted above the process cell.

The precise number of inlets 842 and outlets 854 may be varied according to the particular application. For example, while FIG. 12 shows two inlets with corresponding outlets, an alternative embodiment could employ a single fluid inlet which supplies fluid to the bladder 836.

In operation, the substrate 821 is introduced into the container body 802 by securing it to the lower side of the substrate holder plate 832. This is accomplished by engaging the pumping system 159 to evacuate the space between the substrate 821 and the substrate holder plate 832 via port 841 thereby creating a vacuum condition. The bladder 836 is then inflated by supplying a fluid such as air or water from the fluid source 838 to the inlets 842. The fluid is delivered into the bladder 836 via the manifold outlets 854, thereby pressing the substrate 821 uniformly against the contacts of the cathode contact ring 466. The electroplating process is then carried out. Electrolyte solution is then pumped into the process cell 420 toward the substrate 821 to contact the exposed substrate plating surface 820. The controller provides a negative bias to the substrate plating surface 820 via the cathode contact ring 466. As the electrolyte solution is flowed across the substrate plating surface 820, ions in the electrolytic solution are attracted to the surface 820 and deposit on the surface 820 to form the desired film.

Because of its flexibility, the bladder 836 deforms to accommodate the asperities of the substrate backside and contacts of the cathode contact ring 466 thereby mitigating misalignment with the conducting cathode contact ring 466. The compliant bladder 836 limits the electrolyte solution from contaminating the backside of the substrate 821 by establishing a fluid tight seal at a perimeter portion of a backside of the substrate 821. Once inflated, a uniform pressure is delivered downward toward the cathode contact ring 466 to achieve substantially equal force at all points where the substrate 821 and cathode contact ring 466 interface. The force can be varied as a function of the pressure supplied by the fluid source 838. Further, the effectiveness of the bladder assembly 470 is not dependent on the configuration of the cathode contact ring 466. For example, while FIG. 12 shows a pin configuration having a plurality of discrete contact points, the cathode contact ring 466 may also be a continuous surface.

Because the force delivered to the substrate 821 by the bladder 836 is variable, adjustments can be made to the current flow supplied by the contact ring 466. As described above, an oxide layer may form on the cathode contact ring 466 and act to restrict current flow. However, increasing the pressure of the bladder 836 may counteract the current flow restriction due to oxidation. As the pressure is increased, the malleable oxide layer is compromised and superior contact between the cathode contact ring 466 and the substrate 821 results. The effectiveness of the bladder 836 in this capacity may be further improved by altering the geometry of the cathode contact ring 466. For example, a knife-edge geometry is likely to penetrate the oxide layer more easily than a dull rounded edge or flat edge.

Additionally, the fluid tight seal provided by the inflated bladder 836 allows the pump 845 to maintain a backside vacuum or pressure either selectively or continuously, before, during, and after processing. Generally, however, the pump 845 is run to maintain a vacuum only during the transfer of substrates to and from the electroplating process cell 400. The bladder 836 is configured to provide an adequate seal with the substrate to maintain the backside vacuum condition during processing without the pump 845 continuous pumping. Thus, while inflating the bladder 836, as described above, the backside vacuum condition is simultaneously relieved by disengaging the pumping system 859, e.g., by selecting an OFF position on the cross-over valve 847. Disengaging the pumping system 859 may be abrupt or comprise a gradual process whereby the vacuum condition is ramped down. Ramping allows for a controlled exchange between the inflating bladder 836 and the simultaneously decreasing backside vacuum condition. This exchange may be controlled manually or by computer.

As described above, continuous backside vacuum pumping while the bladder 836 is inflated is not needed and may actually cause the substrate 820 to buckle or warp leading to undesirable deposition results. It may, however, be desirable to provide a backside pressure to the substrate 820 in order to cause a "bowing" effect of the substrate to be processed. Bowing of the substrate may result in superior deposition since the electric current density at any substrate seed layer point varies as a function of the distance from the anode to the substrate seed layer point through the electrolyte solution. Therefore, the bowing the substrate may result in altering the electric current density of one location on the seed layer that, prior to bowing, has a different relative electric current density than another unbowed location. The effect of the bowing may be to equalize the electric current densities at the two locations on the seed layer on the substrate. Thus, pumping system 859 is capable of selectively providing a vacuum or pressure condition to the substrate backside. For a 200 mm substrate a backside pressure up to 5 psi is preferable to bow the substrate. Because substrates typically exhibit some measure of pliability, a backside pressure causes the substrate to bow or assume a convex shape relative to the upward flow of the electrolyte solution. The degree of bowing is variable according to the pressure supplied by pumping system 859.

FIG. 12A shows a preferred bladder 836 having a surface area sufficient to cover a relatively small perimeter portion of the substrate backside at a diameter substantially equal to the cathode contact ring 466. The geometric shape and size of the bladder assembly 470 can be varied. Thus, the bladder assembly may be constructed using more fluid impervious material to cover an increased surface area of the substrate 821.

Figure 19:
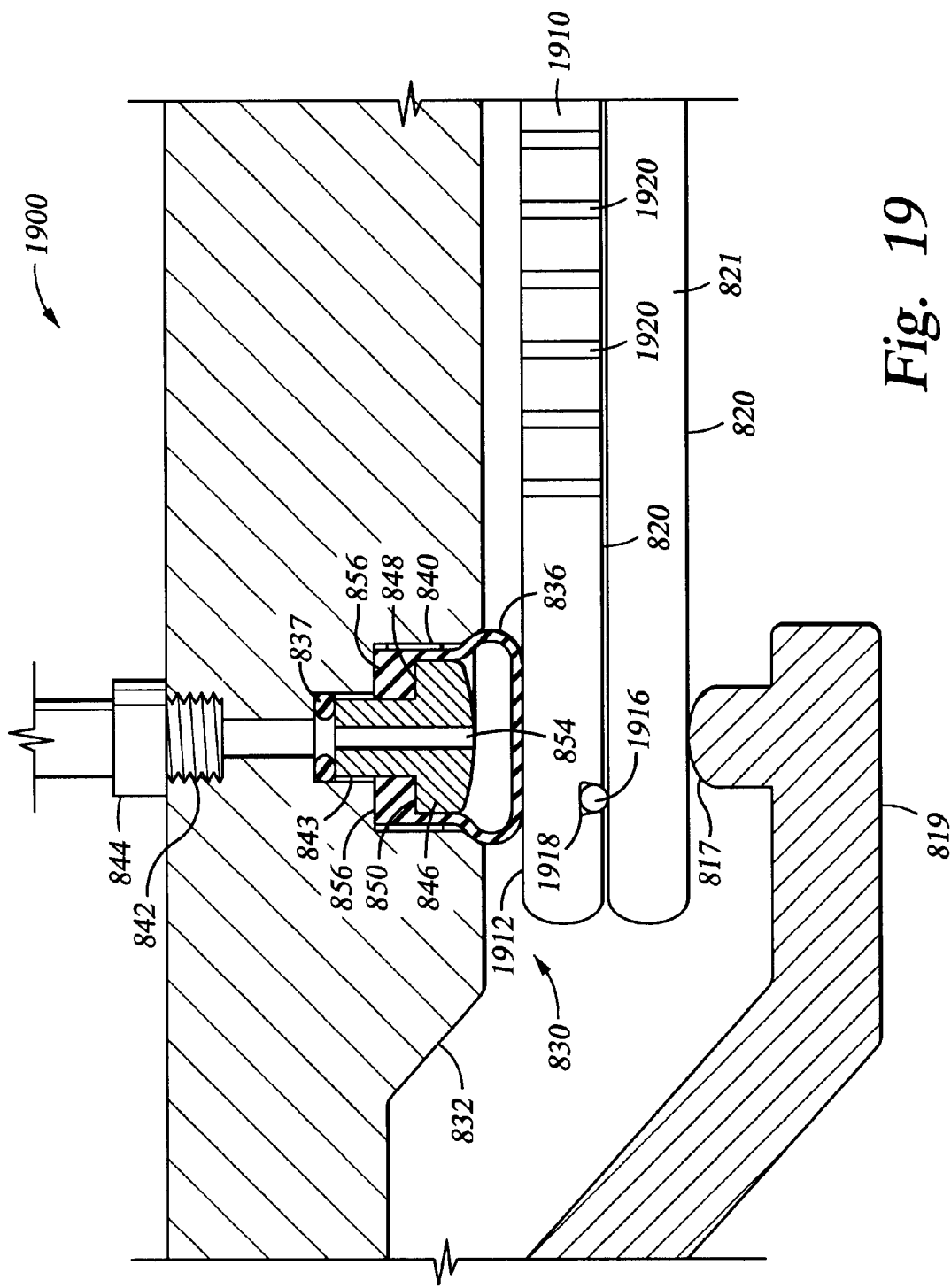
FIG. 19 is a partial cross sectional view of an alternative embodiment of a substrate holder assembly.

FIG. 19 is a partial cross sectional view of an alternative embodiment of a substrate holder assembly. The alternative substrate holder assembly 1900 comprises a bladder assembly 470, as described above, having the inflatable bladder 836 attached to the back surface of an intermediary substrate holder plate 1910. Preferably, a portion of the inflatable bladder 836 is sealingly attached to the back surface 1912 of the intermediary substrate holder plate 1910 using an adhesive or other bonding material. The front surface 1914 of the intermediary substrate holder plate 1910 is adapted to receive a substrate or wafer 821 to be processed, and an elastomeric o-ring 1916 is disposed in an annular groove 1918 on the front surface 1914 of the intermediary substrate holder plate 1910 to contact a peripheral portion of the substrate back surface. The elastomeric o-ring 1916 provides a seal between the substrate back surface and the front surface of the intermediary substrate holder plate. Preferably, the intermediary substrate holder plate includes a plurality of bores or holes 1920 extending through the plate. The plurality of bores or holes 1920 are in fluid communication with the vacuum port 841 to facilitate securing the substrate on the substrate holder using a vacuum force applied to the backside of the substrate. According to this alternative embodiment of the substrate holder assembly, the inflatable bladder does not directly contact a substrate being processed, and thus the risk of cutting or damaging the inflatable bladder during substrate transfers is significantly reduced. The elastomeric O-ring 1916 is preferably coated or treated to provide a hydrophilic surface, as discussed above for the surfaces of the cathode contact ring, for contacting the substrate. The elastomeric O-ring 1916 is replaced as needed to ensure proper contact and seal to the substrate.

Figure 25:
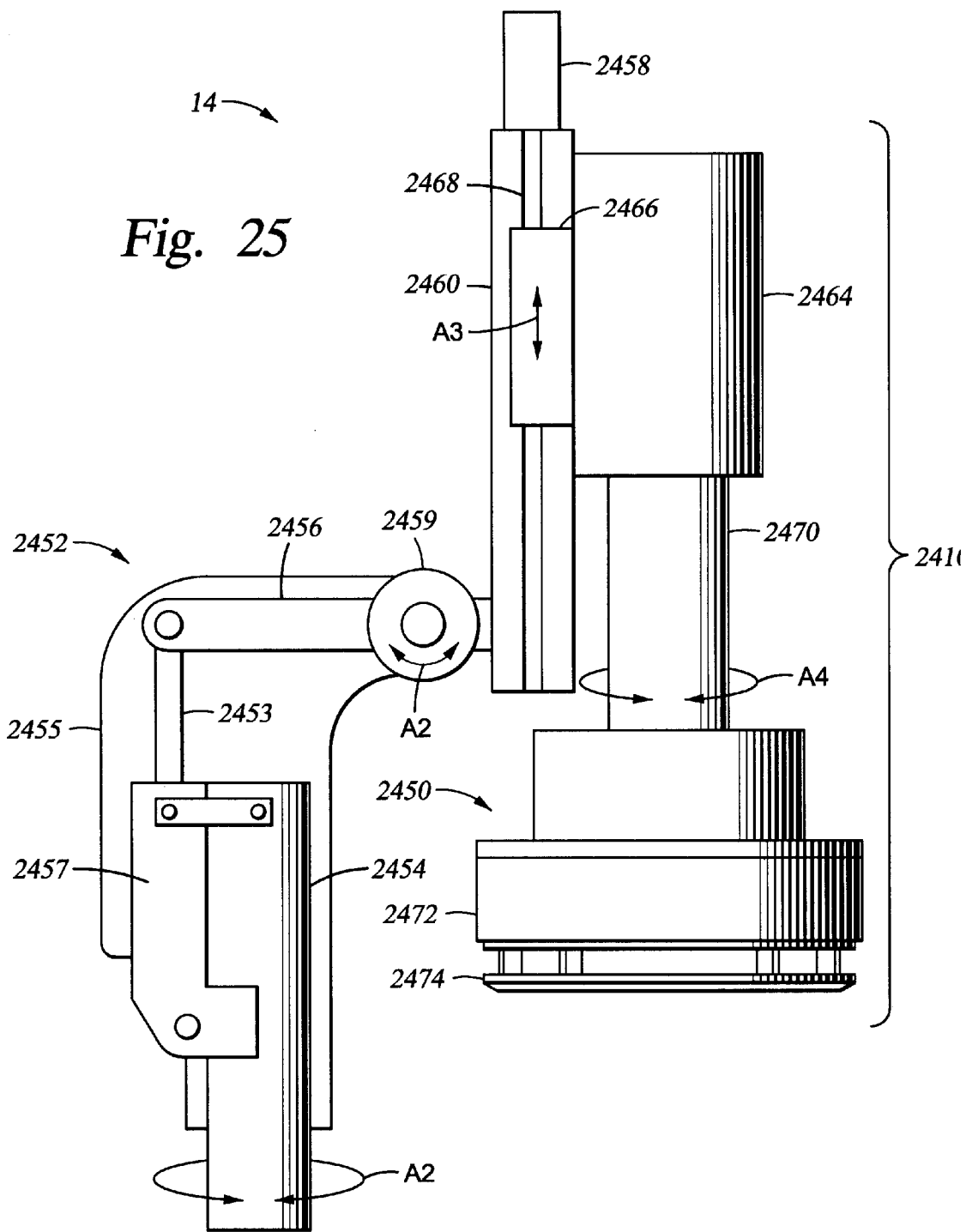
FIG. 25 is an alternative embodiment of substrate holder system having a rotatable head assembly.

FIG. 25 is an alternative embodiment of the process head assembly having a rotatable head assembly 2410. Preferably, a rotational actuator is disposed on the cantilevered arm and attached to the head assembly to rotate the head assembly during substrate processing. The rotatable head assembly 2410 is mounted onto a head assembly frame 2452. The alternative head assembly frame 2452 and the rotatable head assembly 2410 are mounted onto the mainframe similarly to the head assembly frame 452 and head assembly 410 as shown in FIG. 6 and described above. The head assembly frame 2452 includes a mounting post 2454, a post cover 2455, and a cantilever arm 2456. The mounting post 2454 is mounted onto the body of the mainframe 214, and the post cover 2455 covers a top portion of the mounting post 2454. Preferably, the mounting post 454 provides rotational movement, as indicated by arrow A1, with respect to a vertical axis along the mounting post to allow rotation of the head assembly frame 2452. The cantilever arm 2456 extends laterally from an upper portion of the mounting post 2454 and is pivotally connected to the post cover 2455 at the pivot joint 2459. The rotatable head assembly 2410 is attached to a mounting slide 2460 disposed at the distal end of the cantilever arm 2456. The mounting slide 2460 guides the vertical motion of the head assembly 2410. A head lift actuator 2458 is disposed on top of the mounting slide 2460 to provide vertical displacement of the head assembly 2410.

The lower end of the cantilever arm 2456 is connected to the shaft 2453 of a cantilever arm actuator 2457, such as a pneumatic cylinder or a lead-screw actuator, mounted on the mounting post 2454. The cantilever arm actuator 2457 provides pivotal movement, as indicated by arrow A2, of the cantilever arm 2456 with respect to the joint 2459 between the cantilever arm 2456 and the post cover 2454. To retract the cantilever arm 2456, the cantilever arm actuator 2457 moves the head assembly 2410 away from the process cell 420. This retraction of the cantilever arm 2456 provides the spacing required to remove and/or replace the process cell 420 from the electroplating process cell 240. When the cantilever arm actuator 2457 is extended, the cantilever arm 2456 moves the head assembly 2410 toward the process cell 420 to position the substrate in the head assembly 2410 in a processing position.

The rotatable head assembly 2410 includes a rotating actuator 2464 slideably connected to the mounting slide 2460. The shaft 2468 of the head lift actuator 2458 is inserted through a lift guide 2466 attached to the body of the rotating actuator 2464. Preferably, the shaft 2468 is a lead-screw type shaft that moves the lift guide, as indicated by arrows A3, between various vertical position. The rotating actuator 2464 is connected to the substrate holder assembly 2450 through the shaft 2470 and rotates the substrate holder assembly 2450, as indicated by arrows A4. The substrate holder assembly 2450 includes a bladder assembly, such as the embodiments described above with respect to FIGS. 12–15 and 19, and a cathode contact ring, such as the embodiments described above with respect to FIGS. 7–10 and 18.

The rotation of the substrate during the electroplating process generally enhances the deposition results. Preferably, the head assembly is rotated between about 2 rpm and about 20 rpm during the electroplating process. The head assembly can also be rotated as the head assembly is lowered to position the substrate in contact with the electrolyte solution in the process cell as well as when the head assembly is raised to remove the substrate from the electrolyte solution in the process cell. The head assembly is preferably rotated at a high speed, i.e., >20 rpm, after the head assembly is lifted from the process cell to enhance removal of residual electrolyte solution on the head assembly.

In one embodiment, the inventors have improved the uniformity of the deposited film to where the maximum deviation of deposited film thickness is at about 2% of the average film thickness, while standard electroplating processes typically achieves uniformity at best to about 5.5%. However, rotation of the head assembly is not necessary to achieve uniform electroplating deposition in some instances, particularly where the uniformity of electroplating deposition is achieved by adjusting the processing parameters, such as the electrolyte solution chemistry, electrolyte solution flow and other parameters.

Referring back to FIG. 6, a cross sectional view of an electroplating process cell 400, the substrate holder assembly 450 is positioned above the process cell 420. The process cell 420 generally comprises a bowl 430, a container body 472, an anode assembly 474 and a filter 476. Preferably, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, PLEXIGLAS® (acrylic), lexane, PVC, CPVC, and PVDF. Alternatively, the container body 472 can be made from a metal, such as stainless steel, nickel and titanium, which is coated with an insulating layer. The insulative layer may be as TEFLON®, PVDF, plastic, rubber and other combinations of materials that do not dissolve in the electrolyte solution and can be electrically insulated from the electrodes, i.e., the anode and cathode of the electroplating system. The container body 472 is preferably sized and adapted to conform to the substrate plating surface and the shape of the substrate being processed through the system, typically circular or rectangular. One preferred embodiment of the container body 472 comprises a cylindrical ceramic tube having an inner diameter that has about the same dimension as or slightly larger than the substrate diameter. The inventors have discovered that the rotational movement typically required in typical electroplating systems is not required to achieve uniform plating results when the size of the container body conforms to about the size of the substrate plating surface.

An upper portion of the container body 472 extends radially outwardly to form an annular weir 478. The weir 478 extends over the inner wall 446 of the electrolyte collector 440 and allows the electrolyte solution to flow into the electrolyte collector 440. The upper surface of the weir 478 preferably matches the lower surface of the cathode contact ring 466. Preferably, the upper surface of the weir 478 includes an inner annular flat portion 480, a middle inclined portion 482 and an outer declined portion 484. When a substrate is positioned in the processing position, the substrate plating surface is positioned above the cylindrical opening of the container body 472, and a gap for electrolyte solution flow is formed between the lower surface of the cathode contact ring 466 and the upper surface of the weir 478. The lower surface of the cathode contact ring 466 is disposed above the inner flat portion 480 and the middle inclined portion of the weir 478. The outer declined portion 484 is sloped downwardly to facilitate flow of the electrolyte solution into the electrolyte collector 440.

A lower portion of the container body 472 extends radially outwardly to form a lower annular flange 486 for securing the container body 472 to the bowl 430. The outer dimension, i.e., circumference, of the annular flange 486 is smaller than the dimensions of the opening 444 and the inner circumference of the electrolyte collector 440. The relative dimensions of the annular flange 486 and the opening 444 allow removal and replacement of the process cell 420 from the electroplating process cell 400. Preferably, a plurality of bolts 488 are fixedly disposed on the annular flange 486 and extend downwardly through matching bolt holes on the bowl 430. A plurality of removable fastener nuts 490 secure the process cell 420 onto the bowl 430. A seal 487, such as an elastomer O-ring, is disposed between container body 472 and the bowl 430 radially inwardly from the bolts 488 to prevent leaks from the process cell 420. The nuts/bolts combination facilitates fast and easy removal and replacement of the components of the process cell 420 during maintenance.

The filter 476 is attached to and completely covers the lower opening of the container body 472, and the anode assembly 474 is disposed below the filter 476. A spacer 492 is disposed between the filter 476 and the anode assembly 474. Preferably, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430.

The anode assembly 474 preferably comprises a consumable anode that serves as a metal source in the electrolyte solution. Alternatively, the anode assembly 474 comprises a non-consumable anode, and the metal to be electroplated is supplied within the electrolyte solution from the electrolyte replenishing system 220. As shown in FIG. 6, the anode assembly 474 is a self-enclosed module having a porous anode enclosure 494 preferably made of the same metal as the metal to be electroplated, such as copper. Alternatively, the anode enclosure 494 is made of porous materials, such as ceramics or polymeric membranes. A soluble metal 496, such as high purity copper for electro-chemical deposition of copper, is disposed within the anode enclosure 494. The soluble metal 496 preferably comprises metal particles, wires or a perforated sheet. The porous anode enclosure 494 also acts as a filter that keeps the particulates generated by the dissolving metal within the anode enclosure 494. As compared to a non-consumable anode, the consumable, i.e., soluble, anode provides gas-generation-free electrolyte solution and minimizes the need to constantly replenish the metal in the electrolyte solution.

An anode electrode contact 498 is inserted through the anode enclosure 494 to provide electrical connection to the soluble metal 496 from a controller. Preferably, the anode electrode contact 498 is made from a conductive material that is insoluble in the electrolyte solution, such as titanium, platinum and platinum-coated stainless steel. The anode electrode contact 498 extends through the bowl 430 and is connected to an electrical controller. Preferably, the anode electrical contact 498 includes a threaded portion 497 for a fastener nut 499 to secure the anode electrical contact 498 to the bowl 430, and a seal 495, such as a elastomer washer, is disposed between the fastener nut 499 and the bowl 430 to prevent leaks from the process cell 420.

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. To secure the upper annular flange 506 of the bowl 430 and the lower annular flange 486 of the container body 472, the bolts 488 are inserted through the holes 508, and the fastener nuts 490 are fastened onto the bolts 488. Preferably, the outer dimension, i.e., circumference, of the upper annular flange 506 is about the same as the outer dimension, i.e., circumference, of the lower annular flange 486.Preferably, the lower surface of the upper annular flange 506 of the bowl 430 rests on a support flange of the mainframe 214 when the process cell 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502 to force a substantial portion of the electrolyte solution to flow through the anode assembly 474 first before flowing through the filter 476. The bottom portion 504 of the bowl 430 includes an electrolyte inlet 510 that connects to an electrolyte supply line from the electrolyte replenishing system 220. Preferably, the anode assembly 474 is disposed about a middle portion of the cylindrical portion 502 of the bowl 430 to provide a gap for electrolyte flow between the anode assembly 474 and the electrolyte inlet 510 on the bottom portion 504.

The electrolyte inlet 510 and the electrolyte supply line are preferably connected by a releasable connector that facilitates easy removal and replacement of the process cell 420. When the process cell 420 needs maintenance, the electrolyte solution is drained from the process cell 420, and the electrolyte solution flow in the electrolyte supply line is discontinued and drained. The connector for the electrolyte supply line is released from the electrolyte inlet 510, and the electrical connection to the anode assembly 474 is also disconnected. The head assembly 410 is raised or rotated to provide clearance for removal of the process cell 420. The process cell 420 is then removed from the mainframe 214, and a new or reconditioned process cell is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

Figure 20:
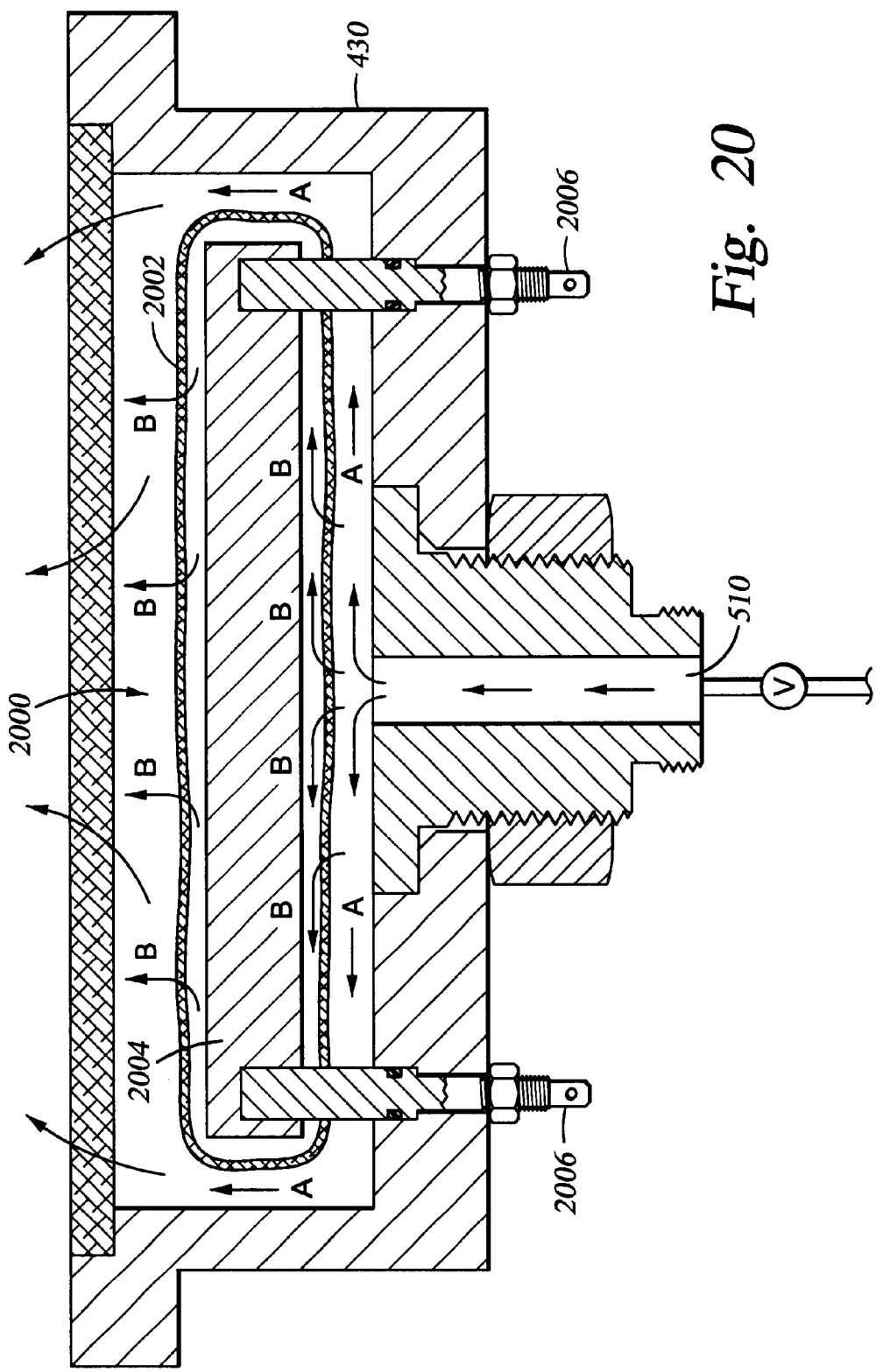
FIG. 20 is a cross sectional view of one embodiment of an encapsulated anode.

FIG. 20 is a cross sectional view of one embodiment of an encapsulated anode. The encapsulated anode 2000 includes a permeable anode enclosure that filters or traps "anode sludge" or particulates generated as the metal is dissolved from the anode plate 2004. As shown in FIG. 20, the consumable anode plate 2004 comprises a solid piece of copper, preferably, high purity, oxygen free copper, enclosed in a hydrophilic anode encapsulation membrane 2002. The anode plate 2004 is secured and supported by a plurality of electrical contacts or feed-throughs 2006 that extend through the bottom of the bowl 430. The electrical contacts or feed-throughs 2006 extend through the anode encapsulation membrane 2002 into the bottom surface of the anode plate 2004. The flow of the electrolyte solution is indicated by the arrows A from the electrolyte inlet 510 disposed at the bottom of the bowl 430 through the gap between the anode and the bowl sidewall. The electrolyte solution also flows through the anode encapsulation membrane 2002 by permeation into and out of the gap between the anode encapsulation membrane and the anode plate, as indicated by the arrows B. Preferably, the anode encapsulation membrane 2002 comprises a hydrophilic porous membrane, such as a modified polyvinyllidene fluoride membrane, having porosity between about 60% and 80%, more preferably about 70%, and pore sizes between about 0.025 cm and about 1 $\mu$m, more preferably between about 0.1 $\mu$m and about 0.2 $\mu$m. One example of a hydrophilic porous membrane is the Durapore Hydrophilic Membrane, available from Millipore Corporation, located in Bedford, Mass. As the electrolyte solution flows through the encapsulation membrane, anode sludge and particulates generated by the dissolving anode are filtered or trapped by the encapsulation membrane. Thus, the encapsulation membranes improve the purity of the electrolyte solution during the electroplating process, and defect formations on the substrate during the electroplating process caused by anode sludge and contaminant particulates are significantly reduced.

Figure 21:
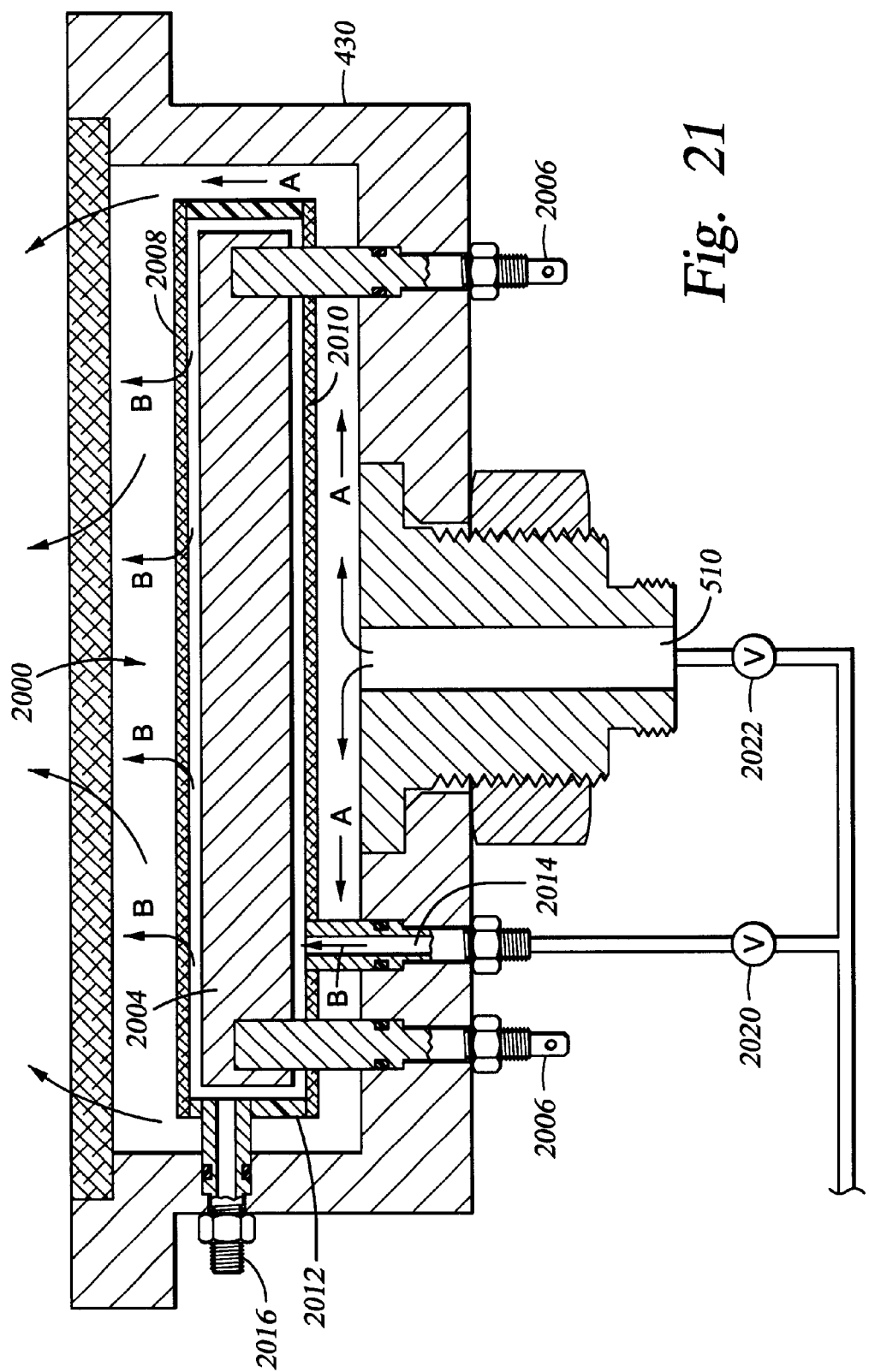
FIG. 21 is a cross sectional view of another embodiment of an encapsulated anode.

FIG. 21 is a cross sectional view of another embodiment of an encapsulated anode. Similar to the above embodiment of an encapsulated anode, the anode plate 2004 is secured and supported on the electrical feed-throughs 2006. A top encapsulation membrane 2008 and a bottom encapsulation membrane 2010, disposed respectively above and below the anode plate 2004, are attached to a membrane support ring 2012 that is disposed around the anode plate 2004. The top and bottom encapsulation membranes 2008, 2010 comprise a material from the list above for encapsulation membrane of this embodiment of the encapsulated anode. The membrane support ring 2012 preferably comprises a relatively rigid material as compared to the encapsulation membrane, such as plastic or other polymers. A bypass fluid inlet 2014 is disposed through the bottom of the bowl 430 and through the bottom encapsulation membrane 2010 to introduce electrolyte solution into the gap between the encapsulation membranes and the anode plate. A bypass outlet 2016 is connected to the membrane support ring 2012 and extends through the bowl 430 to facilitate flow of excess electrolyte solution with the anode sludge or generated particulates out of the encapsulated anode into a waste drain, not shown.

Preferably, the flow of the electrolyte solution within the bypass fluid inlet 2014 and the main electrolyte inlet 510 are individually controlled by flow control valves 2020, 2022, respectively placed along the fluid lines connected to the inlets, and the fluid pressure in the bypass fluid inlet 2014 is preferably maintained at a higher pressure than the pressure in the main electrolyte inlet 510. The flow of the electrolyte solution inside the bowl 430 from the main electrolyte inlet 510 is indicated by arrows A, and the flow of the electrolyte solution inside the encapsulated anode 2000 is indicated by the arrows B. A portion of the electrolyte solution introduced into the encapsulated anode flows out of the encapsulated anode through the bypass outlet 2016. By providing a dedicated bypass electrolyte solution supply into the encapsulated anode, the anode sludge or particulates generated from the dissolving consumable anode is continually removed from the anode, thereby improving the purity of the electrolyte solution during the electroplating process.

Figure 22:
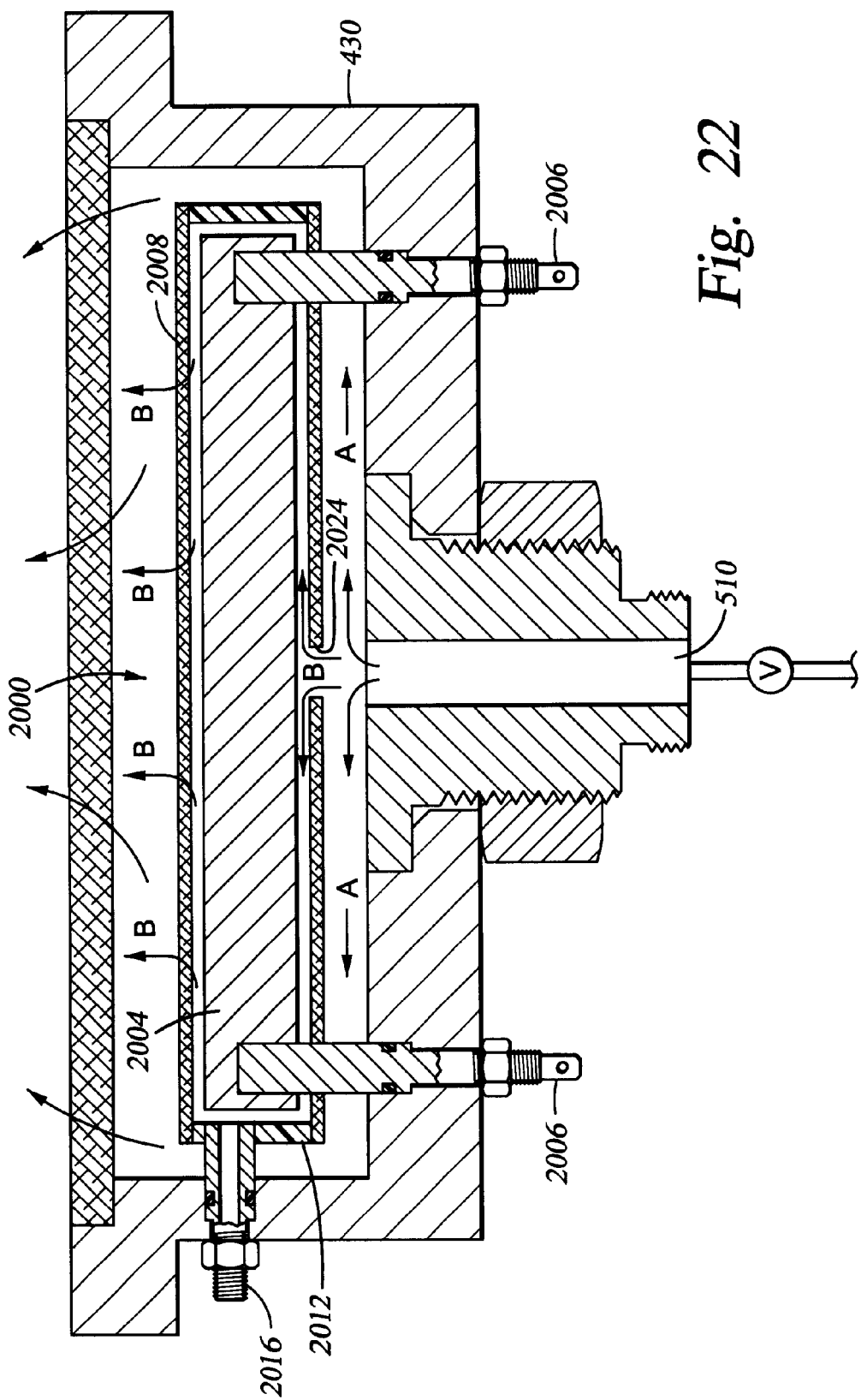
FIG. 22 is a cross sectional view of another embodiment of and encapsulated anode.

FIG. 22 is a cross sectional view of another embodiment of an encapsulated anode. This embodiment of an encapsulated anode 2000 includes an anode plate 2004, a plurality of electrical feed throught 2006, a top encapsulation membrane 2008, a bottom encapsulation membrane 2010, a membrane support ring 2012, and a bypass outlet 2016. The anode plate 2004 is secured and supported on a plurality of electrical feed-throughs 2006. The top and a bottom encapsulation membrane 2008, 2010 are attached to a membrane support ring 2012. The bypass outlet 2016 is connected to the membrane support ring 2012 and extending through the bowl 430. This embodiment of an encapsulated anode preferably comprises materials as described above for these embodiments of an encapsulated anode. The bottom encapsulation membrane 2010 according to this embodiment includes one or more openings 2024 disposed substantially above the main electrolyte inlet 510. The opening 2024 is adapted to receive flow of electrolyte solution from the main electrolyte inlet 510 and is preferably about the same size as the internal circumference of the main electrolyte inlet 510. The flow of the electrolyte solution from the main electrolyte inlet 510 is indicated by the arrows A and the flow of the electrolyte solution within the encapsulated anode is indicated by the arrows B. A portion of the electrolyte solution flows out of the encapsulated anode through the bypass outlet 2016, carrying a portion of the anode sludge and particulates generated from anode dissolution.

Figure 23:
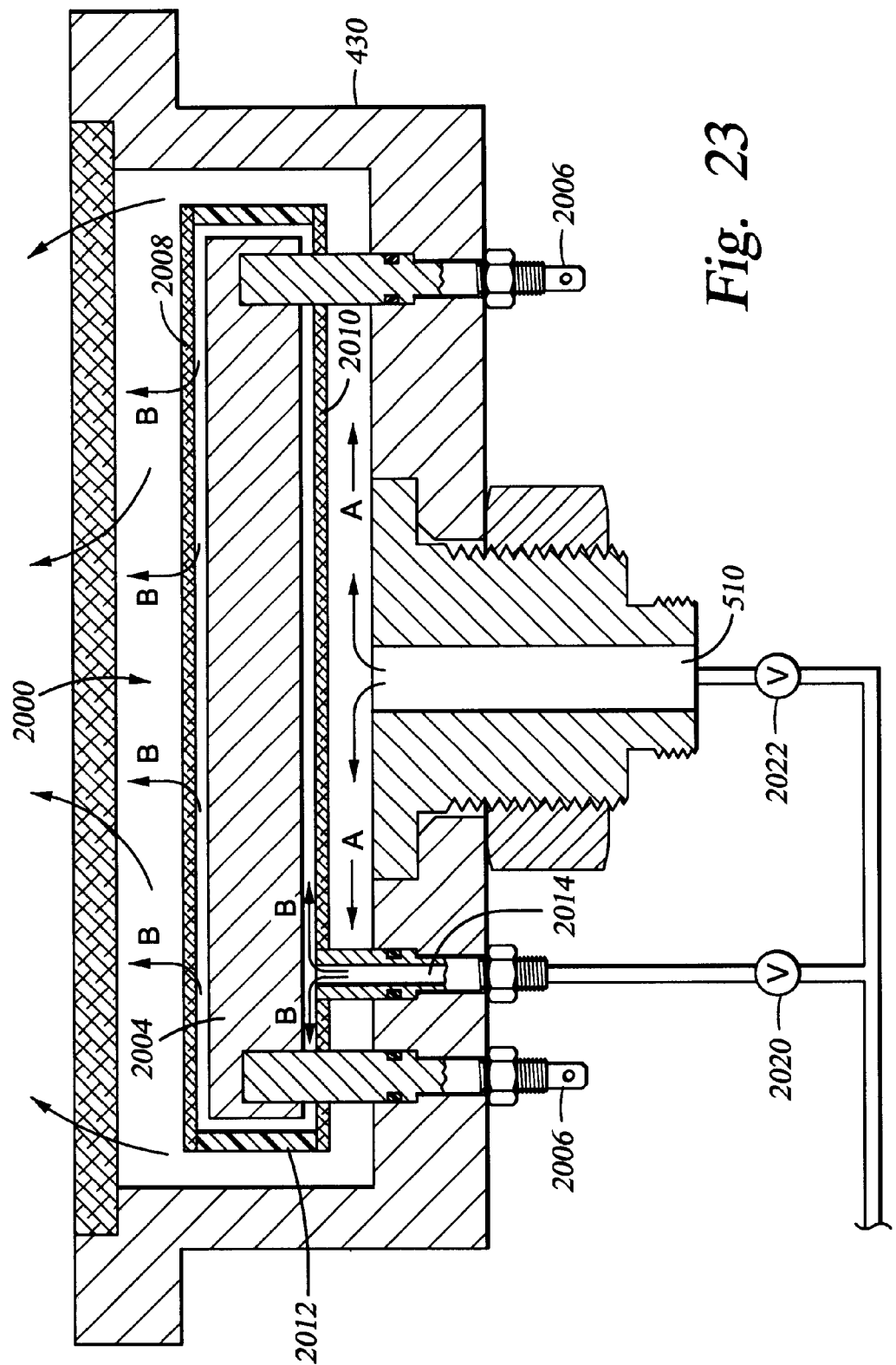
FIG. 23 is a cross sectional view of yet another embodiment of an encapsulated anode.

FIG. 23 is a cross sectional view of yet another embodiment of an encapsulated anode. This embodiment of encapsulated anode 2000 includes an anode plate 2002, a plurality of electrical feed throught 2006, a top encapsulation membrane 2008, a bottom encapsulation membrane 2010, and a membrane support ring 2012. The anode plate 2002 is secured and supported on a plurality of electrical feed-throughs 2006. The top and a bottom encapsulation membrane 2008, 2010 are attached to a membrane support ring 2012. The bypass fluid inlet 2014 is disposed through the bottom of the bowl 430 and through the bottom encapsulation membrane 2010 to introduce electrolyte solution into the gap between the encapsulation membranes and the anode plate. This embodiment of an encapsulated anode preferably comprises materials as described above for these embodiments of an encapsulated anode. Preferably, the flow of the electrolyte solution through the bypass fluid inlet 2014 and the main electrolyte inlet 510 are individually controlled by control valves 2020, 2022, respectively. The flow of the electrolyte solution from the main electrolyte inlet 510 is indicated by the arrows A while the flow of the electrolyte solution through the encapsulated anode is indicated by arrows B. For this embodiment, the anode sludge and particulates generated by the dissolving anode plate are filtered and trapped by the encapsulation membranes as the electrolyte solution passes through the membrane.

Figure 16:
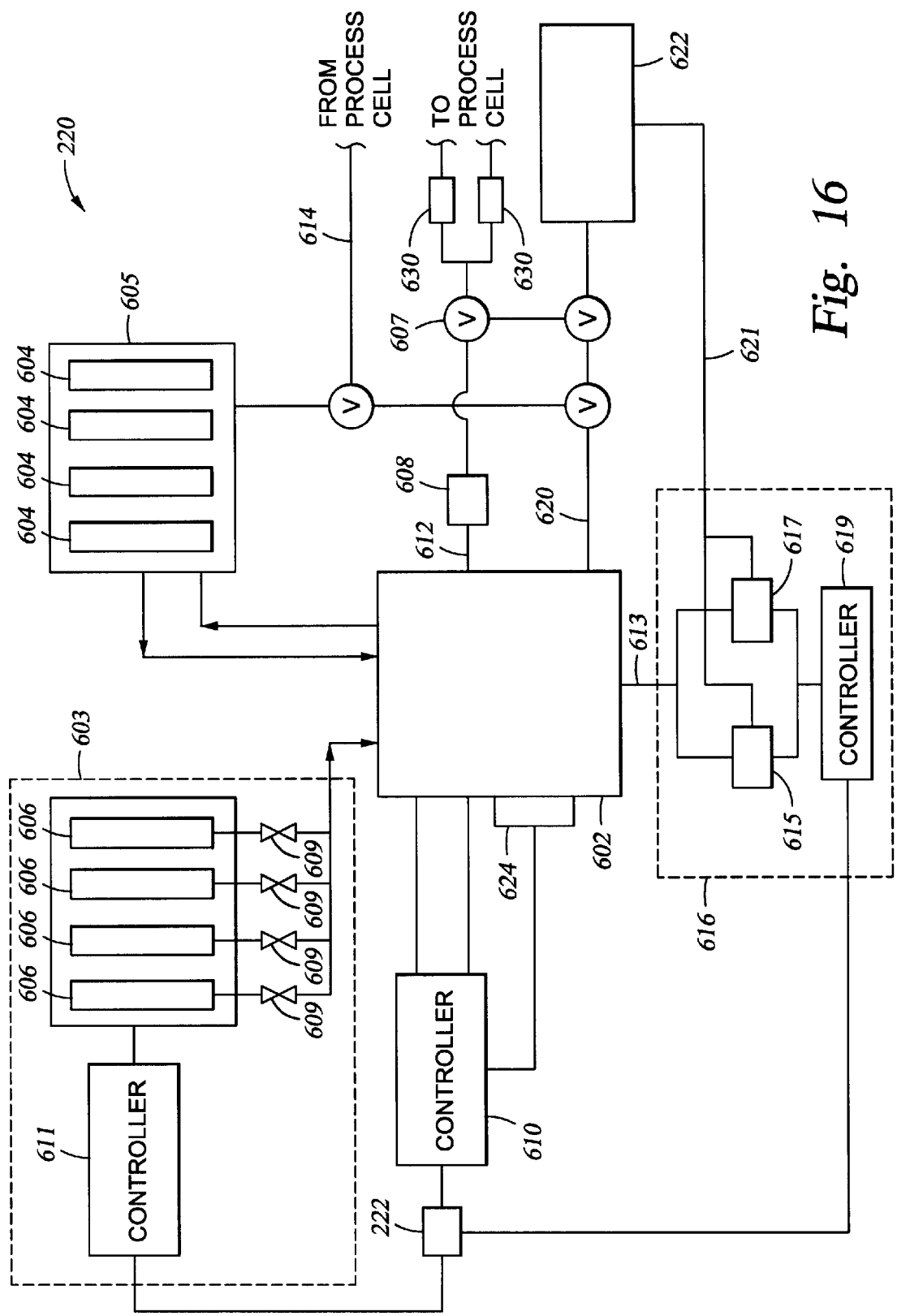
FIG. 16 is a schematic diagram of an electrolyte replenishing system.

FIG. 16 is a schematic diagram of an electrolyte replenishing system 220. The electrolyte replenishing system 220 provides the electrolyte solution to the electroplating process cells for the electroplating process. The electrolyte replenishing system 220 generally comprises a main electrolyte tank 602, a dosing module 603, a filtration module 605, a chemical analyzer module 616, and an electrolyte waste disposal system 622 connected to the analyzing module 616 by an electrolyte waste drain 620. One or more controllers control the composition of the electrolyte solution in the main tank 602 and the operation of the electrolyte replenishing system 220. Preferably, the controllers are independently operable but integrated with the controller 222 of the electroplating system platform 200.

The main electrolyte tank 602 provides a reservoir for electrolyte solution and includes an electrolyte supply line 612 that is connected to each of the electroplating process cells through one or more fluid pumps 608 and valves 607. A heat exchanger 624 or a heater/chiller disposed in thermal connection with the main tank 602 controls the temperature of the electrolyte solution stored in the main tank 602. The heat exchanger 624 is connected to and operated by the controller 610.

The dosing module 603 is connected to the main tank 602 by a supply line and includes a plurality of source tanks 606, or feed bottles, a plurality of valves 609, and a controller 611. The source tanks 606 contain the chemicals needed for composing the electrolyte solution and typically include a deionized water source tank and copper sulfate ($CuSO_4$) source tank for composing the electrolyte solution. Other source tanks 606 may contain hydrogen sulfate ($H_2SO_4$), hydrogen chloride (HCl) and various additives such as glycol. Each source tank is preferably color coded and fitted with a unique mating outlet connector adapted to connect to a matching inlet connector in the dosing module. By color coding the source tanks and fitting the source tanks with unique connectors, errors caused by human operators when exchanging or replacing the source tanks are significantly reduced.

The deionized water source tank preferably also provides deionized water to the system for cleaning the system during maintenance. The valves 609 associated with each source tank 606 regulate the flow of chemicals to the main tank 602 and may be any of numerous commercially available valves such as butterfly valves, throttle valves and the like. Activation of the valves 609 is accomplished by the controller 611 that is preferably connected to the controller 222 to receive signals therefrom.

The electrolyte filtration module 605 includes a plurality of filter tanks 604. An electrolyte return line 614 is connected between each of the process cells and one or more filter tanks 604. The filter tanks 604 remove the undesired contents in the used electrolyte solution before returning the electrolyte solution to the main tank 602 for re-use. The main tank 602 is also connected to the filter tanks 604 to facilitate re-circulation and filtration of the electrolyte solution in the main tank 602. By re-circulating the electrolyte solution from the main tank 602 through the filter tanks 604, the undesired contents in the electrolyte solution are continuously removed by the filter tanks 604 to maintain a consistent level of purity. Additionally, re-circulating the electrolyte solution between the main tank 602 and the filtration module 605 allows the various chemicals in the electrolyte solution to be thoroughly mixed.

The electrolyte replenishing system 220 also includes a chemical analyzer module 616 that provides real-time chemical analysis of the chemical composition of the electrolyte solution. The analyzer module 616 is fluidly coupled to the main tank 602 by a sample line 613 and to the waste disposal system 622 by an outlet line 621. The analyzer module 616 generally comprises at least one analyzer and a controller to operate the analyzer. The number of analyzers required for a particular processing tool depends on the composition of the electrolyte solution. For example, while a first analyzer may be used to monitor the concentrations of organic substances, a second analyzer is needed for inorganic chemicals. In the specific embodiment shown in FIG. 16 the chemical analyzer module 616 comprises an auto titration analyzer 615 and a cyclic voltametric stripper (CVS) 617. Both analyzers are commercially available from various suppliers. An auto titration analyzer which may be used to advantage is available from Parker Systems and a cyclic voltametric stripper is available from ECI. The auto titration analyzer 615 determines the concentrations of inorganic substances such as copper chloride and acid. The CVS 617 determines the concentrations of organic substances such as the various additives which may be used in the electrolyte solution and by-products resulting from the processing which are returned to the main tank 602 from the process cells.

The analyzer module shown FIG. 16 is merely illustrative. In another embodiment each analyzer may be coupled to the main electrolyte tank by a separate supply line and be operated by separate controllers. Persons skilled in the art will recognize other embodiments.

In operation, a sample of electrolyte solution is flowed to the analyzer module 616 via the sample line 613. Although the sample may be taken periodically, preferably a continuous flow of electrolyte solution is maintained to the analyzer module 616. A portion of the sample is delivered to the auto titration analyzer 615 and a portion is delivered to the CVS 617 for the appropriate analysis. The controller 619 initiates command signals to operate the analyzers 615, 617 in order to generate data. The information from the chemical analyzers 615, 617 is then communicated to the controller 222. The controller 222 processes the information and transmits signals which include user-defined chemical dosage parameters to the dosing controller 611. The received information is used to provide real-time adjustments to the source chemical replenishment rates by operating one or more of the valves 609 thereby maintaining a desired, and preferably constant, chemical composition of the electrolyte solution throughout the electroplating process. The waste electrolyte solution from the analyzer module is then flowed to the waste disposal system 622 via the outlet line 621.

Although a preferred embodiment utilizes real-time monitoring and adjustments of the electrolyte solution, various alternatives may be employed. For example, the dosing module 603 may be controlled manually by an operator observing the output values provided by the chemical analyzer module 616. Preferably, the system software allows for both an automatic real-time adjustment mode as well as an operator (manual) mode. Further, although multiple controllers are shown in FIG. 16, a single controller may be used to operate various components of the system such as the chemical analyzer module 616, the dosing module 603, and the heat exchanger 624. Other embodiments will be apparent to those skilled in the art.

The electrolyte replenishing system 220 also includes an electrolyte waste drain 620 connected to an electrolyte waste disposal system 622 for safe disposal of used electrolyte solution, chemicals and other fluids used in the electroplating system. Preferably, the electroplating cells include a direct line connection to the electrolyte waste drain 620 or the electrolyte waste disposal system 622 to drain the electroplating cells without returning the electrolyte solution through the electrolyte replenishing system 220. The electrolyte replenishing system 220 preferably also includes a bleed off connection to bleed off excess electrolyte solution to the electrolyte waste drain 620.

Preferably, the electrolyte replenishing system 220 also includes one or more degasser modules 630 adapted to remove undesirable gases from the electrolyte solution. The degasser module generally comprises a membrane that separates gases from the fluid passing through the degasser module and a vacuum system for removing the released gases. The degasser modules 630 are preferably placed in line on the electrolyte supply line 612 adjacent to the process cells 240. The degasser modules 630 are preferably positioned as close as possible to the process cells 240 so that most of the gases from the electrolyte replenishing system are removed by the degasser modules before the electrolyte solution enters the process cells. Preferably, each degasser module 630 includes two outlets to supply degassed electrolyte solution to the two process cells 240 of each processing station 218. Alternatively, a degasser module 630 is provided for each process cell. The degasser modules can be placed at many other alternative positions. For example, the degasser module can be placed at other positions in the electrolyte replenishing system, such as along with the filter section or in a closed-loop system with the main tank or with the processing cell. As another example, one degasser module is placed in line with the electrolyte supply line 612 to provide degassed electrolyte solution to all of the process cells 240 of the electrochemical deposition system. Additionally, a separate degasser module is positioned in-line or in a closed-loop with the deionized water supply line and is dedicated for removing oxygen from the deionized water source. Because deionized water is used to rinse the processed substrates, free oxygen gases are preferable removed from the deionized water before reaching the SRD modules 236 so that the electroplated copper is less likely to become oxidized by the rinsing process. Degasser modules are well known in the art and commercial embodiments are generally available and adaptable for use in a variety of applications. A commercially available degasser module is available from Millipore Corporation, located in Bedford, Mass.

Figure 26A:
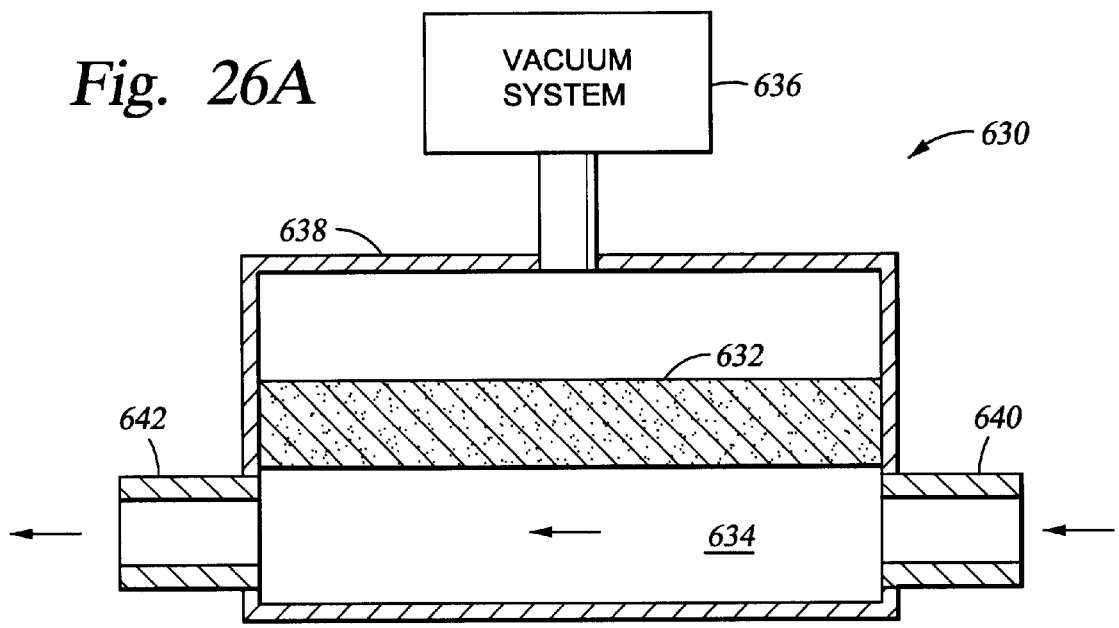
FIGS. 26a and 26b are cross sectional views of embodiments of a degasser module.
Figure 26B:
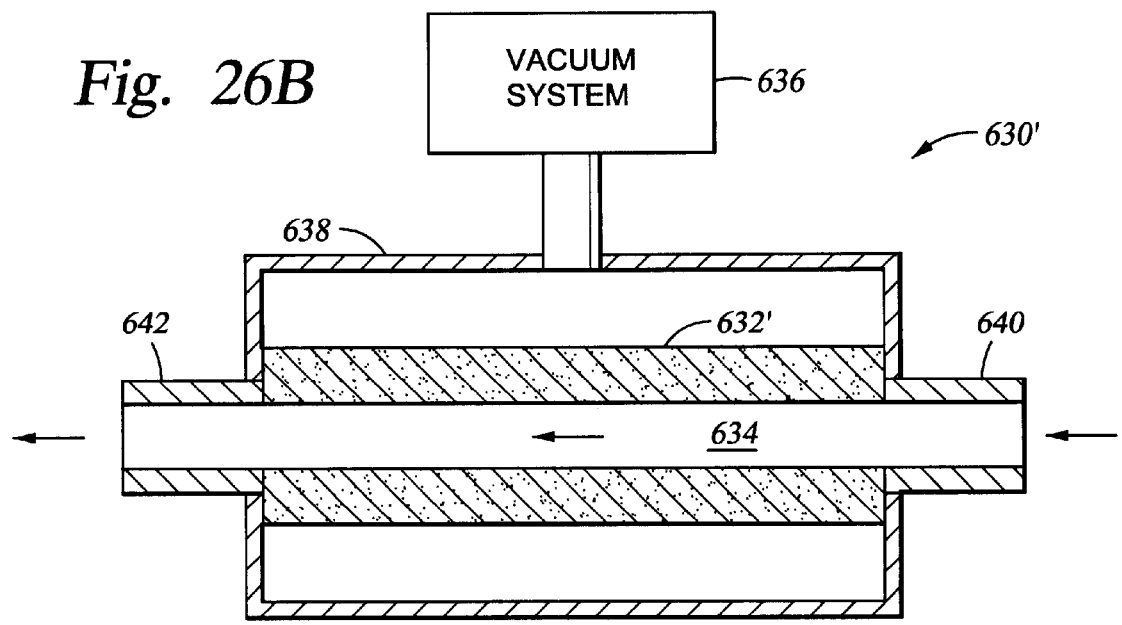

One embodiment of the degasser module 630, as shown in FIG. 26a, includes a hydrophobic membrane 632 having a fluid, i.e., electrolyte solution, passage 634 on one side of the membrane 632 and a vacuum system 636 disposed on the opposite side of the membrane. The enclosure 638 of the degasser module includes an inlet 640 and one or more outlets 642. As the electrolyte solution passes through the degasser module 630, the gases and other micro-bubbles in the electrolyte solution are separated from the electrolyte solution through the hydrophobic membrane and removed by the vacuum system. Another embodiment of the degasser module 630', as shown in FIG. 26b, includes a tube of hydrophobic membrane 632' and a vacuum system 636 disposed around the tube of hydrophobic membrane 632'. The electrolyte solution is introduced inside the tube of hydrophobic membrane, and as the electrolyte solution passes through the fluid passage 634 in the tube, gases and other micro-bubbles in the electrolyte solution are separated from the electrolyte solution through the tube of hydrophobic membrane 632' and removed by the vacuum system 636 surrounding the tube. More complex designs of degasser modules are contemplated among the different embodiments, including designs having serpentine paths of the electrolyte solution across the membrane and other multi-sectioned designs of degasser modules.

Although not shown in FIG. 16, the electrolyte replenishing system 220 may include a number of other components. For example, the electrolyte replenishing system 220 preferably also includes one or more additional tanks for storage of chemicals for a substrate cleaning system, such as the SRD station. Double-contained piping for hazardous material connections may also be employed to provide safe transport of the chemicals throughout the system. Optionally, the electrolyte replenishing system 220 includes connections to additional or external electrolyte processing system to provide additional electrolyte solution supplies to the electroplating system.

Figure 17:
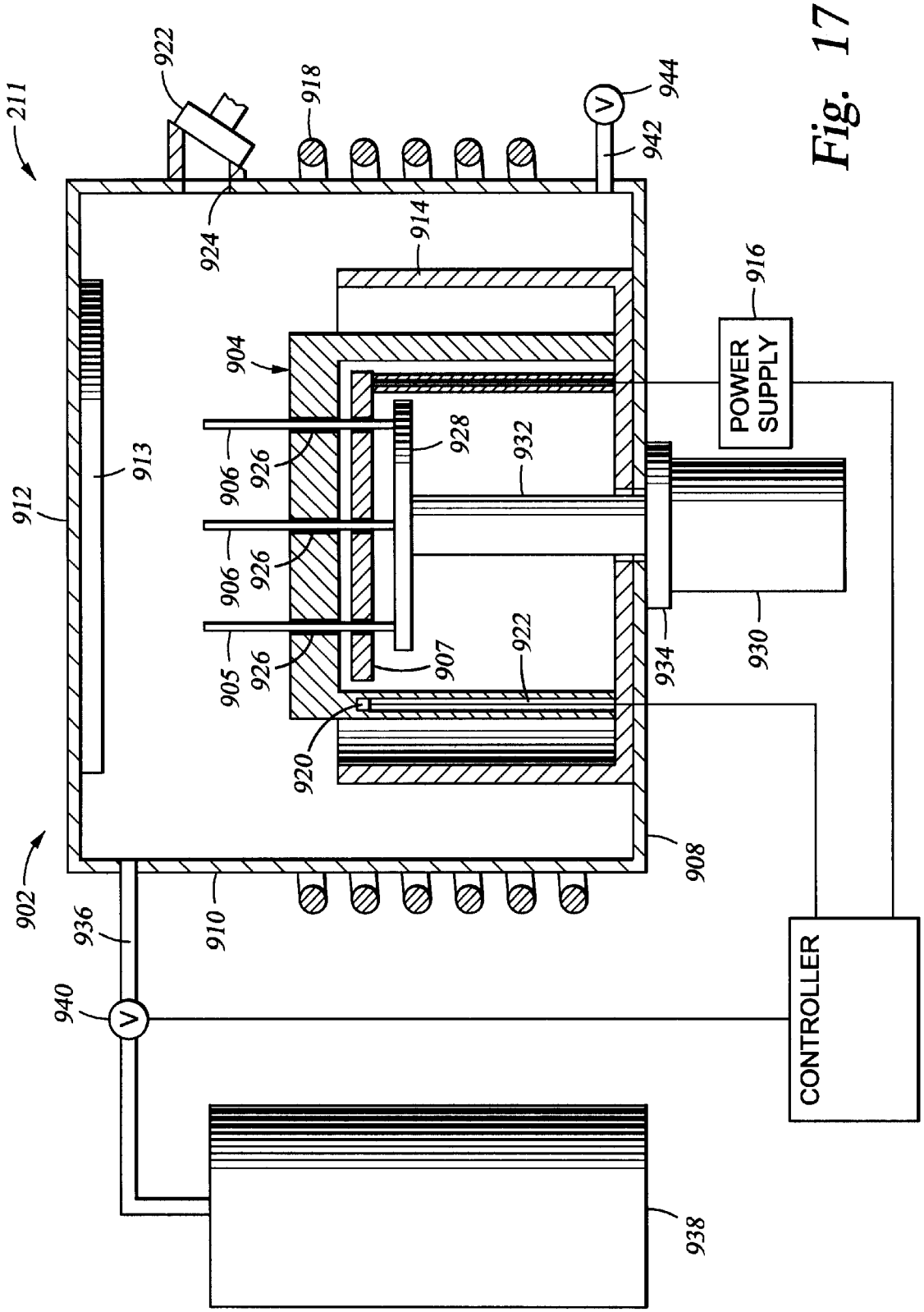
FIG. 17 is a cross sectional view of a rapid thermal anneal cell.

FIG. 17 is a cross sectional view of one embodiment of a rapid thermal anneal cell. The rapid thermal anneal (RTA) cell 211 is preferably connected to the loading station 210, and substrates are transferred into and out of the RTA cell 211 by the loading station transfer robot 228. The electroplating system, as shown in FIGS. 2 and 3, preferably comprises two RTA cells 211 disposed on opposing sides of the loading station 210, corresponding to the symmetric design of the loading station 210. RTA cells are generally well known in the art, and rapid thermal anneal cells are typically utilized in substrate processing systems to enhance the properties of the deposited materials. A variety of thermal anneal cell designs, including hot plate designs and heat lamp designs, may be used to enhance the electroplating results. One particular RTA cell is the WxZ chamber available from Applied materials, Inc., located in Santa Clara, Calif. Although the described embodiment uses a hot plate RTA cell, other thermal anneal cells can be used as well.

The RTA cell 211 generally comprises an enclosure 902, a heater plate 904, a heater 907 and a plurality of substrate support pins 906. The enclosure 902 includes a base 908, a sidewall 910 and a top 912. Preferably, a cold plate 913 is disposed below the top 912 of the enclosure. Alternatively, the cold plate is integrally formed as part of the top 912 of the enclosure. Preferably, a reflector insulator dish 914 is disposed inside the enclosure 902 on the base 908. The reflector insulator dish 914 is typically made from a material such as quartz, alumina, or other material that can withstand high temperatures, i.e., greater than about 500° C., and act as a thermal insulator between the heater 907 and the enclosure 902. The dish 914 may also be coated with a reflective material, such as gold, to direct heat back to the heater plate 906.

The heater plate 904 preferably has a large mass compared to the substrate being processed in the system and is preferably fabricated from a material such as silicon carbide, quartz, or other materials that do not react with any ambient gases in the RTA cell 211 or with the substrate material. The heater 907 typically comprises a resistive heating element or a conductive/radiant heat source and is disposed between the heated plate 906 and the reflector insulator dish 914. The heater 907 is connected to a power source 916 which supplies the energy needed to heat the heater 907. Preferably, a thermocouple 920 is disposed in a conduit 922, disposed through the base 908 and dish 914, and extends into the heater plate 904. The thermocouple 920 is connected to a controller, i.e., the controller described below, and supplies temperature measurements to the controller. The controller then increases or decreases the heat supplied by the heater 907 according to the temperature measurements and the desired anneal temperature.

The enclosure 902 preferably includes a cooling member 918 disposed outside of the enclosure 902 in thermal contact with the sidewall 910 to cool the enclosure 902. Alternatively, one or more cooling channels, not shown, are formed within the sidewall 910 to control the temperature of the enclosure 902. The cold plate 913 disposed on the inside surface of the top 912 cools a substrate that is positioned in close proximity to the cold plate 913.

The RTA cell 211 includes a slit valve 922 disposed on the sidewall 910 of the enclosure 902 for facilitating transfers of substrates into and out of the RTA cell. The slit valve 922 selectively seals an opening 924 on the sidewall 910 of the enclosure that communicates with the loading station 210. The loading station transfer robot 228, shown in the embodiment of FIG. 2, transfers substrates into and out of the RTA cell through the opening 924.

The substrate support pins 906 preferably comprise distally tapered members constructed from quartz, aluminum oxide, silicon carbide, or other high temperature resistant materials. Each substrate support pin 906 is disposed within a tubular conduit 926, preferably made of a heat and oxidation resistant material, that extends through the heater plate 904. The substrate support pins 906 are connected to a lift plate 928 for moving the substrate support pins 906 in a uniform manner. The lift plate 928 is attached to an to an actuator 930, such as a stepper motor, through a lift shaft 932 that moves the lift plate 928 to facilitate positioning of a substrate at various vertical positions within the RTA cell. The lift shaft 932 extends through the base 908 of the enclosure 902 and is sealed by a sealing flange 934 disposed around the shaft.

To transfer a substrate into the RTA cell 211, the slit valve 922 is opened, and the loading station transfer robot 228 extends its robot blade having a substrate positioned thereon through the opening 924 into the RTA cell. The robot blade of the loading station transfer robot 228 positions the substrate in the RTA cell above the heater plate 904, and the substrate support pins 906 are extended upwards to lift the substrate above the robot blade. The robot blade then retracts out of the RTA cell, and the slit valve 922 closes the opening. The substrate support pins 906 are then retracted to lower the substrate to a desired distance from the heater plate 904. Optionally, the substrate support pins 906 may retract fully to place the substrate in direct contact with the heater plate.

Preferably, a gas inlet 936 is disposed through the sidewall 910 of the enclosure 902 to allow selected gas flow into the RTA cell 211 during the anneal treatment process. The gas inlet 936 is connected to a gas source 938 through a valve 940 for controlling the flow of the gas into the RTA cell 211. A gas outlet 942 is preferably disposed at a lower portion of the sidewall 910 of the enclosure 902 to .exhaust the gases in the RTA cell and is preferably connected to a relief/check valve 944 to prevent backstreaming of atmosphere from outside of the cell. Optionally, the gas outlet 942 is connected to a vacuum pump, not shown, to exhaust the RTA cell to a desired vacuum level during an anneal treatment.

A substrate is annealed in the RTA cell 211 after the substrate has been electroplated in the electroplating cell and cleaned in the SRD station. Preferably, the RTA cell 211 is maintained at about atmospheric pressure, and the oxygen content inside the RTA cell 211 is controlled to less than about 100 ppm during the anneal treatment process. Preferably, the ambient environment inside the RTA cell 211 comprises nitrogen ($N_2$) or a combination of nitrogen ($N_2$) and less than about 4% hydrogen ($H_2$), and the ambient gas flow into the RTA cell 211 is maintained at greater than 20 liters/min to control the oxygen content to less than 100 ppm. The electroplated substrate is preferably annealed at a temperature between about 200° C. and about 450° C. for between about 30 seconds and 30 minutes, and more preferably, between about 250° C. and about 400° C. for between about 1 minute and 5 minutes. Rapid thermal anneal processing typically requires a temperature increase of at least 50° C. per second. To provide the required rate of temperature increase for the substrate during the anneal treatment, the heater plate is preferably maintained at between about 350° C. and about 450° C., and the substrate is preferably positioned at between about 0 mm, i e., contacting the heater plate, and about 20 mm from the heater plate for the duration of the anneal treatment process. Preferably, a controller 222 controls the operation of the RTA cell 211, including maintaining the desired ambient environment in the RTA cell and the temperature of the heater plate.

After the anneal treatment process is completed, the substrate support pins 906 lift the substrate to a position for transfer out of the RTA cell 211. The slit valve 922 opens, and the robot blade of the loading station transfer robot 228 is extended into the RTA cell and positioned below the substrate. The substrate support pins 906 retract to lower the substrate onto the robot blade, and the robot blade then retracts out of the RTA cell. The loading station transfer robot 228 then transfers the processed substrate into the cassette 232 for removal out of the electroplating processing system, see FIGS. 2 and 3.

Referring back to FIG. 2, the electroplating system platform 200 includes a controller 222 that controls the functions of each component of the platform. Preferably, the controller 222 is mounted above the mainframe 214 and comprises a programmable microprocessor. The programmable microprocessor is typically programmed using a software designed specifically for controlling all components of the electroplating system platform 200. The controller 222 also provides electrical power to the components of the system and includes a control panel 223 that allows an operator to monitor and operate the electroplating system platform 200. The control panel 223, as shown in FIG. 2, is a stand-alone module that is connected to the controller 222 through a cable and provides easy access to an operator. Generally, the controller 222 coordinates the operations of the loading station 210, the RTA cell 211, the SRD station 212, the mainframe 214 and the processing stations 218. Additionally, the controller 222 coordinates with the controller of the electrolyte replenishing system 220 to provide the electrolyte solution for the electroplating process.

The following is a description of a typical substrate electroplating process sequence through the electroplating system platform 200 as shown in FIG. 2. A substrate cassette containing a plurality of substrates is loaded into the substrate cassette receiving areas 224 in the loading station 210 of the electroplating system platform 200. A loading station transfer robot 228 picks up a substrate from a substrate slot in the substrate cassette and places the substrate in the substrate orientor 230. The substrate orientor 230 determines and orients the substrate to a desired orientation for processing through the system. The loading station transfer robot 228 then transfers the oriented substrate from the substrate orientor 230 and positions the substrate in one of the substrate slots in the substrate pass-through cassette 236 in the SRD station 212. The mainframe transfer robot 242 picks up the substrate from the substrate pass-through cassette 238 and positions the substrate for transfer by the flipper robot 248. The flipper robot 248 rotates its robot blade below the substrate and picks up substrate from mainframe transfer robot blade. The vacuum suction gripper on the flipper robot blade secures the substrate on the flipper robot blade, and the flipper robot flips the substrate from a face up position to a face down position. The flipper robot 248 rotates and positions the substrate face down in the substrate holder assembly 450. The substrate is positioned below the substrate holder element 464 but above the cathode contact ring 466. The flipper robot 248 then releases the substrate to position the substrate into the cathode contact ring 466. The substrate holder element 464 moves toward the substrate and the vacuum chuck secures the substrate on the substrate holder element 464. The bladder assembly 470 on the substrate holder assembly 450 exerts pressure against the substrate backside to ensure electrical contact between the substrate plating surface and the cathode contact ring 466.

The head assembly 452 is lowered to a processing position above the process cell 420. At this position the substrate is below the upper plane of the weir 478 and contacts the electrolyte solution contained in the process cell 420. The controller is activated to supply electrical power, i.e., voltage and current, to the cathode and the anode to enable the electroplating process. The electrolyte solution is typically continually pumped into the process cell during the electroplating process. The electrical power supplied to the cathode and the anode and the flow of the electrolyte solution are controlled by the controller 222 to achieve the desired electroplating results. Preferably, the head assembly is rotated as the head assembly is lowered and also during the electroplating process.

After the electroplating process is completed, the head assembly 410 raises the substrate holder assembly and removes the substrate from the electrolyte solution. Preferably, the head assembly is rotated for a period of time to enhance removal of residual electrolyte solution from the substrate holder assembly. The vacuum chuck and the bladder assembly of the substrate holder then release the substrate from the substrate holder, and the substrate holder is raised to allow the flipper robot blade to pick up the processed substrate from the cathode contact ring. The flipper robot rotates the flipper robot blade above the backside of the processed substrate in the cathode contact ring and picks up the substrate using the vacuum suction gripper on the flipper robot blade. The flipper robot rotates the flipper robot blade with the substrate out of the substrate holder assembly, flips the substrate from a face-down position to a faceup position, and positions the substrate on the mainframe transfer robot blade. The mainframe transfer robot then transfers and positions the processed substrate above the SRD module 236. The SRD substrate support lifts the substrate, and the mainframe transfer robot blade retracts away from the SRD module 236. The substrate is cleaned in the SRD module 236 using deionized water or a combination of deionized water and a cleaning fluid as described in detail above. The substrate is then positioned for transfer out of the SRD module 236. The loading station transfer robot 228 picks up the substrate from the SRD module 236 and transfers the processed substrate into the RTA cell 211 for an anneal treatment process to enhance the properties of the deposited materials. The annealed substrate is then transferred out of the RTA cell 211 by the loading station robot 228 and placed back into the substrate cassette for removal from the electroplating system. The above-described sequence can be carried out for a plurality of substrates substantially simultaneously in the electroplating system platform 200. Also, the electroplating system can be adapted to provide multi-stack substrate processing.

2. Multiple Blade Robot Structure and Cell Interaction of Multiple Blade Robots The multiple blade robot 2702 may be applied to a cluster tool 2700 in which some of the process cells perform electroplating, as described most particularly with reference to FIGS. 2, 3, 6, and 25. However, it is envisioned that the cluster tool may perform a variety of processes such as chemical vapor deposition (CVD) and/or physical vapor deposition (PVD).

Figure 27:
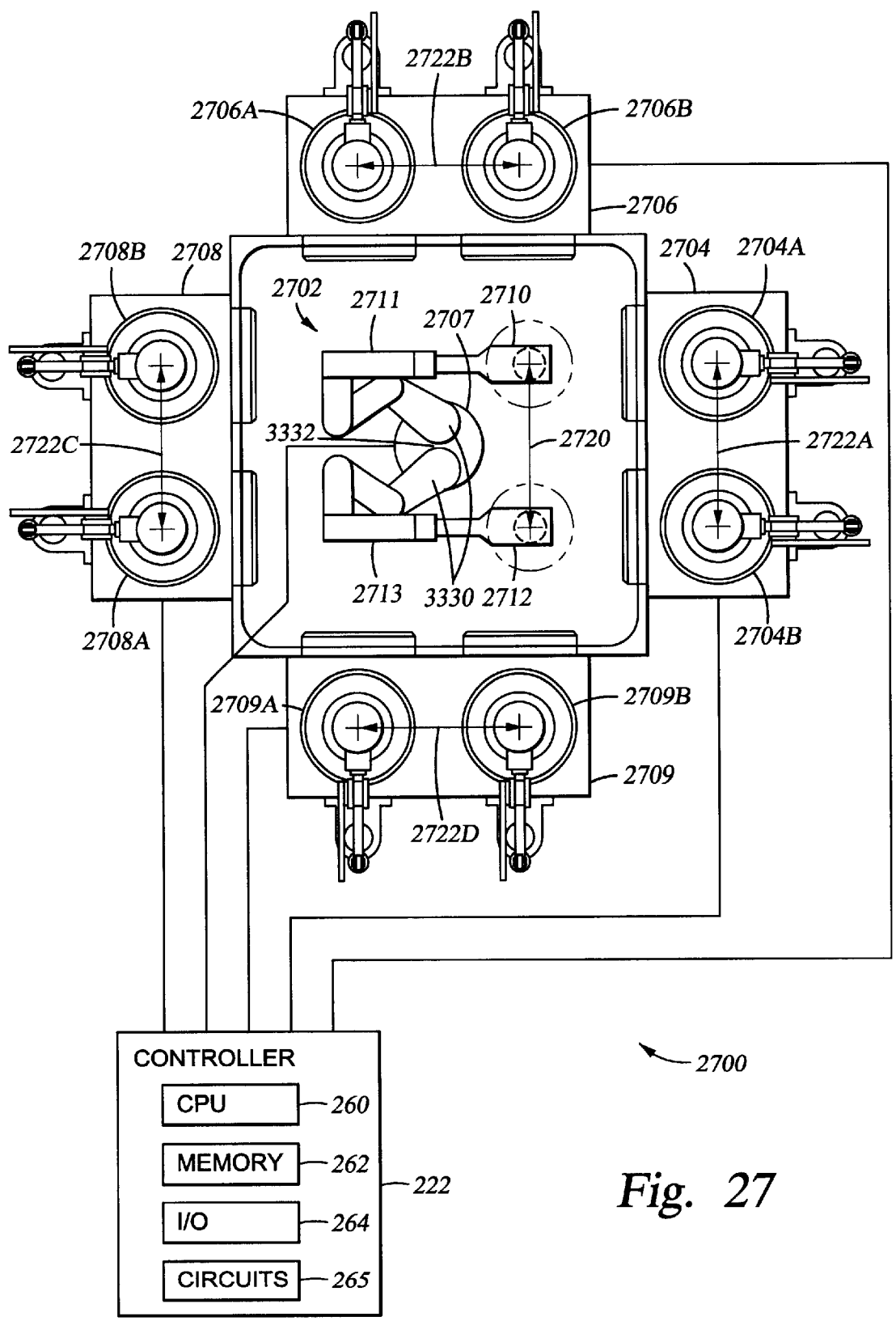
FIG. 27 is a top view of one embodiment of a cluster tool including a multiple blade robot.

FIG. 27 shows a cluster tool 2700 comprising a multiple blade robot 2702 and a plurality of cell pair units 2704, 2706, 2708, and 2709. The cell pair unit 2704 comprises individual cells 2704a and 2704b. The pair of cells 2706 comprises individual cells 2706a and 2706b. The pair of cells 2708 comprises individual cells 2708a and 2708b. The pair of cells 2709 comprises individual cells 2709a and 2709b. The multiple blade robot 2702 comprises a robot hub 2707, two robot arms 2711 and 2713, and two robot blades 2710 and 2712. A robot blade is considered any end effector, robot blade, chuck mount, or other device that can be displaced by a robot and supports a substrate. Robot blade 2712 of the multiple blade robot 2702 is configured to interact with cells 2704a, 2706a, 2708a, or 2709a concurrently as robot blade 2710 interacts with the respective cell 2704b, 2706b, 2708b, or 2709b. The robot hub 2707 is a rotary mount about which each of the robot arms 2711 and 2713 are extendably mounted. Though the embodiment of cluster tool 2700 in FIG. 27 is shown with four cell pairs 2704, 2706, 2708, and 2709, it is envisioned that one of the cell pairs is a so-called "IN"station such as the SRD station 212 shown in FIG. 3, in which substrates can be inserted into, or removed from, the cluster tool 2700.

The robot arms 2711 and 2713 are configured to extend or retract the horizontal distance that each one of the respective robot blades 2710 and 2712 are located from the robot hub 2707. The extension of the robot arms 2711 and 2713 relative to the robot hub 2707 in combination with the rotation of the multiple blade robot 2702 acts to position a pair of substrates supported by the robot blades 2710 and 2712 into one of the plurality of cell pair units 2704, 2706, 2708, or 2709. The retraction of the robot arm 2711 or 2713 relative to the robot hub 2707 acts to retract a pair of substrates supported by respective robot blades 2710 and 2712 from within one of the plurality of cell pair units 2704, 2706, 2708, or 2709. Often, a plurality of multiple blade robots are provided in a single cluster tool.

With multiple blade robots, the motion of one of the robot blades is often constrained by the motion of another robot blade. For example, if multiple robot blades are connected to a single robot hub, then rotation of the hub to rotate one robot through a prescribed angle will also rotate all other arms attached to the same robot hub. This type of constrained motion between multiple robot blades is referred to as "constrained robot motion."

Some motion of one blade of a multiple blade robot can occur independently of the motion of other blades of the multiple blade robot. For example, different robot blades attached to the same robot hub can typically extend independently. This type of independent motion between multiple robot blades is referred to as "independent robot motion."

For a robot to load substrates into, or remove substrates from, a process cell, a robot blade spacing 2720 that separates the two robot blades 2710 and 2712 has to be made equal to the respective cell spacings 2722a, 2722b, 2722c, or 2722d that separates each cell of the respective cell pair units 2704, 2706, 2708, or 2709. The cell spacing 2722a, 2722b, 2722c, and 2722d between respective cell pair units 2704, 2706, 2708, or 2709 may vary with other cell pair units in the same cluster tool by up to about a quarter of an inch due to imprecise mounting of cells, thermal expansion of the cells or the mountings, etc. During metal deposition processes, substrate holder systems 14, including a head portion, are used to immerse the substrate seed layer into the electrolyte solution. Prior to and after the immersion of the substrates, the multiple blade robot 2702 typically loads substrates into, or removes substrates from, the substrates holder systems associated with the respective cell pair units 2704, 2706, 2708, or 2709. In certain other semiconductor processes, the robot loads substrates directly onto pedestals associated with the robot blade.

In one embodiment, the cluster tool 2700 is a part of the electroplating system platform 200 shown in FIGS. 2 and 3. Accordingly, the cell pair unit 2704 is configured as the SRD station 212. An integrated bevel clean (IBC) station is also provided in combination with the SRD unit. The individual cells of the cell pair units 2706, 2708, and 2709 are configured as electroplating process cells 240.

During operation the pairs of substrates are transferred to one of the cell pair units 2706, 2708, or 2709 for electroplating. The pairs of substrates are then transferred to the SRD unit 2704 and/or the IBC unit to clean the surface of the substrate by rinsing the surface of the substrate with a rinsing liquid, or etch undesired deposits from the seed layer on the substrate by applying an etchant to the substrate. To process the substrates during electroplating, the pairs of substrates are alternately transferred into the SRD station 2704 and one of the cell pair units 2706, 2708, and 2709. Though the cluster tool 2700 is described in one embodiment as an electroplating system platform as shown in FIGS. 2 and 3, different processes such as physical vapor deposition or chemical vapor deposition may be performed in the cluster tool 2700.

Figure 33:
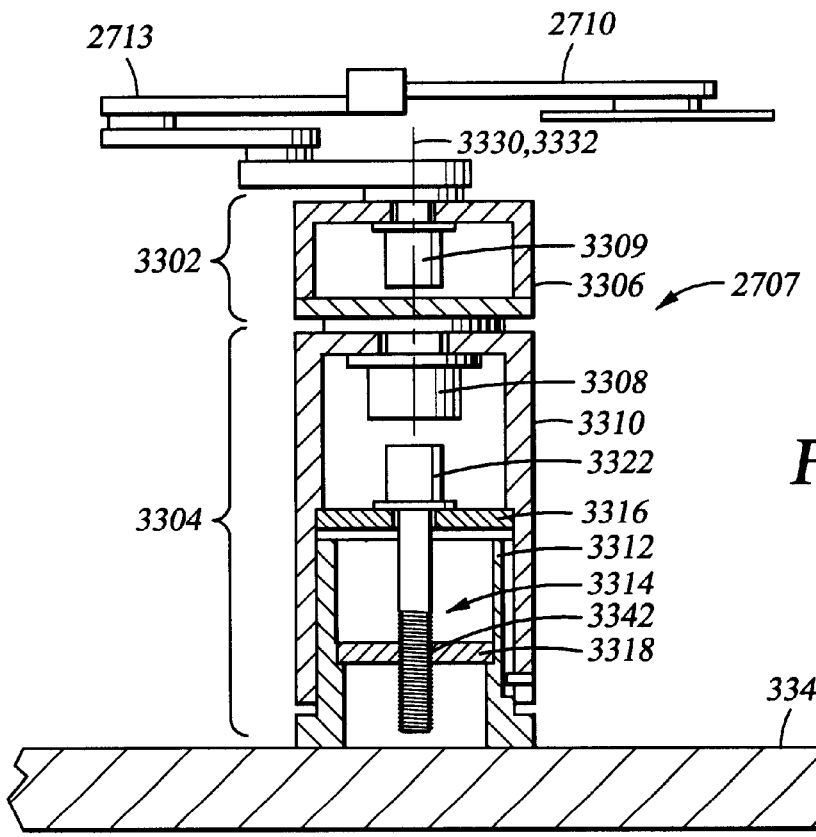
FIG. 33 is a side cross sectional view of the multiple blade robot of FIG. 27.
Figure 34:
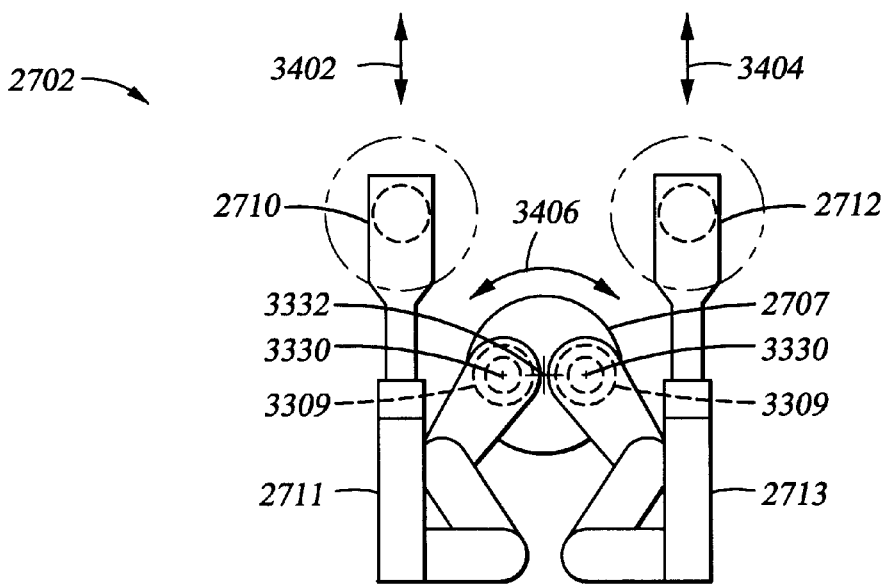
FIG. 34 is a top view of the multiple blade robot of FIG. 27.

One embodiment of the multiple blade robot 2702 is shown in greater detail in FIGS. 33 and 34. The X-Y stage can be applied to other embodiments of robots. The robot hub 2707 comprises a rotary drive member 3302 and a vertical drive member 3304. The rotary drive member 3302 comprises a robot arm mount 3306, a mount rotary drive 3308, and individual robot arm rotary drive.3309 for each robot arm 2711, 2713. The vertical drive member 3304 comprises a first vertical drive housing 3310, a second vertical drive housing 3312, and a vertical drive actuator 3314. The vertical drive actuator 3314 comprises a first vertical actuator mount 3316, a second vertical actuator mount 3318, a vertical motive element 3320 such as a lead screw, and a vertical motive element actuator 3322. The vertical motive element actuator may be any suitable motive element that can displace the vertical motive element 3320 to change the spacing between the first vertical actuator mount 3316 and the second vertical actuator mount 3318, such as a linear motor or a servo motor.

Each robot arm rotary drive 3309 operates to extend one robot arm 2711 or 2713 relative to an vertical axis shown as 3330. The mount rotary drive 3308 can rotate the robot arm mount 3306 about the vertical axis 3332. As the robot arm mount 3306 is rotated by actuation of the mount rotary drive 3308, the upper portions of the robot hub 2707 including the respective robot arm 2711 and 2713, all rotate as a unit about vertical axis 3330. Actuation of one individual robot arm rotary drive 3309 rotates the corresponding robot arm 2711 or 2713 about axis 3330 to extend that robot arm as shown in the embodiment in FIG. 27. The mount rotary drive 3308 and the individual robot arm rotary drive 3309 are each a rotary motor, a stepper motor, a servo motor, or any type of motor that can rotationally actuate the associated member.

The vertical drive member 3304 vertically adjusts the robot arms 2711 and 2713 in tandem relative to the robot floor 3340. Such vertical adjustment is also known as Z-axis adjustment. The second vertical drive housing is mounted to the robot floor 3340. To provide Z axis adjustment, the first vertical drive housing 3310 is slid vertically telescopes relative to the second vertical drive housing 3312. Vertical guides, not shown, are provided between the first vertical drive housing 3310 and the second vertical drive housing 3312 to limit relative rotation about a vertical axis between the two housings 3310 and 3312, while allowing vertical travel therebetween. The first vertical actuator mount 3316 is rigidly secured to the first vertical drive housing 3310. The second vertical actuator mount 3318 is rigidly secured to the second vertical drive housing 3312. The lead screw shown as one embodiment of the vertical motive element 3320 is threaded at a threaded joint 3342 to the second vertical actuator mount 3318. The vertical motive element actuator 3322 actuates the vertical motive element 3320, such as by rotating the lead screw, to vertically displace the first vertical actuator mount 3316 relative to the second vertical actuator mount 3318. This vertical displacement also vertically displaces the first vertical drive housing 3310 relative to the second vertical drive housing 3312, and thereby raises or lowers the robot blade 2710 in the Z-direction.

The robot arms 2711 and 2713 of the multiple blade robot 2702, as shown in FIG. 34, display both constrained and independent motions. The robot blade 2710 can be extended/retracted by the robot arm 2711 in a direction indicated by arrow 3402 independently of the robot blade 2712 being extended/retracted by the robot arm 2713 in a direction as indicated by arrow 3404. The extension of each robot arm 2711 and 2713 is provided by one distinct individual robot arm rotary drive 3309.

In one embodiment, the rotation of the robot hub 2707 about vertical axis 3332 through any angle indicated by arrow 3406 provides a rotation of both robot arms 2711 and 2713, and both robot blades 2710 and 2712, through an identical angle about vertical axis 3330. Each robot arm 2711, 2713 can be rotated relative to the robot hub 2707 about axis 3330 to provide extension/retraction of that robot arm. If the robot hub 2707 is rotated ninety degrees clockwise about vertical axis 3332 for example, then both robot arms 2711 and 2713 will be rotated ninety degrees clockwise about vertical axis 3332. Such rotation of the robot arms 2711, 2713 and the robot hub 2707 is provided by the mount rotary drive 3308. The rotations of the two robot arms 2711 and 2713, and the robot blades 2710 and 2712, relative to each other about vertical axis 3332 are thereby constrained to rotations through identical angles since each robot arm 2711, 2713 is attached to the same robot hub.

The vertical (or Z-axis) adjustment of the two robot arms 2711, and 2713, and the two attached robot blades 2710 and 2712, represent relative constrained motions since both robot arms 2711 and 2713 are mounted to the same robot arm mount 3306 on the robot hub 2707. In this embodiment, there is no independent vertical adjustment of either robot arm 2711 or 2713 relative to the robot arm mount 3306.

There are two constrained motions of the robot blades 2710 and 2712. These constrained motions are the Z-axis travel and the rotation of robot hub 2707. The robot arms 2711 and 2713 in this embodiment are provided with only one independent motion, the extension of each robot arm as indicated by arrows 3402 and 3404. When there are two constrained degrees of motion for multiple robot arms with only one independent degree of motion, the robot arms 2711 and 2713, and the robot blades 2710 and 2712 are not adjusted accurately independently. In this embodiment, only one of the two robot arms can be finely adjusted without use of the X-Y stage.

Figure 28:
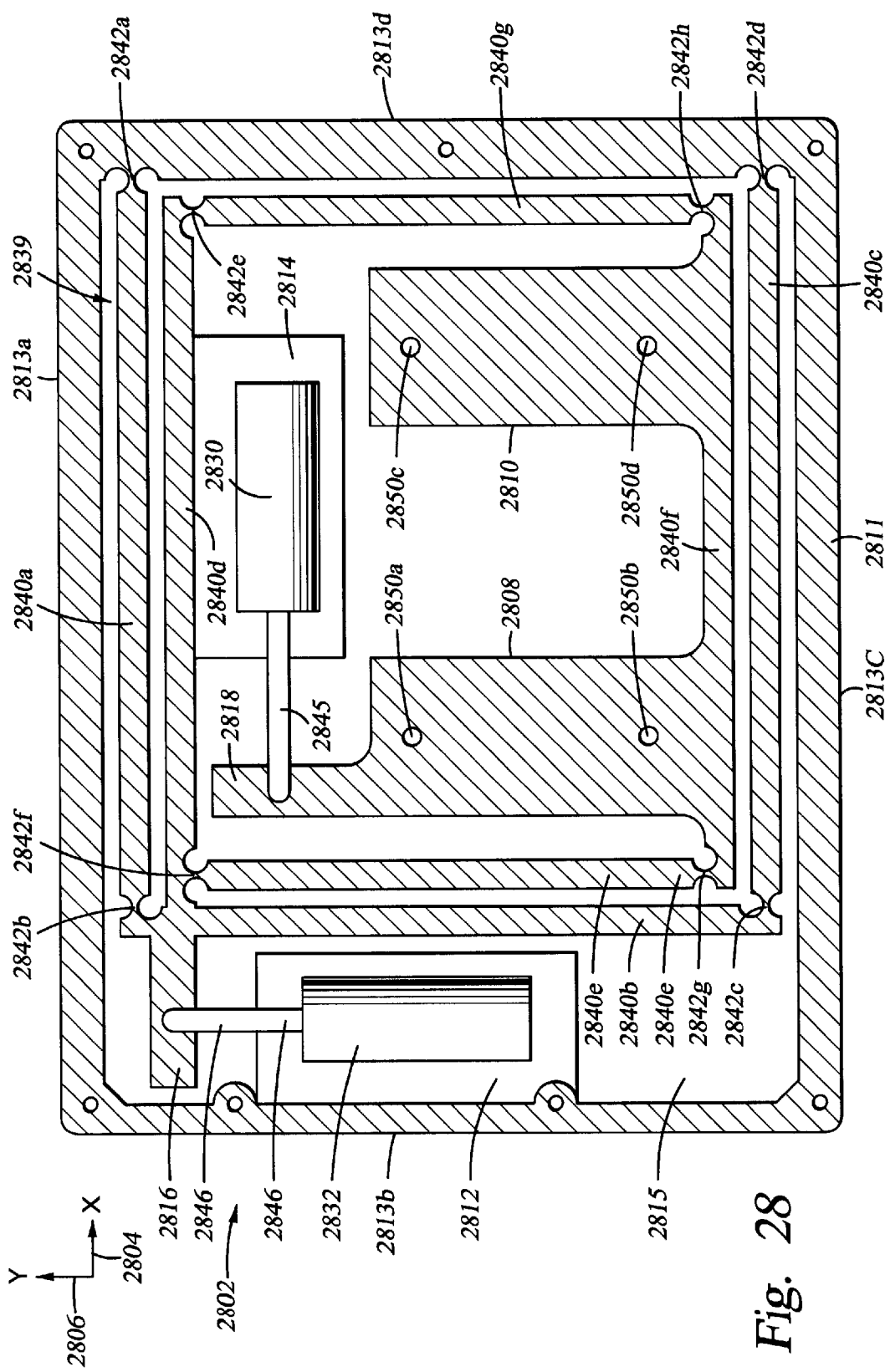
FIG. 28 is a plan view of one embodiment of an X-Y stage.
Figure 29:
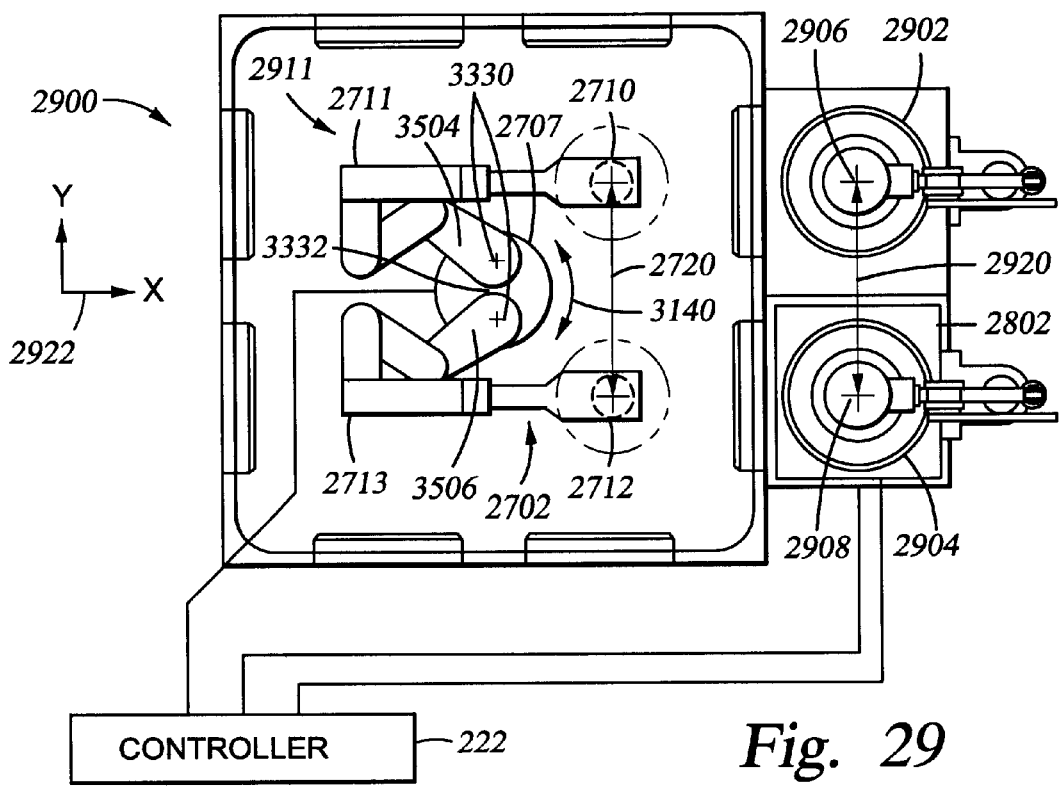
FIG. 29 is a top view of a substrate holder system connected to a cell including the X-Y stage of FIG. 28.
Figure 30:
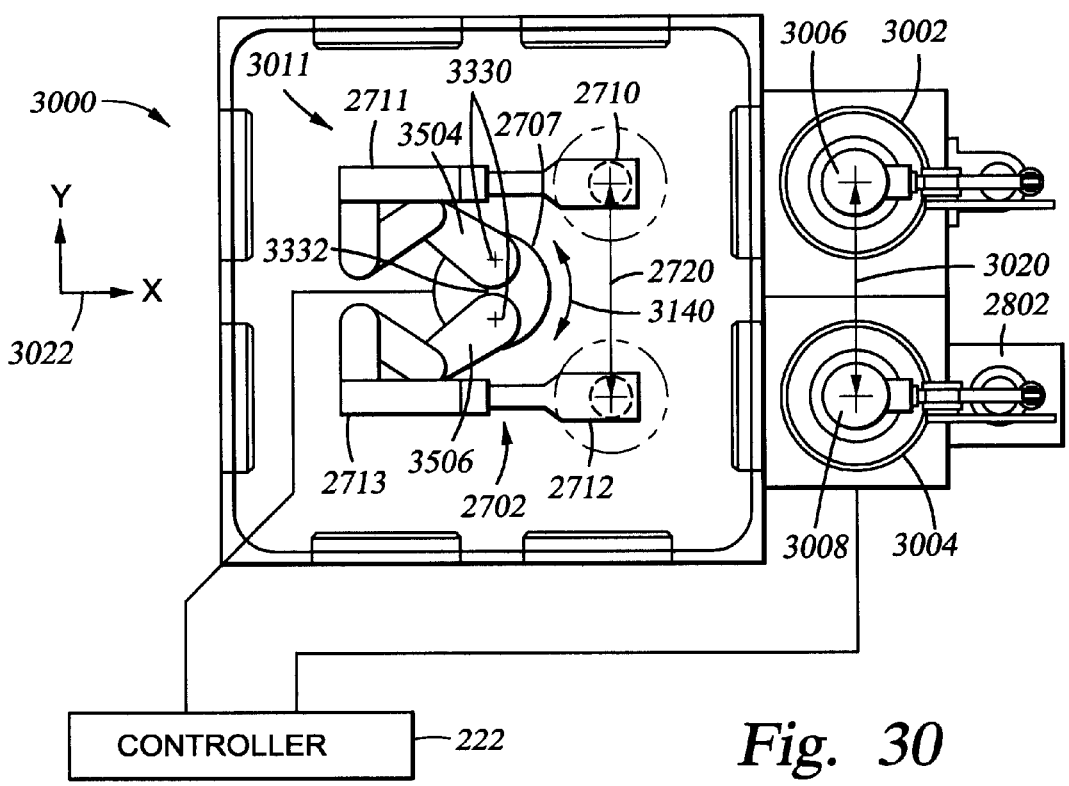
FIG. 30 is a top view of a multiple blade robot including the X-Y stage of FIG. 28.
Figure 31:
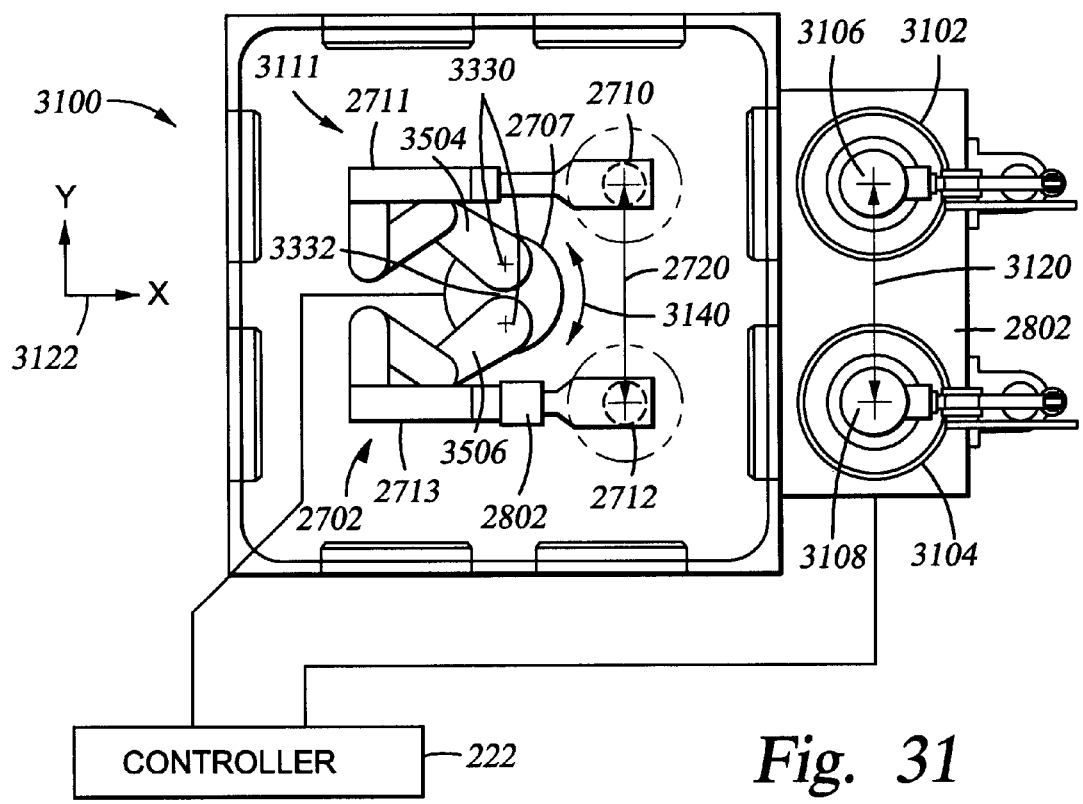
FIG. 31 is a top view of a plurality of process cells, one of which includes the X-Y stage of FIG. 28.

An X-Y stage, as now described, provides for relative displacement of one object relative to another. A top elevational view of one embodiment of the X-Y stage 2802 shown in FIG. 28 is provided for fine alignment between multiple robot arms/robot blades, between multiple process cells, or between multiple substrate holders. The X-Y stage can be positioned in a variety of locations as indicated in FIGS. 29, 30, and 31. The X-Y stage 2802 can be applied to cluster tools performing a variety of processes including, but not limited to, electroplating, CVD, PVD, etc.

The cell spacing 2722a, 2722b, 2722c, and 2722d between the cells in each cell pair unit 2704, 2706, 2708, or 2709 may be taken between the cells themselves, or between the substrate holders of the cells depending upon where the substrate is being loaded into each cell. The X-Y stage 2802 provides fine alignment to make the cell spacing 2722a, 2722b, 2722c, and 2722d between the respective pairs of cells equal to the robot blade spacing 2720. Thus, the X-Y stage compensates for differences between the cell spacing and the robot blade spacing. The fine alignment by the X-Y stage occurs before, and during interaction of, the multiple blade robot 2702 with the cells in a particular cell pair unit 2704, 2706, 2708, and 2709.

The X-Y stage 2802 includes a circumferential mount 2811, a flexure segment 2839, a first mounting surface 2808, a second mounting surface 2810, an X-direction platform 2814, a Y-direction platform 2812, an X-direction driver 2830, and a Y-direction driver 2832. The circumferential mount 2811 includes mount members 2813a, 2813b, 2813c, and 2813d and backplate 2815. The backplate 2815 extends between the mount members 2813a, 2813b, 2813c, and 2813d to form a tray-like object. The backplate 2815 provides structural rigidity to the circumferential mount 2811. The flexure segment 2839 is positioned within, and can be laterally displaced relative to, the tray-like circumferential mount 2811. The backplate 2815, by physical contact, also limits sections of the flexure segment 2839 from being displaced too far in the negative-Z-direction.

The flexure segment 2839 comprises elongated flexure members 2840a to 2840g and flexure joints 2842a to 2842h. The X-direction driver 2830 is rigidly attached to the X-direction platform 2814. The Y-direction driver 2832 is rigidly attached to the Y-direction platform 2812. Y-direction coordinate axis is indicated as arrow 2806, and X-direction coordinate axis is indicated as arrow 2804. The X-Y stage 2802 provides controllable motion of the flexure segment 2839 relative to the circumferential mount 2811 in the X-direction and in the Y-direction. In the embodiment shown in FIG. 28, the flexibility of the flexure segment 2839 is provided by the reduced cross sectional area of the flexure joints 2842a to 2842h that are smaller than the cross sectional area of the elongated flexure members 2840a to 2840g. The amount of displacement from the flexure segment 2839 in either the X-direction or the Y-direction relative to the circumferential mount 2811 is typically smaller than a quarter of an inch due to the selected material, cross-section, and spring constant of the combined elongated flexure members 2840a to 2840g and flexure joints 2842a to 2842h. The necessary deformation of each flexure joint to provide this flexibility, is also relatively small. Each flexure joint 2842b, 2842c, 2842e, 2842f, 2842g, and 2842h secures a pair of elongated flexure members together. Each flexure joint 2842a and 2842d connects a respective elongated flexure member 2840a and 2840c to mount member 2813d. In another embodiment, the flexure joints could instead be formed as a distinct resilient member, in place of the integrated flexure joints 2842a to 2842h that is connected either the respective elongated flexure member 2840 or the mount member 2813d), at both ends.

Elongated flexure members 2840d, 2840e, 2840f, and 2840g connect the X-direction platform 2814 to both the first mounting surface 2808 and the second mounting surface 2810. Elongated flexure member 2840d is attached to elongated flexure member 2840e by flexure joint 2842f. Elongated flexure member 2840e is connected to elongated flexure member 2840f by flexure joint 2842g. Elongated flexure member 2840f is connected to elongated flexure member 2840g by flexure joint 2842h. Elongated flexure member 2840g is connected to elongated flexure member 2840d by flexure joint 2842e. This configuration of elongated flexure members connected by flexure joints provides a flexible parallelogram configuration between the X-direction driver 2830 and the first mounting surface 2808 or the second mounting surface 2810.

Y-direction platform 2812 is connected to the first mounting surface 2808 and the second mounting surface 2810 by elongated flexure members 2840a to 2840g. Elongated flexure member 2840a is attached to elongated flexure member 2840b by flexure joint 2842b. Elongated flexure member 2840b is connected to elongated flexure member 2840c by flexure joint 2842c. These elongated flexure members connected by flexure joints provides a flexible parallelogram configuration that provides deflection of the mounting surfaces 2808, 2810 relative to the Y-direction platform 2812 in the Y-direction.

Holes 2850a, 2850b, 2850c, and 2850d are formed in the first mounting surface 2808 and the second mounting surface 2810. Fasteners such as screws, bolts, rivets, etc. extend through holes 2850a, 2850b, 2850c, and 2850d to provide fastening of an object to both the first mounting surface 2808 and/or the second mounting surface 2810. Alternatively, welds, adhesives, or other known fasteners may be used to fasten an object to the first mounting surface 2808 and the second mounting surface 2810.

An X-direction driver 2830 and a Y-direction driver 2832, that are connected to the X-Y stage 2802, provide respective deflections in the X-direction 2804 and the Y-direction 2806. In one embodiment, either one of the X-direction driver 2830 or the Y-direction driver 2832 may include a piezoelectric driver that is configured to provide fine displacements or high frequency oscillations to the X-Y stage respectively in the X-direction or in the Y-direction to the X-Y stage. The oscillatory motions provide more options for a range of motion than a driver that is capable of only displacement. The X-direction driver 2830 includes a piston 2845 that acts against the X-direction bias element 2818. Actuating the piston 2845 of the X-direction driver 2830 flexes and displaces the X-direction bias element 2818 of the flexure segment 2839 in the X-direction 2804 relative to the circumferential mount 2811. Displacing the X-direction bias element 2818 results in displacement of an object secured between the first mounting surface 2808 and the second mounting surface 2810 in the X-direction shown by arrow 2804.

The Y-direction driver 2832 is rigidly connected to the Y-direction platform 2812. The Y-direction driver 2832 includes a piston 2846 that acts against the Y-direction bias element 2816. Piston 2846 actuated by the Y-direction driver 2832 is physically coupled to the Y-direction bias element 2816. Actuating the piston 2846 of the Y-direction driver 2832 flexes the Y-direction bias element 2816 of the flexure segment 2839 relative to the circumferential mount 2811 in the Y-direction 2806. Displacing the Y-direction bias element 2816 results in displacement of an object secured between the first mounting surface 2808 and the second mounting surface 2810 in the Y-direction shown by arrow 2806.

The X-Y stage 2802 is formed from a suitably resilient material to permit deformation under the effects of the X-direction driver 2830 and the Y-direction driver 2832. Flexible materials such as spring steel, metals such as titanium or tungsten, alloys of metals, or hard plastics may be used that demonstrate a suitable degree of flexibility to provide the desired relative displacement of a member mounted to the first mounting surface 2808 and the second mounting surface 2810. The flexible material is selected to withstand the physical conditions, pressures, temperatures, and chemicals that the X-Y stage 2802 will encounter within the cluster tool. The total deformation in the X-direction 2804 and the Y-direction 2806 of the X-Y stage depends on its intended function. In one particular embodiment associated with inserting 200 mm semiconductor substrates into substrate holder systems 14, the deformation of the X-Y stage equals or is less than about ¼ of an inch.

The embodiment of X-Y stage 2802 shown in FIG. 28 is particularly suited to be a compensating device. First, the X-Y stage provides a limited motion in both the X and the Y-directions 2804 and 2806. The motion in the Z-direction (into or out of the paper in FIG. 28) can be limited by making the dimension of the flexure segment 2839 greatest in the Z-direction. Additionally, the actuation of the X-direction driver 2830 displaces the flexure segment 2839, including the mounting surfaces 2808 and 2810, in the X-direction without displacing the first mounting surface 2808 relative to the second mounting surface 2810 in the Y-direction. Similarly, the actuation of the Y-direction driver 2832 displaces the flexure segment 2839, including the mounting surfaces 2818 and 2810, in the Y-direction without displacing the first mounting surface 2808 relative to the second mounting surface 2810 in the X-direction.

The X-Y stage provides for displacement of the object secured to the mounting surfaces 2808 and 2810 relative to the circumferential mount 2811 in both the X-direction indicated by arrow 2804 and the Y-direction as indicated by arrow 2806 in FIG. 28. The X-Y stage 2802 is secured to any location in order to allow compensation for the difference in spacing between a pair of cells relative to a spacing between the blades of a multiple blade robot. Examples of the elements secured by an X-Y stage include, but are not limited to:

1. one or more cells in a cell pair;
2. one or more substrate holder assemblies in a cell pair; or
3. one or more robot blades of a multiple bladed robot.

The X-Y stage 2802 may be positioned within the cluster tool 2700 in a variety of positions indicated in the embodiments shown in FIGS. 29, 30, and 31. The size of the X-Y stage 2802 may be altered in the different embodiments to match the size of the object to which the X-Y stage 2802 is attached. For example, in the embodiment shown in FIG. 29, the X-Y stage 2802 is secured to a cell. In the embodiment shown in FIG. 30, the X-Y stage 2802 is attached to a substrate holder assembly. In the embodiment shown in FIG. 31, the X-Y stage 2802 is attached to a robot blade. Since the physical size of a process chamber is larger than either a substrate holder system or a robot blade, the physical size of the X-Y stage 2802 in the embodiment shown of FIG. 29 likely has to be larger than in the embodiments shown in FIGS. 30 or 31.

FIG. 29 shows one embodiment of multiple-robot blade/cell unit 2900 in which a multiple blade robot interacts with a plurality of cell pair units. The multiple-robot blade/cell unit 2900 includes a first cell 2902, a second cell 2904, a first substrate holder assembly 2906, a second substrate holder assembly 2908, and the multiple blade robot 2702 shown in FIG. 27. The X-Y coordinate axis is shown as 2922. The first cell is 2902 is separated by the second cell 2904 by a cell spacing 2920. The X-Y stage 2802 is positioned underneath the second cell 2904. As such, the X-Y stage 2802 displaces the second cell 2904 within the X-Y coordinate axis 2922 relative to the first cell 2902. The displacement of the second cell 2904 by the X-Y stage can make the cell spacing 2920 equal to the robot spacing 2720. The first substrate holder assembly 2906 and the second substrate holder assembly 2908 are mounted on the first cell 2902 and the second cell 2904 respectively. Therefore, in one embodiment the X-Y stage provides for displacement of second cell 2904 relative to the first cell 2902. In the embodiment shown in FIG. 29 the substrate holder assemblies 2906, 2908 are mounted to their respective cells 2902, 2904 in a manner to provide the displacements of the substrate holder system 14 indicated relative to the embodiment shown in FIGS. 25 and 27. The distance between the first substrate holder assembly 2906 and the second substrate holder assembly 2908 can be modified by the displacement of the X-Y stage 2802 to correspond to the robot blade spacing 2720. The first cell 2902 is separated from the second cell 2964 by a cell spacing 2920. The cell spacing 3120 may include X-axis and Y-axis components as indicated by coordinate axis 2922.

To control the relative spacing between the first cell 2902 and the second cell 2904, the X-Y stage 2802 displaces the second cell 2904 including the second substrate holder assembly 2908 in either the X-direction or the Y-direction indicated by coordinate axis 2922. The first cell 2902 and the second cell 2904 are each assumed to be positioned so they can receive substrates from, or have substrates received by, robot blades 2710 and 2712 respectively. For example, the first substrate holder assembly 2906 can be displaced relative to the first cell 2902 and the second substrate holder assembly 2908 can be displaced relative to the second cell 2904. Both substrate holder assemblies 2908 and 2906 are positioned in the exchange position, the position where the robots can insert a substrate into the substrate holder assembly or remove a substrate from a substrate holder assembly in FIG. 29. The position of the robot blades 2711 and 2713 can be coarsely adjusted by extending both robot arms 2711 and 2713 relative to the X-Y coordinate axis 2922. However, in one embodiment, the only independent adjustment between the two robot arms 2711 and 2713 involves the independent extension of each robot arm. Since the extension of any robot arm provides adjustment in only one degree of freedom, it is likely that one robot blade, i.e. the first robot blade, but not all robot blades will be aligned with their respective cell 2902, 2904 following coarse alignment. Following the coarse alignment, the X-Y stage 2802 in the embodiment of FIG. 29 is finely adjusted to align the second cell 2904 including the second substrate holder assembly 2908 with the second robot blade 2912. To compensate for such a misalignment between the robot blade 2712 with the second substrate holder assembly 2908 following the course, adjustment, the X-Y stage 2802 displaces the second cell 2904 including the second substrate holder assembly 2908 as necessary either in the X or the Y-direction as indicated by the coordinate axis 2922.

Another embodiment of a multiple blade robot/cell 3000 is shown in FIG. 30. The multiple blade robot/cell 3000 comprises first cell 3002, second cell 3004, first assembly 3006, second substrate holder assembly 3008, and the multiple blade robot 2702. The first cell 3002 is fixably mounted relative to the second cell 3004. The second substrate holder assembly 3008 can be displaced relative to the first substrate holder assembly 3006 by displacement of the X-Y stage 2802 to provide for loading the substrates into, or unloading of the substrates from, relative to the respective first cell 3002 and the second cell 3004. A first substrate holder assembly 3006 is separated from the second substrate holder assembly 3008 by a cell spacing shown as 3020. An X-Y coordinate axis is shown as 3022. The second substrate holder assembly 3008 is mounted to the cell 3004 by the X-Y stage 2802. The first cell 3002 is also separate from the second cell 3004 by the cell spacing 3020. The cell spacing 3020 may include X-axis and Y-axis components as indicated by the coordinate axis 3122.

The first robot blade 2710 can be adjusted relative to the first substrate holder assembly 3006 to provide a course adjustment of a multiple blade robot 3011 with a pair of substrate holder assemblies 3006, 3008 in one embodiment. To provide such course adjustment, the robot hub 2707 adjusts the robot hub about the rotational direction indicated by arrow 3140 and in the Z-axis (in or out of the paper), and the first robot arm 2711 extends the robot blade 2710 as necessary to align the first robot blade 2710 with the first substrate holder assembly 3006. Following the alignment of the first robot blade 2710 with the first substrate holder assembly 3006, the second robot blade 2712, even if extended, will likely not be aligned with the second substrate holder assembly 3008 and will not be aligned with the second substrate holder assembly while the adjusted rotational position of the robot hub 2707 is maintained without use of the X-Y stage. Such mis-alignment between the second robot blade 2712 and the second substrate holder assembly 3008 can then be corrected by the adjustment of the X-Y stage 2802 positioned between the second substrate holder assembly 3008 and the second cell 3004. The adjustment may include displacement of the X-Y stage 2802 either the X or the Y-directions as indicated by X-Y coordinate axis 3022.

Though in this embodiment, only the second substrate holder assembly 3008 is shown connected to the second cell 3004 by the X-Y stage 2802, it is envisioned that any substrate holder system may be connected to any cell to provide such fine alignment in the X or Y-directions as shown by coordinate axis 3022. In multiple cell configurations, one fewer substrate holder system should be able to be simultaneously loaded/unloaded than the total number of robot arms within the multiple blade robot 2702. During operation, the robot arm that interacts with that substrate holder system not connected by an X-Y stage 2802 to its cell is adjusted. The fine alignment of the multiple blade robot/cell 3000 is then provided to adjust the remainder of the substrate holder assemblies 3006, those substrate holder assemblies that are attached to their cell by an X-Y stage, to the position of the respective robot blade by adjustment of each X-Y stage.

The embodiment shown in FIG. 30 adjusts the position of one or more of the substrate holder assemblies 3006, 3008 relative to their respective cells 3002, 3004. The adjustment of X-Y stage 2802 in this embodiment compensates for differences in cell spacing between cells 3002, 3004 and robot blade spacing between robot blades 2710, 2712 in both the X-direction and the Y-direction as indicated by the coordinate axis 3022. Enough lateral space is provided between each substrate holder assembly 3006, 3008 and their respective cell 3002, 3004 to allow for the substrate holder assemblies to fit into their respective cells through the entire range of motion of the X-Y stage 2802. During operation, the X-Y stage 2802 compensates to make the substrate holder spacing 2720 equal to the robot blade spacing. Once these spacings are equalized, the multiple blade robot 2702 is configured to insert both robot blades 2710, 2712 into, or retract both robot blades from, their respective substrate holder assemblies. Though the cell spacing between the first cell 3002 and the second cell 3004 is compensated by adjustment of one of the substrate holder assemblies 3006 or 3008 along the X-axis, one or both of the substrate holder assemblies can be adjusted in the direction indicated by either the X-axis or the Y axis.

FIG. 31 shows yet another embodiment of multiple-robot blade/cell 3100 including a first cell 3102, a first substrate holder assembly 3106, a multiple blade robot 2702, a second cell 3104, and a second substrate holder assembly 3108. In this embodiment the X-Y stage 2802 connects the second robot blade 2712 to the second robot arm 2713. The first substrate holder assembly 3106 is mounted to the first cell 3102. The second substrate holder assembly 3108 is mounted to the second cell 3104. The first cell 3102 is separated from the second cell 3104 by a cell spacing 3120. The cell spacing 3120 may include X-axis and Y axis components as indicated by the coordinate axis 3122.

This embodiment adjusts the robot blade spacing 2720 between the robot blades 2710, 2712 to equal the cell spacing 3120 between the cells 3102, 3104, or alternatively the substrate holder assemblies 3106, 3108. The robot blade spacing 2720 can be adjusted to equal the cell spacing in both the X-direction and the Y-direction as indicated by the coordinate axis 3122.

To operate the multiple-robot blade/cell platform 3100, the first and the second robot arms 2711, 2713 are actuated by the robot hub 2707 to insert a pair of substrates held by respective robot blades 2710 and 2712 into respective cells 3102 and 3104. Initially, the robot hub 2707 aligns both robot blades 2710 and 2712 with their respective cells 3102 and 3104 in both the Z-axis (in or out of the paper) and rotational axis indicated by arrow 3140. The first robot arm 2711 then extends the first robot blade 2710 into alignment with the first cell 3102. The second robot arm 2713 extends the second robot blade 2712 into coarse alignment with the second cell 3104. Since the first robot blade 2710 is finely aligned with the first cell 3102, the robot hub 2707 is likely in a position 2707 that is necessary to provide the fine alignment to the first robot blade 2710, and the second robot blade 2712 is likely not aligned with the second cell 3104. The X-Y stage 2802 is then adjusted to finely align the second robot blade 2712 relative to the second substrate holder assembly 3108 so the second robot blade 2712 can load, or unload, the substrate into the second substrate holder assembly 3108.

As indicated by the embodiments shown in FIGS. 29, 30, and 31, the X-Y stage 2802 can be mounted in a variety of locations to adjust for differences between the cell spacing and the robot blade spacing. Any location for the X-Y stage 2802 that compensates for differences between the cell spacing and the robot blade spacing is within the scope of the present invention. It is envisioned that the embodiments shown in FIGS. 29 to 31 can have any number of X-Y stages 2802 connected to any number of components. For example, it is possible to have a hybrid of the positioning of the X-Y stages shown in the embodiments in two of FIGS. 29 to 31.

The controller 222 shown in the embodiment of FIG. 27 controls electric voltage and/or current supplied to both the anode 1216 and the plating surface of the substrate/cathode 148. The controller 222 also controls the operation of the ECD system 1210 including the operation of the robots.

The controller 222, with its components shown in FIG. 3, comprises a central processing unit (CPU) 260, memory 262, circuit portion 265, input output interface (I/O) 264, and bus, not shown. The controller 222 may be a general-purpose computer, a microprocessor, a microcontroller, or any other known suitable type of computer or controller. The CPU 260 performs the processing and arithmetic operations for the controller 222.

The memory 262 includes random access memory (RAM) and read only memory (ROM) that together store the computer programs, operands, operators, dimensional values, system processing temperatures and configurations, and other parameters that control the electroplating operation. The bus, not shown, provides for digital information transmissions between CPU 260, circuit portion 265, memory 262, and I/O 264. The bus also connects I/O 264 to the portions of the ECD system 1210 that either receive digital information from, or transmit digital information to, controller 222.

I/O 264 provides an interface to control the transmissions of digital information between each of the components in controller 222. I/O 264 also provides an interface between the components of the controller 222 and different portions of the ECD system 1210. Circuit portion 265 comprises all of the other user interface devices such as display and keyboard, system devices, and other accessories associated with the controller 222. While one embodiment of digital controller 222 is described herein, other digital controllers as well as analog controllers could function well in this application.

Figure 32:
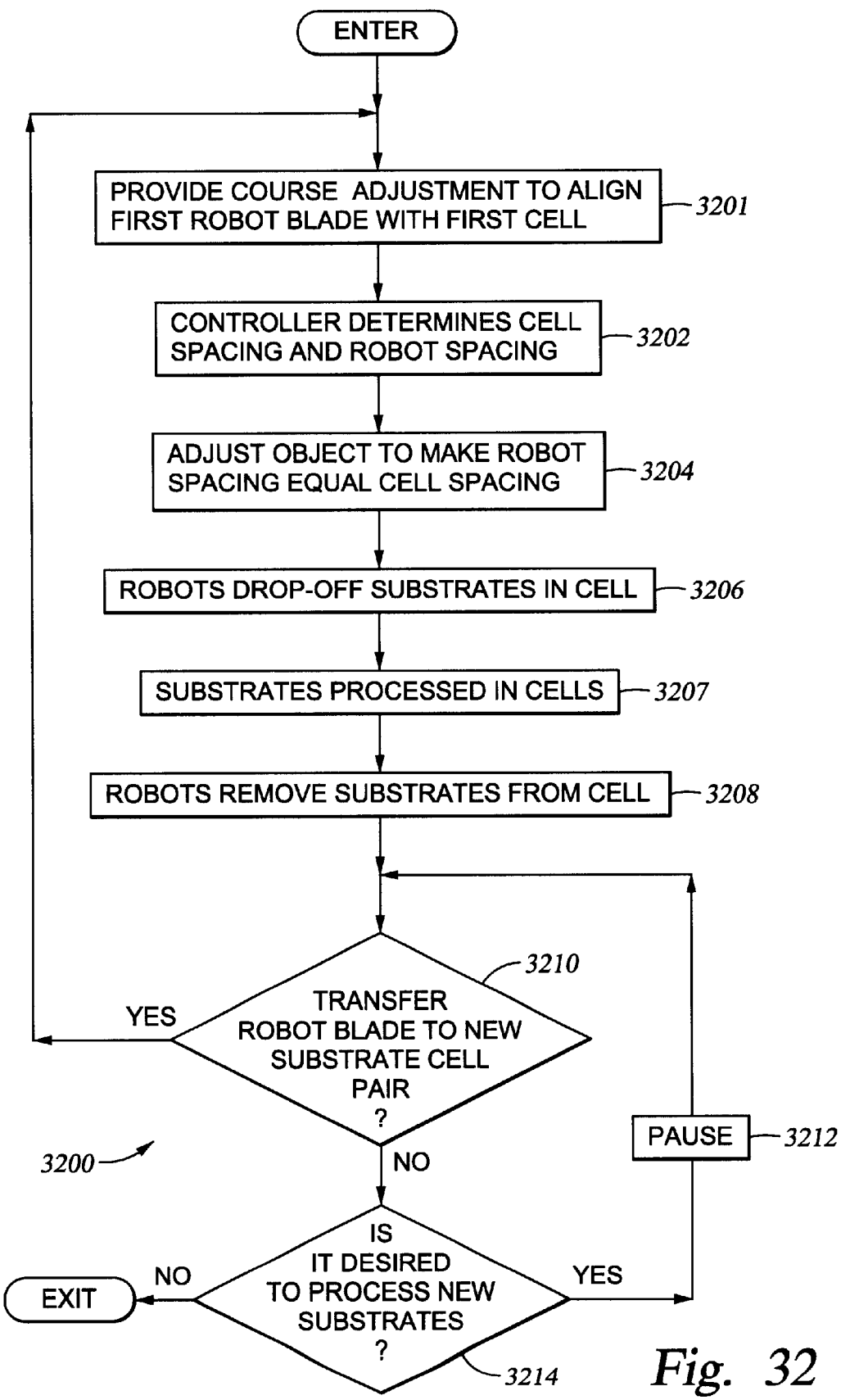
FIG. 32 is a flow chart of one embodiment of method performed by a controller that controls the operation of a multiple blade robot.

FIG. 32 shows a method 3200 performed by the controller 222 to control the robot spacing of a multiple blade robot, such as 2911, 3011, and 3111 in the embodiment shown in FIGS. 29, 30, and 31 respectively, relative to the cell spacing of a variety of multiple process cells. The method 3200 starts with block 3201 in which the first substrate holder assembly 2710 is aligned with the first cell, 2902, 3002, or 3102 in the embodiments of FIGS. 29, 30, or 31 respectively. This alignment of the first substrate holder assembly 2710 with the first cell is performed by adjustment of the vertical robot blade position as provided by Z-direction displacement of the robot hub 2700; by rotation of the robot hub 2707 about axis 3332 to provide the angular position of the first robot blade 2710; and/or by extension of the first robot arm 2711 to extend first robot blade 2710. The method 3200 continues with block 3202 in which the controller 222 determines the cell spacing between a pair of cells, i.e. process cells, transfer cells, etc. with which the multiple blade robot is to interact. The cell spacing between the each pair of cells within a cluster tool typically differ from each other and the individual cell spacing values can be measured, or calibrated, and input to the controller 222. Each cell spacing value between the cells in a cell pair, or spacing between more than two cells, is stored in memory. The cell spacing can be recalled for each particular cell pair with which the multiple blade robot is to interact.

The method 3200 continues to block 3204 in which the X-Y stage adjusts an object so the value of cell spacing determined in block 3202 equals the value of the robot spacing. The specific "object" that is adjusted is the object to which the X-Y stage is attached. In the FIG. 29 embodiment, the second cell 2904, including the substrate holder assembly 2908, is adjusted relative to the cluster tool. In the FIG. 30 embodiment, the second substrate holder assembly 2908 is adjusted relative to me second cell. In the FIG. 31 embodiment, the second robot blade 2712 is adjusted relative to the second robot arm 2713.

The method 3200 continues to block 3206 in which the pairs of substrates held by each pair of robot blades are inserted into the substrate holder assemblies, and the robot blades are retracted from their respective cell. The method 3200 continues to block 3207 in which each substrate held in each respective substrate holder is processed.

The method 3200 continues to block 3208 in which the pair of processed substrates held by the two robot blades of the multiple blade robot are removed from the respective substrate holder system of each cell in the cell pair. The robot blade spacing between the two blades of the multiple blade robot may be maintained as the robot blades are removed. The method 3200 continues to decision block 3210 in which the controller determines whether to transfer the robot to a new cell pair. Such a transfer would be required if the multiple blade robot is holding a pair of substrates that are to be transferred to another cell pair or, alternatively, if the multiple blade robot is empty and receives instruction from the controller 222 that another pair of substrates needs to be transferred from a cell pair. If the answer to decision block 3210 is yes, then method 3200 continues to block 3202 and the multiple blade robot transfers the multiple substrates to be processed to a new cell pair.

If the answer to decision block 3210 is no, then the controller 222 continues to block 3214 in which the controller determines whether it is desired to process a new substrate. If the answer to decision block 3214 is no, the controller 222 terminates method 3200. The method 3200 can be started again by a new pair of substrates being inserted in the cluster tool. If the answer to decision block 3214 is yes, the method 3200 continues to block 3212 in which the method waits for a prescribed duration within blocks 3210, 3214, and 3212.

Figure 35:
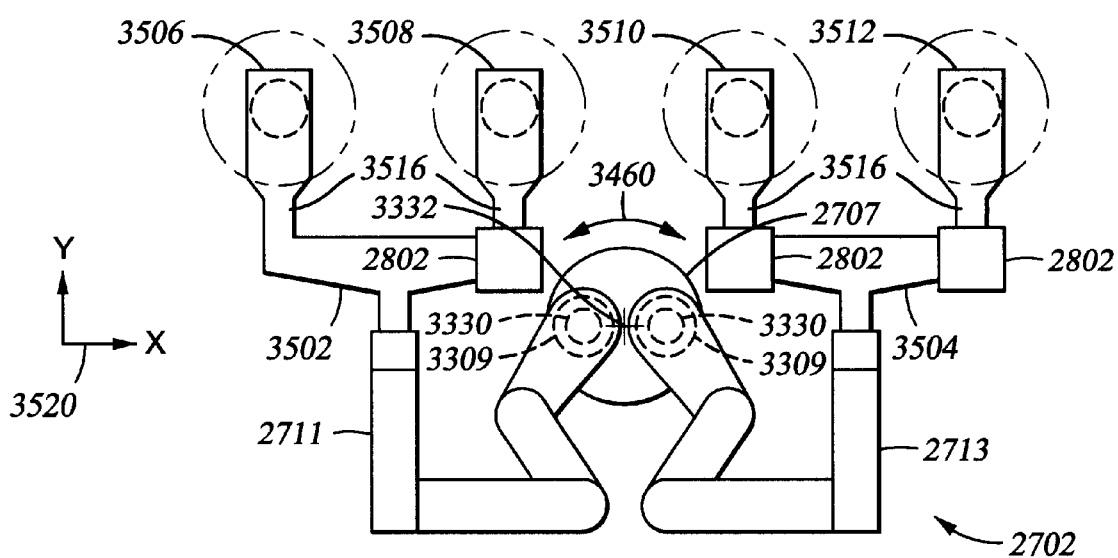
FIG. 35 is a top view of another embodiment of a multiple blade robot from that shown in FIG. 34.
Figure 36:
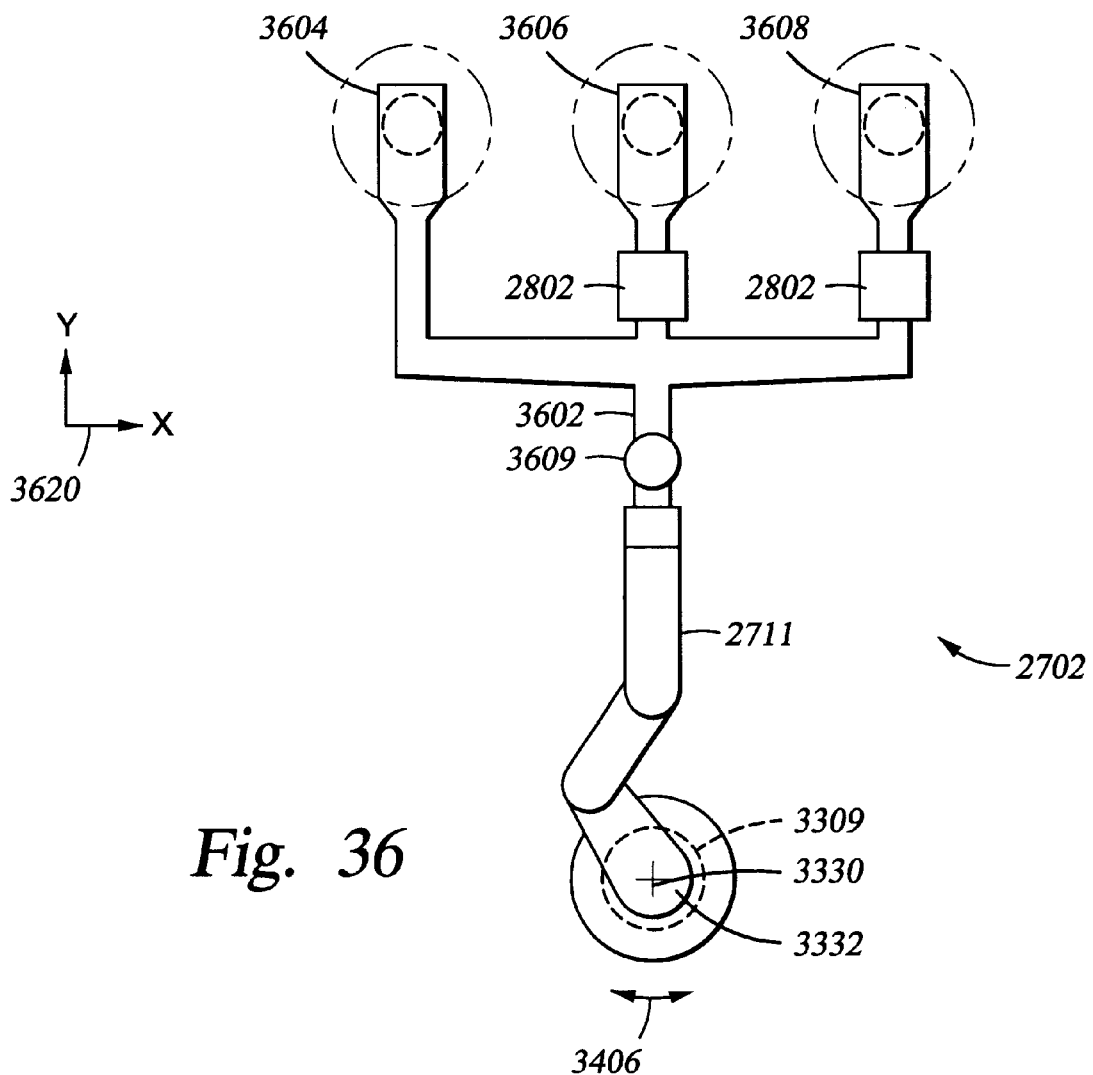
FIG. 36 is a top view of yet another embodiment of a multiple blade robot from that shown in FIG. 34.

FIGS. 35 and 36 show two alternate embodiments of multiple blade robots 2702 that are configured to carry substrates between cells within a cluster tool. The embodiment of multiple blade robot 2702 shown in FIG. 35 comprises a plurality of robot arms 2711 and 2713, a robot hub 2707, a plurality of bifurcated robot mounts 3502 and 3504, a plurality of X-Y stages 2802, and a plurality of robot blades 3506, 3508, 3510, and 3512. The robot blade 3506 is rigidly attached to bifurcated robot mount 3502. The robot blades 3508 is attached to the bifurcated robot mount 3502, and the robot blades 3510 and 3512 are attached to the bifurcated robot mount 3504, by an X-Y stage 2802 of the type shown in the embodiment of FIG. 28. The bifurcated robot mount 3502 is rotatably attached to the robot arm 2711. The bifurcated robot mount 3504 is rotatably attached to the robot arm 2713. The robot hub 2707 is similar to the embodiment shown in FIGS. 33 and 34.

The robot arms 2711, 2713 are each mounted to the robot hub 2707 so that constrained robot rotation can be provided to both the robot arms 2711 and 2713, and the attached robot blades 3506, 3508, 3510, and 3512 as indicated by arrow 3406, in a manner that each robot blade 3506, 3508, 3510, and 3512 is extended. Each robot blade 3505, 3508, 3510, and 3512 is configured to support a single substrate. Therefore, not considering the motion of the X-Y stages 2802 and the relative extension between robot arm 2711 and 2713, the robot blades 3506, 3508, 3510, and 3512 are constrained to move as a unit. The robot hub 2707 can also provide vertical motion in the Z-direction (in to or out of the paper in FIG. 35) to the robot arms. All of the robot blades are therefore constrained to travel in a plane defmed by the X-Y coordinate axis 3520 as modified by the vertical height of the robot hub 2707.

During operation, the multiple blade robot 2702 is actuated by three adjustments. These adjustments include rotating the robot hub 2707 as indicated by arrow 3460, raising the robot hub 2707 to the correct position in the Z-direction so the robot blades can be positioned in the cells, and extending robot arm 2711 until the robot blade 3506 is finely aligned with it appropriate process cell. Robot arm 2713 can also be extended a suitable distance to coarsely position the robot blades 3510 and 3512 in their respective cells. The robot blades 3508, 3510 and 3512 are likely not finely aligned with their respective cells because the robot hub 2707 is positioned to finely align robot blade 3506 in its cell. Following the fine alignment of the first robot arm to one of the first robot blades and the extension of the second robot arm, plus the other robot arms, to coarsely align the second robot blade, robot blades 3508, 3510, and 3512 are close enough to their desired positions so the respective X-Y stages 2802 can provide the fine alignment to the second (or third, fourth, etc.) robot arms.

Robot blades 3508, 3510, and 3512 are then adjusted by displacement of the appropriate X-Y stages 2802 in the X-direction or Y-direction indicated by coordinate axis 3520. This fine alignment of all of the robot blades 3508, 3510, and 3512 corresponds to the fine alignment in block 3205 of FIG. 32. The multiple blade robot 2702 is then configured to load substrates into, or unload substrates from, their respective cells. FIG. 35 indicates that a plurality of substrates can be suitably loaded into a plurality of cells by using robot blades 3508, 3510, and 3512 that are mounted to their respective robot arms by individual X-Y stages 2802.

Another embodiment is shown in FIG. 36 in which the multiple blade robot 2702 comprises a single robot arm 2711. The robot arm 2711 is similar to the robot arm shown in the embodiment in FIGS. 33 and 34. The multiple blade robot 2702 comprises a tri-furcated robot mount 3602, and a plurality of robot blades 3604, 3606, and 3608. The tri-furcated robot mount 3602 may be secured to the robot arm 2711 by adjusting pivot 3609. The adjusting pivot 3609 maintains general adjustment of the tri-furcated robot mount 3602 relative to the robot hub 2707. The robot blade 3604 is securely attached to the bifurcated robot mount 3602 in a manner that limits relative rotation between the two members. Each of the two robot blades 3606 and 3608 are secured to the tri-furcated robot mount by an X-Y stage 2802 that provides for fine alignment in the X and the Y-directions as indicated in the coordinate axis 3620. Each of the three robot blades 3604, 3606, and 3608 are configured to carry a single substrate.

During operation of the multiple blade robot 2702, the robot blade 3604 is inserted into its cell in a manner to provide fine alignment. The fine alignment of the robot blade 3604 is provided by rotation of the robot hub in the direction indicated by the arrow 3406, displacement of the robot hub in the Z-direction which is in or out of the paper as shown in FIG. 36, and the extension of the robot arm 2711. When the robot blade 3604 is finely aligned with its cell, then robot blades 3606 and 3608 may be misaligned with their cells. If so, robot blades 3606 and 3608 are then finely adjusted by modification of the appropriate X-Y stages 2808. Multiple blade robot 2702 is then configured to load substrates into, or unload substrates from, their respective process cells.

Though the multiple blade robot in this disclosure is described relative to an electroplating system platform, any system that includes multiple process cells may utilize the multiple blade robot system. More particularly, multiple cells that perform PVD, CVD, metrology, SRD, IBC, etc. functions may use the multiple blade robot system.

While the foregoing is directed to the preferred embodiment of the present invention, other and further embodiments of the invention may be devised without departing from the basic scope thereof.

What is claimed is:

1. A semiconductor processing apparatus that connects a first object to a second object, the apparatus comprising:
   a compensating device connecting the first object to the second object within a plane defined by a first direction and a second direction, the compensating device provides for displacement of the first object relative to the second object in the first direction and in the second direction wherein the second direction is substantially perpendicular to the first direction.

2. The apparatus of claim 1, wherein the compensating device comprises a circumferential mount attached to one of the first object or the second object.

3. The apparatus of claim 2, wherein the compensating device comprises a flexure segment attached to one of the first object or the second object that is not attached to the circumferential mount.

4. The apparatus of claim 3, wherein the flexure segment comprises a plurality of elongated flexure members.

5. The apparatus of claim 4, wherein each one of the plurality of flexure members are connected to other flexure members by flexure joints.

6. The apparatus of claim 3, wherein the flexure segment comprises a mounting surface and a first direction driver, the first direction driver provides displacement of the flexure segment relative to the circumferential mount in the first direction.

7. The apparatus of claim 6, wherein the flexure segment further comprises a first direction driver that provides displacement of the flexure segment relative to the circumferential mount in the second direction.

8. An apparatus that connects a cell to a cell mount, the apparatus comprising:
   a compensating device connecting the cell to the cell mount within a plane defined by a first direction and a second direction, the compensating device provides for displacement of the cell relative to the cell mount in the first direction and in the second direction wherein the second direction is substantially perpendicular to the first direction.

9. The apparatus of claim 8, wherein the compensating device comprises a circumferential mount attached to one of the cell or the cell mount.

10. The apparatus of claim 9, wherein the compensating device comprises a flexure segment attached to one of the cell or the cell mount that is not attached to the circumferential mount.

11. The apparatus of claim 10, wherein the flexure segment comprises a plurality of elongated flexure members.

12. The apparatus of claim 11, wherein each one of the plurality of flexure members are connected to other flexure members by flexure joints.

13. The apparatus of claim 10, wherein the flexure segment comprises a mounting surface and a first direction driver, the first direction driver provides displacement of the flexure segment relative to the circumferential mount in the first direction.

14. The apparatus of claim 13, wherein the flexure segment further comprises a first direction driver that provides displacement of the flexure segment relative to the circumferential mount in the second direction.

15. An apparatus that connects a substrate holder system to a cell, the apparatus comprising:

a compensating device connecting the substrate holder system to the cell within a plane defined by a first direction and a second direction, the compensating device provides for displacement of the substrate holder system relative to the cell in the first direction and in the second direction wherein the second direction is substantially perpendicular to the first direction.

16. The apparatus of claim 15, wherein the compensating device comprises a circumferential mount attached to one of the substrate holder system or the cell.

17. The apparatus of claim 16, wherein the compensating device comprises a flexure segment attached to one of the substrate holder system or the cell that is not attached to the circumferential mount.

18. The apparatus of claim 17, wherein the flexure segment comprises a plurality of elongated flexure members.

19. The apparatus of claim 18, wherein each one of the plurality of flexure members are connected to other flexure members by flexure joints.

20. The apparatus of claim 17, wherein the flexure segment comprises a mounting surface and a first direction driver, the first direction driver provides displacement of the flexure segment relative to the circumferential mount in the first direction.

21. The apparatus of claim 20, wherein the flexure segment further comprises a first direction driver that provides displacement of the flexure segment relative to the circumferential mount in the second direction.

22. An apparatus comprising:

a multiple blade robot including at least one set of robot blades; and a compensating device that adjusts for differences between a robot blade spacing provided between the set of robot blades and a cell spacing provided between a set of cells.

23. The apparatus of claim 22, wherein the multiple blade robot services multiple sets of cells, and the cell spacing between different sets of cells differ.

24. The apparatus of claim 22, wherein the multiple blade robot comprises two or more sets of robot blades.

25. The apparatus of claim 22, wherein the compensating device adjusts the cell spacing.

26. The apparatus of claim 25, each cell further comprises a substrate holder system, wherein the cell spacing is adjusted by repositioning at least one of substrate holder system.

27. The apparatus of claim 25, wherein the cell spacing is adjusted by repositioning at least one of the cells.

28. The apparatus of claim 22, wherein the compensating device comprises:

a circumferential mount; and a flexure segment connected to the circumferential mount.

29. The apparatus of claim 28, further comprising an X-direction driver connected between the flexure segment and the circumferential mount that can displace the flexure segment relative to the circumferential mount in the X-direction.

30. The apparatus of claim 29, further comprising a Y-direction driver connected between the flexure segment and the circumferential mount that can displace the flexure segment relative to the circumferential mount in the Y-direction.

31. The apparatus of claim 29, wherein the flexure segment comprises a framework formed from plurality of flexure members and related flexure joints.

32. A method that adjusts a robot blade spacing provided between a first robot blade and a second robot blade to a cell spacing provided between a first cell and a second cell, the method comprises:

determining the cell spacing;

compensating for differences between the robot blade spacing and the cell spacing; and aligning the first robot blade with the first cell.

33. The method of claim 32, wherein the compensating comprises adjusting the cell spacing.

34. The method of claim 33, wherein the compensating comprises repositioning either the first cell or the second cell.

35. The method of claim 33, wherein each cell further comprises a substrate holder systems, and wherein the compensating comprises repositioning at least one of substrate holders systems.

36. A semiconductor processing apparatus that connects a first object to a second object, the apparatus comprising:

a compensating device connecting the first object to the second object within a plane defined by a first direction and a second direction, the compensating device comprising a circumferential mount attached to one of the first object or the second object, a flexure segment attached to one of the first object or the second object that is not attached to the circumferential mount and providing for displacement of the first object relative to the second object in the first direction and in the second direction wherein the second direction is substantially perpendicular to the first direction.

37. An apparatus connecting a cell to a cell mount, the apparatus comprising:

a compensating device connecting the cell to the cell mount within a plane defined by a first direction and a second direction, the compensating device comprising a circumferential mount attached to one of the cell or the cell mount, a flexure segment attached to one of the cell or the cell mount that is not attached to the circumferential mount and providing for displacement of the cell relative to the cell mount in the first direction and in the second direction wherein the second direction is substantially perpendicular to the first direction.

38. An apparatus that connects a substrate holder system to a cell, the apparatus comprising:

a compensating device connecting the substrate holder system to the cell within a plane defined by a first direction and a second direction, the compensating device comprising a circumferential mount attached to one of the substrate holder system of the cell, a flexure segment attached to one of the substrate holder system of the cell that is not attached to the circumferential mount and providing for displacement of the substrate holder system relative to the cell in the first direction and in the second direction wherein the second direction is substantially perpendicular to the first direction.

* * * * *

UNITED STATES PATENT AND TRADEMARK OFFICE
CERTIFICATE OF CORRECTION

PATENT NO. : 6,571,657 B1  Page 1 of 1
DATED : June 3, 2003
INVENTOR(S) : Olgado et al.

It is certified that error appears in the above-identified patent and that said Letters Patent is hereby corrected as shown below:

Column 2,
Line 65, please begin a new paragraph with -- FIG. 13 --

Column 10,
Lines 15-16, please change "polyvi-nylid enefluoride" to -- polyvi-nylidenefluoride --.

Column 30,
Line 33, please change ""IN"station" to -- "IN" station --.

Signed and Sealed this

Twentieth Day of July, 2004

JON W. DUDAS
*Acting Director of the United States Patent and Trademark Office*

UNITED STATES PATENT AND TRADEMARK OFFICE
CERTIFICATE OF CORRECTION

PATENT NO. : 6,571,657 B1
DATED : June 3, 2003
INVENTOR(S) : Olgado et al.

It is certified that error appears in the above-identified patent and that said Letters Patent is hereby corrected as shown below:

Column 2,
Line 65, please begin a new paragraph with -- FIG. 13 --

Column 30,
Line 33, please change ""IN"station" to -- "IN" station --.

Signed and Sealed this

Sixteenth Day of November, 2004

JON W. DUDAS
*Director of the United States Patent and Trademark Office*